(12) United States Patent
Ajiki et al.

(10) Patent No.: US 10,468,623 B2
(45) Date of Patent: Nov. 5, 2019

(54) ORGANIC EL DISPLAY PANEL AND METHOD OF MANUFACTURING ORGANIC EL DISPLAY PANEL

(71) Applicant: JOLED INC., Tokyo (JP)

(72) Inventors: Hiroyuki Ajiki, Tokyo (JP); Masaki Nishimura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/898,311

(22) Filed: Feb. 16, 2018

(65) Prior Publication Data

US 2018/0233694 A1 Aug. 16, 2018

(51) Int. Cl.
*H01L 51/52* (2006.01)
*H01L 27/32* (2006.01)
*H01L 51/56* (2006.01)

(52) U.S. Cl.
CPC ...... *H01L 51/5228* (2013.01); *H01L 27/3246* (2013.01); *H01L 27/3279* (2013.01); *H01L 51/56* (2013.01); *H01L 27/3211* (2013.01); *H01L 27/3258* (2013.01); *H01L 27/3276* (2013.01); *H01L 51/5284* (2013.01)

(58) Field of Classification Search
None
See application file for complete search history.

(56) References Cited

U.S. PATENT DOCUMENTS

| 5,443,922 | A | 8/1995 | Nishizaki et al. |
| 2002/0158835 | A1 | 10/2002 | Kobayashi et al. |
| 2011/0121346 | A1 | 5/2011 | Yamada et al. |
| 2014/0151672 | A1 | 6/2014 | Yamada et al. |
| 2016/0211488 | A1* | 7/2016 | Nirengi ............... H01L 27/3248 |
| 2017/0033166 | A1* | 2/2017 | Shim ................... H01L 51/5228 |

(Continued)

FOREIGN PATENT DOCUMENTS

| JP | 05-163488 A | 6/1993 |
| JP | 2002-318556 A | 10/2002 |
| JP | 2008-135325 A | 6/2008 |

(Continued)

OTHER PUBLICATIONS

Non-Final Office Action for U.S. Appl. No. 15/892,537, dated Jan. 11, 2019, 22 pages.

*Primary Examiner* — Walter H Swanson
*Assistant Examiner* — Kien C Ly
(74) *Attorney, Agent, or Firm* — Chip Law Group

(57) ABSTRACT

An organic EL display panel includes a substrate, pixel electrodes, a current feeding auxiliary electrode layer provided to extend in a column direction over gaps between the pixel electrodes adjacent in a row direction, light emitting layers that each contain an organic light emitting material and are disposed over the pixel electrodes, a functional layer provided ranging over the light emitting layers and over the current feeding auxiliary electrode layer, and a common electrode layer provided continuously over the functional layer. A part of the functional layer is lacking or thinned. The common electrode layer is in direct contact with the current feeding auxiliary electrode layer exposed due to the lacking of the functional layer, or is electrically connected to the current feeding auxiliary electrode layer at a lower resistance at the thinned part of the functional layer than at other parts of the functional layer.

10 Claims, 26 Drawing Sheets

(56) References Cited

U.S. PATENT DOCUMENTS

2018/0190934 A1* 7/2018 Choi .................. H01L 51/5228
2018/0358573 A1   12/2018 Maeda et al.

FOREIGN PATENT DOCUMENTS

| JP | 2010-056075 A | 3/2010 |
| JP | 2010-272353 A | 12/2010 |
| JP | 2013-054979 A | 3/2013 |
| JP | 2016-072118 A | 5/2016 |

* cited by examiner

F I G . 2
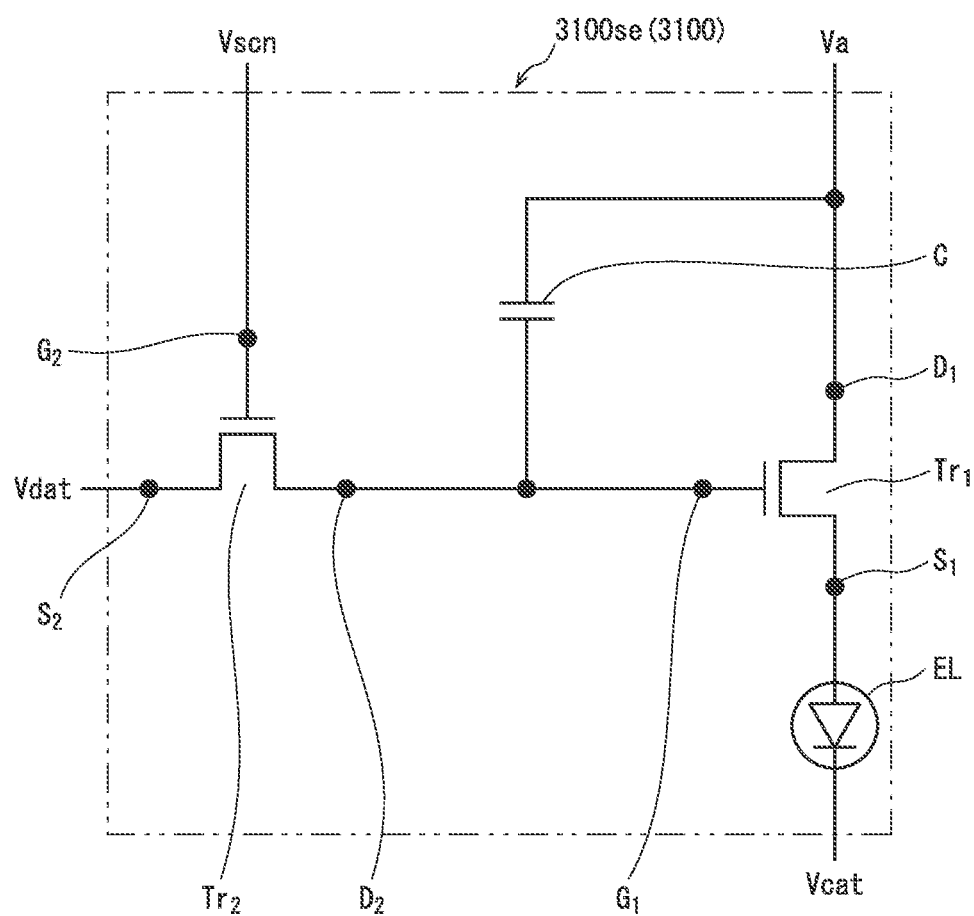

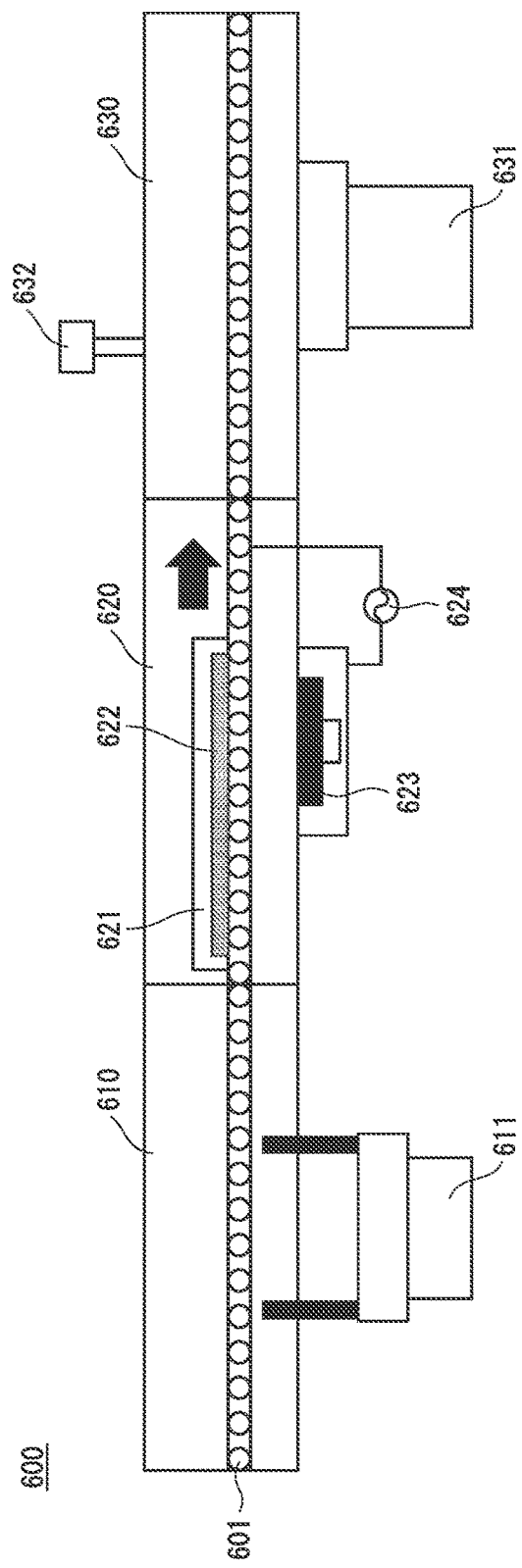

3122Y
3122Ya 3122Ya 3122Y
3122Ya 3122Y
3122Ya 3122Y
3122Ya 3122Ya

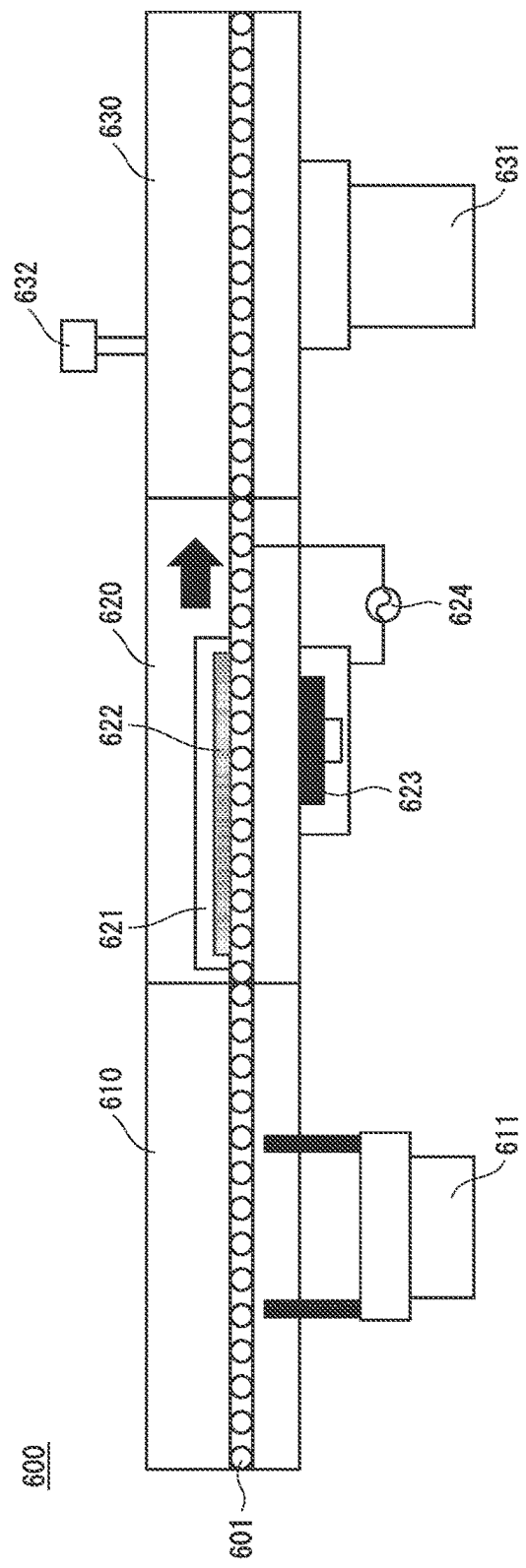

US 10,468,623 B2

ORGANIC EL DISPLAY PANEL AND METHOD OF MANUFACTURING ORGANIC EL DISPLAY PANEL

CROSS-REFERENCE TO RELATED APPLICATION

This application is based on JP Application No. 2017-026911 filed in Japan on Feb. 16, 2017, and JP Application No. 2017-054063 filed in Japan on Mar. 21, 2017. Each of the above-referenced applications is hereby incorporated herein by reference in its entirety.

BACKGROUND

The present disclosure relates to an organic electro luminescence (EL) display panel using organic EL elements utilizing electroluminescence of organic materials and a method of manufacturing an EL display panel using the same.

In recent years, as a display panel for use in a display apparatus such as a digital television set, an organic EL display panel in which a plurality of organic EL elements are arranged in a matrix pattern on a substrate has been put to practical use.

In an organic EL display panel, in general, a light emitting layer of each organic EL element and the adjacent organic EL element are partitioned from each other by an insulating layer formed from an insulating material. In an organic EL display panel for color display, organic EL elements form sub-pixels that emit light in RGB colors individually, and the RGB sub-pixels adjacent to one another are combined to form a unit pixel in color display.

The organic EL element has a basic structure in which a light emitting layer containing an organic light emitting material is disposed between a pair of electrodes. At the time of driving, a voltage is impressed between the pair of electrodes, and light is emitted attendant on recombination of holes and electrons injected into the light emitting layer.

An organic EL element of the top emission type has an element structure in which a pixel electrode, organic layers (inclusive of a light emitting layer), and a common electrode are sequentially provided over a substrate. Light from the light emitting layer is reflected by the pixel electrode formed from a light reflecting material, and is emitted upward from the common electrode formed from a light transmitting material.

The common electrode is often formed over the whole surface of the substrate. When the electric resistance of the common electrode is high, sufficient current supply is not attained, due to a voltage drop, and light emission efficiency is thereby lowered, at parts far from a current feeding part. This may lead to generation of variability in luminance.

In view of this problem, Japanese Patent Laid-open No. 2002-318556 proposes a technique of providing an auxiliary electrode for lowering the resistance of the common electrode. Specifically, Japanese Patent Laid-open No. 2002-318556 discloses a configuration in which an auxiliary electrode is formed in the same layer as a pixel electrode, and is electrically connected to the common electrode while being electrically insulated from the pixel electrode.

SUMMARY

In an aspect of the present disclosure, there is provided an organic EL display panel having a plurality of pixel electrodes arranged in a matrix pattern over a substrate and having a light emitting layer over each of the pixel electrodes. The organic EL display panel includes the substrate, the plurality of pixel electrodes arranged in a matrix pattern with gaps therebetween over the substrate, a current feeding auxiliary electrode layer provided in the state of being not in contact with the pixel electrodes adjacent to an electrode forming region that is secured to extend in a column direction over at least one of the gaps between the pixel electrodes adjacent in a row direction over the substrate, a plurality of the light emitting layers that each contain an organic light emitting material and are disposed over the plurality of pixel electrodes, a functional layer provided ranging over the plurality of light emitting layers and over the current feeding auxiliary electrode layer, and a common electrode layer provided in the state of extending continuously over the functional layer. A part of the functional layer is lacking or thinned, and the common electrode layer is in direct contact with the current feeding auxiliary electrode layer exposed due to the lacking of the functional layer, or is electrically connected to the current feeding auxiliary electrode layer at a lower resistance at the thinned part of the functional layer than at other parts of the functional layer.

BRIEF DESCRIPTION OF THE DRAWINGS

These and the other objects, advantages and features of the invention will become apparent from the following description thereof taken in conjunction with the accompanying drawings which illustrate a specific embodiment of the invention. In the drawings:

FIG. 2 is a schematic circuit diagram depicting circuit configuration in each sub-pixel 3100se of an organic EL display panel 10 used in the organic EL display apparatus 1;

FIG. 11 is a schematic drawing depicting a sputtering system 600 used for forming a common electrode layer 3125;

FIG. 26 is a schematic drawing depicting a sputtering system 600 used for producing the common electrode layer 2125.

DETAILED DESCRIPTION OF THE PREFERRED EMBODIMENTS

Figure 1:
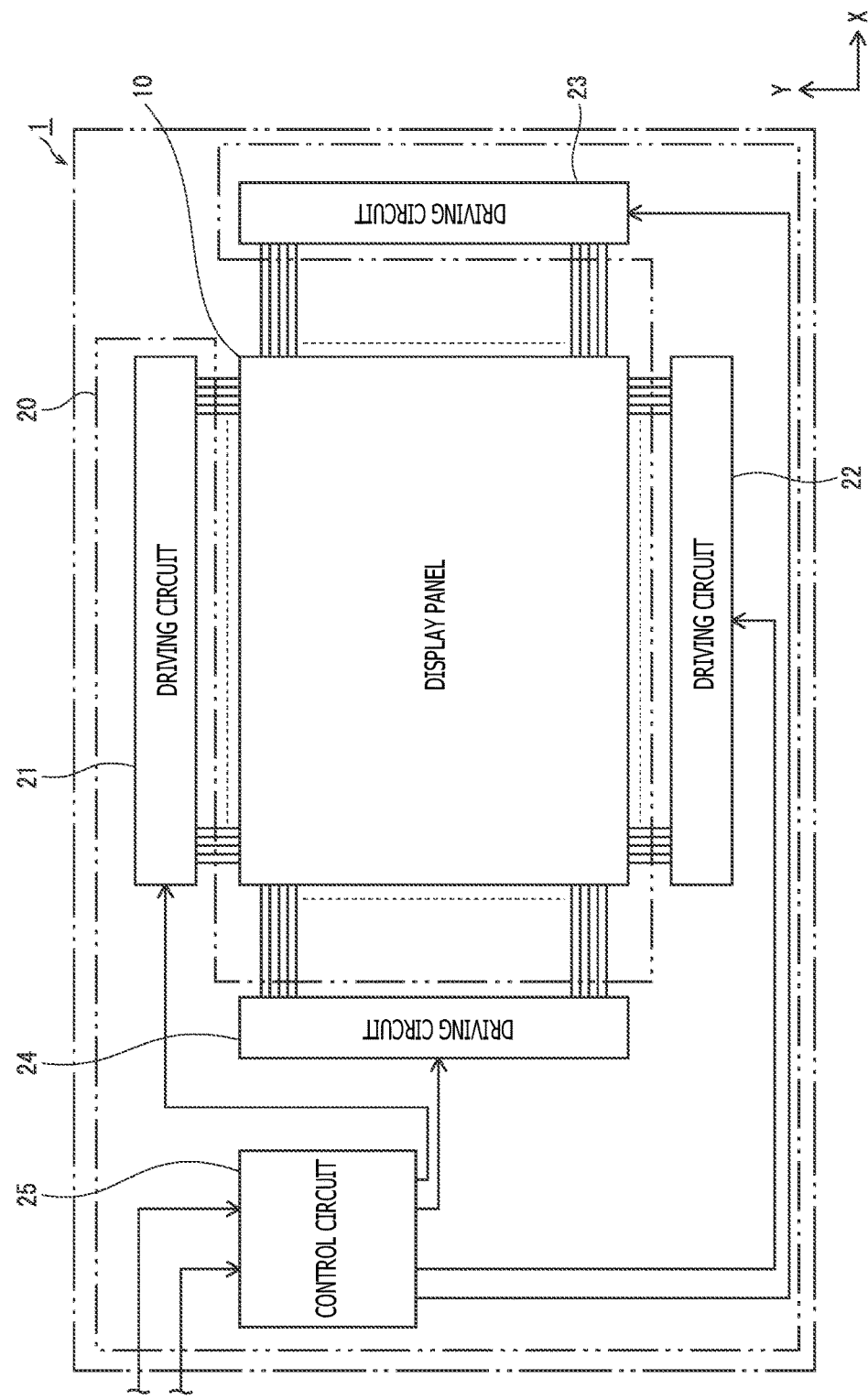
FIG. 1 is a schematic block diagram depicting circuit configuration of an organic EL display apparatus 1 according to an embodiment.

Embodiment 1 of the present disclosure has been made in consideration of a problem in the related art that in forming, particularly, an electron transport layer located on an upper side of a light emitting layer, among a plurality of organic layers, masked vapor deposition should be carried out for forming the electron transport layer while avoiding auxiliary electrodes, with the result of an increase in manufacturing cost. It is desirable to manufacture an organic EL display panel by a simple manufacturing process, to reduce electric resistance in electrical connection between a common electrode layer and a current feeding auxiliary electrode layer, to enhance light emission efficiency and to restrain variability in luminance.

An organic EL display panel according to Embodiment 1 of the present disclosure is an organic EL display panel having a plurality of pixel electrodes arranged in a matrix pattern over a substrate and having a light emitting layer containing an organic light emitting material over each of the pixel electrodes. The organic EL display panel includes a current feeding auxiliary electrode layer provided in the state of being not in contact with the pixel electrodes adjacent to an electrode forming region that is secured to extend in a column direction over at least one of gaps between the pixel electrodes adjacent in a row direction over the substrate, an insulating layer that is provided at least over the current feeding auxiliary electrode layer and that extends in the column direction, a functional layer provided ranging over the light emitting layers and over the insulating layer, and a common electrode layer provided in the state of extending continuously over the functional layer. The insulating layer has a plurality of through-holes opened therein, a part of the functional layer is lacking or thinned, the part being inside the through-hole and located in the vicinity of the through-hole over the current feeding auxiliary electrode layer, the common electrode layer is in direct contact with the current feeding auxiliary electrode layer exposed due to the lacking of the functional layer, or the common electrode layer is electrically connected to the current feeding auxiliary electrode layer at a lower resistance at the thinned part of the functional layer than at other parts of the functional layer.

According to such a configuration, it is possible to provide an organic EL display panel which can be manufactured by a simple manufacturing process, and in which electric resistance in electrical contact between a common electrode layer and a current feeding auxiliary electrode layer is reduced, light emission efficiency is enhanced, and variability in luminance is restrained.

In addition, in another mode, in any of the above configurations, a ratio of a thickness of the insulating layer to an opening width of the through-hole may be from 0.1 to 0.8.

According to such a configuration, the functional layer is made to undergo stepping inside a hole bottom portion over the current feeding auxiliary electrode layer located at a bottom surface of the through-hole in a column insulating layer to form a lacking part, whereby it is possible to realize a structure in which the contact surface of the current feeding auxiliary electrode layer is exposed through the lacking part. Alternatively, a part of the functional layer is thinned although the part is not lacking, whereby it is possible to realize a structure in which the common electrode layer is electrically connected to the current feeding auxiliary electrode layer at a lower resistance at the thinned part of the functional layer than at other parts of the functional layer.

Besides, in another mode, in any of the above configurations, the functional layer may be present in other parts than the part inside the through-hole, on an upper surface of the insulating layer and over the current feeding auxiliary electrode layer, and may be lacking or thinned at the part located on the inner wall of the through-hole.

In addition, a method of manufacturing an organic EL display panel according to a mode of the present disclosure is a method of manufacturing an organic EL display panel. The method includes preparing a substrate, arranging a plurality of pixel electrodes in a matrix pattern over the substrate, securing an electrode forming region that extends in a column direction over at least one of gaps between the pixel electrodes adjacent in a row direction over the substrate, and forming by a vapor deposition process a current feeding auxiliary electrode layer in the state of being not in contact with the pixel electrodes adjacent to the electrode forming region, forming an insulating layer at least over the current feeding auxiliary electrode layer to extend in the column direction, forming a light emitting layer containing an organic light emitting material over each of the pixel electrodes, opening a plurality of through-holes in the insulating layer, forming by a vacuum deposition process a functional layer ranging over the light emitting layer and the insulating layer, and forming by a sputtering process or a chemical vapor deposition process a common electrode layer extending continuously over the functional layer.

According to such a configuration, it is possible to manufacture an organic EL display panel in which electric resistance in electrical connection between a common electrode layer and a current feeding auxiliary electrode layer is reduced, light emitting efficiency is enhanced, and variability in luminance is restrained, by use of a simple manufacturing process.

Besides, in another mode, in any of the above configurations, in the forming the functional layer, the functional layer may be formed in such a manner that its part being inside the through-hole and located in the vicinity of an inner wall of the through-hole over the current feeding auxiliary electrode layer is lacking or thinned. In addition, in the forming the common electrode layer, the common electrode layer may be formed in such a manner that the common electrode layer makes direct contact with the current feeding auxiliary electrode layer exposed due to the lacking of the functional layer, or that the common electrode layer is electrically connected to the current feeding auxiliary electrode layer at a lower resistance at the thinned part of the functional layer than at other parts of the functional layer.

According to such a configuration, the functional layer formed over the auxiliary electrode layer breaks of (undergoes cutting) at a part of a hole bottom portion inside the through-hole to form a lacking part, and the common electrode layer is formed in contact with a contact surface of the auxiliary electrode layer in the manner of coming around into the lacking part. Therefore, the auxiliary electrode layer makes direct contact with the common electrode layer at the contact surface, so that the electric resistance in connection between the auxiliary electrode layer and the common electrode layer can be reduced. Alternatively, a part of the functional layer may be thinned although the part is not lacking, whereby it is possible to realize a structure in which the common electrode layer is electrically connected to the current feeding auxiliary electrode layer at a lower resistance at the thinned part of the functional layer than at other parts of the functional layer.

In addition, in another mode, in any of the above configurations, a ratio of a thickness of the insulating layer to an opening width of the through-hole may be from 0.1 to 0.8.

According to such a configuration, the functional layer can be made to undergo stepping inside a hole bottom portion over the current feeding auxiliary electrode layer located at a bottom surface of the through-hole in a column insulating layer to form a lacking part, whereby it is possible to realize a structure in which the contact surface is exposed through the lacking part. Alternatively, a part of the functional layer may be thinned, whereby it is possible to realize a structure in which the common electrode layer is electrically connected to the current feeding auxiliary electrode layer at a lower resistance at the thinned part of the functional layer than at other parts of the functional layer.

Besides, in another mode, in any of the above configurations, let a thickness of the insulating layer be h, let a resistivity of the functional layer be $R_1$, let a resistivity of the common electrode layer be $R_0$, and let an average incidence angle on the substrate from a vapor source used in the forming the functional layer be $\theta$, then an opening width $w$ of the through-hole may be defined by the following expression.

$$W_0 < R_0/R_1 h \cdot \tan \theta$$

According to such a configuration, the functional layer formed over the auxiliary electrode layer breaks off (undergoes cutting) at a part of a hole bottom portion inside the through-hole to form a lacking part, and the common electrode layer is formed in contact with the contact surface of the auxiliary electrode layer in the manner of coming around into the lacking part of the functional layer.

Embodiment 2 of the present disclosure has been made in consideration of a problem in the related art that a common electrode is often formed over the whole surface of a substrate, and in the case where the electric resistance of the common electrode is high, sufficient current supply is not attained and, hence, light emission efficiency is lowered, at parts far from a current feeding part, which causes generation of variability in luminance. It is desirable to reduce the electric resistance of the common electrode, to enhance light emission efficiency and to restrain variability in luminance.

An organic EL display panel according to Embodiment 2 of the present disclosure is an organic EL display panel having a plurality of pixel electrodes arranged in a matrix pattern over a substrate and having a light emitting layer containing an organic light emitting material over each of the pixel electrode. The organic EL display panel includes a current feeding auxiliary electrode layer provided in the state of being not in contact with the pixel electrodes adjacent to an electrode forming region that is secured to extend in a column or row direction over at least one of gaps between the pixel electrodes adjacent in the row or column direction over the substrate, a plurality of column banks that are provided over gaps each located between the pixel electrodes adjacent in the row direction and over gaps each located between the pixel electrode and the current feeding auxiliary electrode layer adjacent in the row direction and that extend in the column direction, a functional layer provided ranging over the light emitting layer and over the current feeding auxiliary electrode layer, and a common electrode layer provided in the state of extending continuously over the functional layer. The column banks provided over the gaps each located between the pixel electrode and the current feeding auxiliary electrode layer adjacent in the row direction have a side wall inclined toward the current feeding auxiliary electrode layer side at an acute angle against a surface of the substrate, the functional layer has a part, which is located at a base portion of the side wall, lacking or thinned, and the common electrode layer is in direct contact with the current feeding auxiliary electrode layer exposed due to the lacking of the functional layer, or is electrically connected to the current feeding auxiliary electrode layer at a lower resistance at the thinned part of the functional layer than at other parts of the functional layer.

According to such a configuration, it is possible to reduce the electric resistance in electrical connection between the common electrode and the auxiliary electrode, to enhance light emission efficiency and to restrain variability in luminance.

In addition, the column banks provided over the gaps each located between the pixel electrode and the current feeding auxiliary electrode layer adjacent in the row direction may be formed from a negative type photosensitive material.

Besides, an inclination angle of the side wall against the substrate surface may be 45 to 80 degrees.

In addition, a method of manufacturing an organic EL display panel according to a mode of the present disclosure is a method of manufacturing an organic EL display panel that has a plurality of pixel electrodes arranged in a matrix pattern over a substrate and has a light emitting layer containing an organic light emitting material over each of the pixel electrodes. The method includes securing an electrode forming region that extends in a column or row direction over at least one of gaps between the pixel electrodes adjacent in the row or column direction over the substrate, and forming by a vapor deposition process a current feeding auxiliary electrode layer in the state of being not in contact with the pixel electrodes adjacent to the electrode forming region, forming a plurality of column banks extending in the column direction over gaps between the pixel electrodes adjacent in the row direction and over gaps each located between the pixel electrode and the current feeding auxiliary electrode layer adjacent in the row direction, and, for the column banks provided over the gaps each located between the pixel electrode and the current feeding auxiliary electrode layer adjacent in the row direction, forming a side wall inclined toward the current feeding auxiliary electrode layer side at an acute angle against the substrate surface, forming by a vacuum deposition process a functional layer ranging over the light emitting layers and over the current feeding auxiliary electrode layer in such a manner that a part of the functional layer is lacking or thinned, the part being located at a base portion of the side wall, and forming by a sputtering process or a CVD process a common electrode layer in such a manner as to extend continuously over the functional layer and in such a manner that the common electrode layer makes direct contact with the current feeding auxiliary electrode layer exposed due to the lacking of the functional layer or that the common electrode layer is electrically connected to the current feeding auxiliary electrode layer at a lower resistance at the thinned part of the functional layer than at other parts of the functional layer.

According to such a configuration, it is possible to reduce the electric resistance in electrical connection between the common electrode and the auxiliary electrode, to enhance light emission efficiency and to restrain variability in luminance.

Besides, in the forming the column banks, a side wall having an angle against the substrate surface of 45 to 80 degrees may be formed.

Embodiment 1 (No. 2017-026911)

1.1 Circuit Configuration of Display Apparatus 1

Hereinafter, the circuit configuration of an organic EL display apparatus 1 according to Embodiment 1 (hereafter referred to as "the display apparatus 1") will be described referring to FIG. 1.

As illustrated in FIG. 1, the display apparatus 1 includes an organic EL display panel 10 (hereafter referred to as "the display panel 10") and a driving control circuit section 20 connected thereto.

The display panel 10 is an organic EL panel utilizing an electroluminescence phenomenon of organic materials, and includes a plurality of organic EL elements arranged, for example, in a matrix pattern. The driving control circuit section 20 includes four driving circuits 21 to 24 and a control circuit 25.

Note that in the display apparatus 1, the layout of each circuit of the driving control circuit section 20 relative to the display panel 10 is not restricted to the one illustrated in FIG. 1.

1.2 Circuit Configuration of Display Panel 10

The plurality of organic EL elements in the display panel 10 include unit pixels 3100$e$ composed of three color sub-pixels (not depicted) 3100$se$ that emit R (red), G (green), and B (blue) lights. The circuit configuration of each sub-pixel 3100$se$ will be described referring to FIG. 2.

FIG. 2 is a schematic circuit diagram depicting the circuit configuration of an organic EL element 3100 corresponding to each sub-pixel 3100$se$ of the display panel 10 used in the display apparatus 1. In the display panel 10, the organic EL elements 3100 constituting the unit pixels 3100$e$ are arranged in a matrix pattern to form a display region.

As depicted in FIG. 2, in the display panel 10 according to the present embodiment, each sub-pixel 3100$se$ includes two transistors Tr1 and Tr2, one capacitor C, and an organic EL element section EL as a light emitting section. The transistor Tr1 is a driving transistor, and the transistor Tr2 is a switching transistor.

A gate G2 of the switching transistor Tr2 is connected to a scanning line Vscn, and its source S2 is connected to a data line Vdat. A drain D2 of the switching transistor Tr2 is connected to a gate G1 of the driving transistor Tr1.

A drain D1 of the driving transistor Tr1 is connected to a power supply line Va, and its source S1 is connected to a pixel electrode (anode) of the organic EL element section EL. A common electrode layer (cathode) of the organic EL element section EL is connected to a ground line Vcat.

Note that the capacitor C is provided in such a manner as to connect the drain D2 of the switching transistor Tr2 and the gate G1 of the driving transistor Tr1 to the power supply line Va.

In the display panel 10, a plurality of adjacent sub-pixels 3100$se$ (for example, three sub-pixels 3100$se$ of red (R), green (G), and blue (B) emission colors) are combined together to constitute one unit pixel 3100$e$, and the unit pixels 3100$e$ are distributedly arranged to form a pixel region. A gate line is individually led out from the gate G2 of each sub-pixel 3100$se$, and is connected to the scanning line Vscn connected from the outside of the display panel 10. Similarly, a source line is individually led out from the source S2 of each sub-pixel 3100$se$, and is connected to the data line Vdat connected from the outside of the display panel 10.

In addition, the power supply line Va of each sub-pixel 3100$se$ and the ground line Vcat of each sub-pixel 3100$se$ are collectively connected to a common power supply line and a common ground line.

1.3 General Configuration of Display Panel 10

The display panel 10 according to the present embodiment will be described referring to the drawings. Note that the drawings are schematic views, and the scale therein may be different from the actual dimensions.

Figure 3:
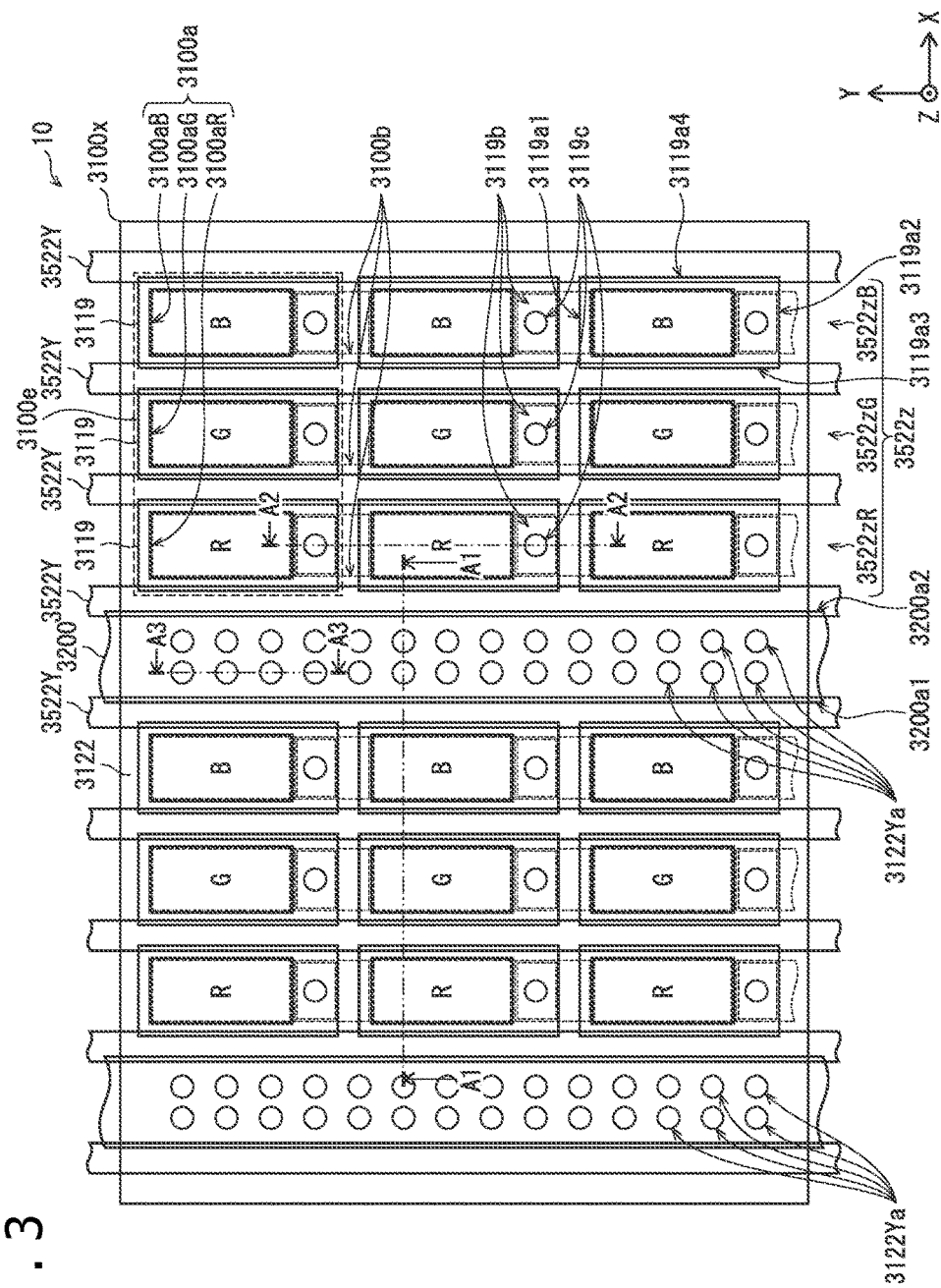
FIG. 3 is a schematic plan view depicting a part of the organic EL display panel 10.
Figure 4:
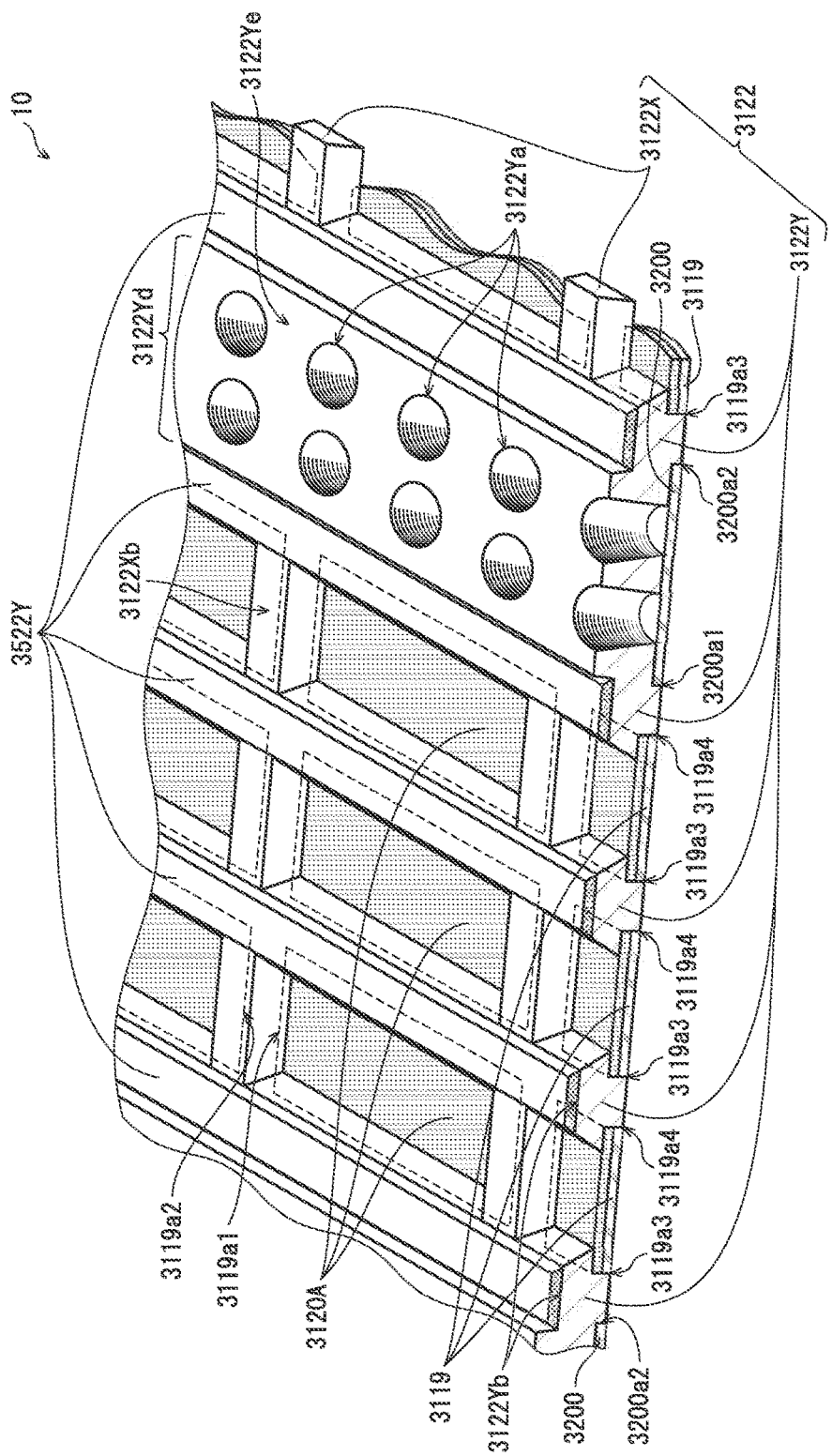
FIG. 4 is a perspective view, from an oblique upper side, of a part of an insulating layer 3122 that corresponds to a unit pixel 3100e of the organic EL display panel 10.

FIG. 3 is a schematic plan view depicting a part of the display panel according to the embodiment. FIG. 4 is a perspective view, from an oblique upper side, of a part of an insulating layer 3122 that corresponds to the unit pixel 3100$e$ of the organic EL display panel 10.

The display panel 10 is an organic EL display panel utilizing an electroluminescence phenomenon of organic compounds, in which a plurality of organic EL elements 3100 each constituting a pixel are arranged in a matrix pattern over a substrate 3100$x$ (TFT substrate) formed with thin film transistors (TFTs), to form a top emission type configuration in which light is emitted from an upper surface. In the present specification, an X-direction, a Y-direction, and a Z-direction in FIG. 3 are respectively a row direction, a column direction, and a thickness direction in the display panel 10.

In a display element arrangement region of the display panel 10, unit pixels 3100e corresponding to the organic EL elements 3100 are arranged in a matrix pattern. In each unit pixel 3100e, there are formed three kinds of self-luminescence regions 3100a, which are each a region of light emission by an organic compound, namely, 3100aR that emits red light, 3100aG that emits green light, and 3100aB that emits blue light (where 3100aR, 3100aG, and 3100aB are not distinguished from one another, they will hereafter be referred to simply as "3100a"). Specifically, three sub-pixels 3100se corresponding individually to the self-luminescence regions 3100aR, 3100aG, and 3100aB aligned in a row direction (where these sub-pixels are distinguished from one another, they will hereafter be referred to as "red sub-pixel 3100seR," "green sub-pixel 3100seG," and "blue sub-pixel 3100seB") in one set constitute the unit pixel 3100e in color display.

In the display panel 10, a plurality of pixel electrodes 3119 are arranged over a substrate 3100x in a matrix pattern, in the state of being spaced from one another by predetermined distances in a row direction and in a column direction. The pixel electrode 3119 is rectangular in shape in plan view, and is formed from a light reflecting material. The pixel electrodes 3119 arranged in the matrix pattern correspond to the three self-luminescence regions 3100aR, 3100aG, and 3100aB arranged in order in the row direction.

In the display panel 10, a plurality of auxiliary electrode layers 3200 are arranged continuously in the column direction, between the unit pixels 3100e, over the substrate 3100x. The auxiliary electrode layers 3200 are formed from the same light reflecting material as that of the pixel electrodes 3119.

A linear-shaped bank of an insulating layer type is provided, for insulation, between the pixel electrodes 3119 adjacent to each other and between the pixel electrode 3119 and the auxiliary electrode layer adjacent to each other. A plurality of column insulating layers 3122Y each extending in the column direction (the Y-direction in FIG. 3) and a plurality of column banks 3522Y over the column insulating layers 3122Y are arranged juxtaposedly, over row-direction outer edges 3119a3 and 3119a4 of two pixel electrodes 3119 adjacent to each other in the row direction and over that region of the substrate 3100x which is located between the outer edges 3119a3 and 3119a4. In addition, a plurality of column insulating layers 3122Y and a plurality of column banks 3522Y over the column insulating layers 3122Y are also arranged juxtaposedly, over the row-direction outer edge 3119a3 of the pixel electrode 3119 and an outer edge 3200a2 of the auxiliary electrode layer 3200 which are adjacent to each other in the row direction, over the outer edge 3119a4 of the pixel electrodes 3119 and an outer edge 3200a1 of the auxiliary electrode layer 3200 which are adjacent to each other in the row direction, and over those regions of the substrate 3100x which are located between the outer edges. Therefore, the row-direction outer edges of the self-luminescence regions 3100a are defined by the row-direction outer edges of the column banks 3522Y. Besides, the column insulating layer 3122Y located between the row-direction outer edge 3119a3 of the pixel electrode 3119 and the outer edge 3200a2 of the auxiliary electrode layer 3200 which are adjacent to each other in the row direction and the column insulating layer 3122Y located between the row-direction outer edge 3119a4 of the pixel electrode 3119 and the outer edge 3200a1 of the auxiliary electrode layer 3200 which are adjacent to each other in the row direction, are arranged ranging over the auxiliary electrode layer 3200 and are in connection in the row direction. That part of the column insulating layer 3122Y which is located over the auxiliary electrode layer 3200 is formed with a plurality of through-holes 3122Ya (contact holes) for connection between the auxiliary electrode 3200 and a common electrode layer 3125 which will be described later.

On the other hand, a plurality of row insulating layers 3122X each extending in the row direction (the X-direction in FIG. 3) are arranged juxtaposedly, over column-direction outer edges 3119a1 and 3119a2 of two pixel electrodes 3119 adjacent to each other in the column direction and over that region of the substrate 3100x that is located between the outer edges 3119a1 and 3119a2. The regions where the row insulating layers 3122Y are formed are non-self-luminescence regions 3100b, since organic electroluminescence does not occur in the light emitting layer 3123 over the pixel electrodes 3119. Therefore, the outer edges in the column direction of the self-luminescence region 3100a are defined by the column-direction outer edges of the row insulating layers 3122X.

Where a space between the adjacent column banks 3522Y is defined as a gap 3522z, a red gap 3522zR corresponding to the self-luminescence region 3100aR, a green gap 3522zG corresponding to the self-luminescence region 3100aG, and a blue gap 3522zB corresponding to the self-luminescence region 3100aB (where the gap 3522zR, the gap 3522zG, and the gap 3522zB are not distinguished from one another, they will hereafter be referred to as "the gap 3522z") are present as the gap 3522z.

In the display panel 10, pluralities of self-luminescence regions 3100a and non-self-luminescence regions 3100b are alternately arranged in the column direction along the gaps 3522zR, the gaps 3522zG, and the gaps 3522zB. The non-self-luminescence region 3100b is provided with a connection recess 3119c (contact hole) for connection between the pixel electrode 3119 and the source S1 of the TFT, and is provided over the pixel electrode 3119 with a contact region 3119b (contact window) for electrical connection to the pixel electrode 3119.

In each sub-pixel 3100se, the column bank 3522Y provided in the column direction and the row insulating layer 3122X provided in the row direction are orthogonal to each other, and the self-luminescence region 3100a is located between the row insulating layer 3122X and the row insulating layer 3122X in the column direction.

1.4 Configuration of Each Section of Display Panel 10

Figure 5:
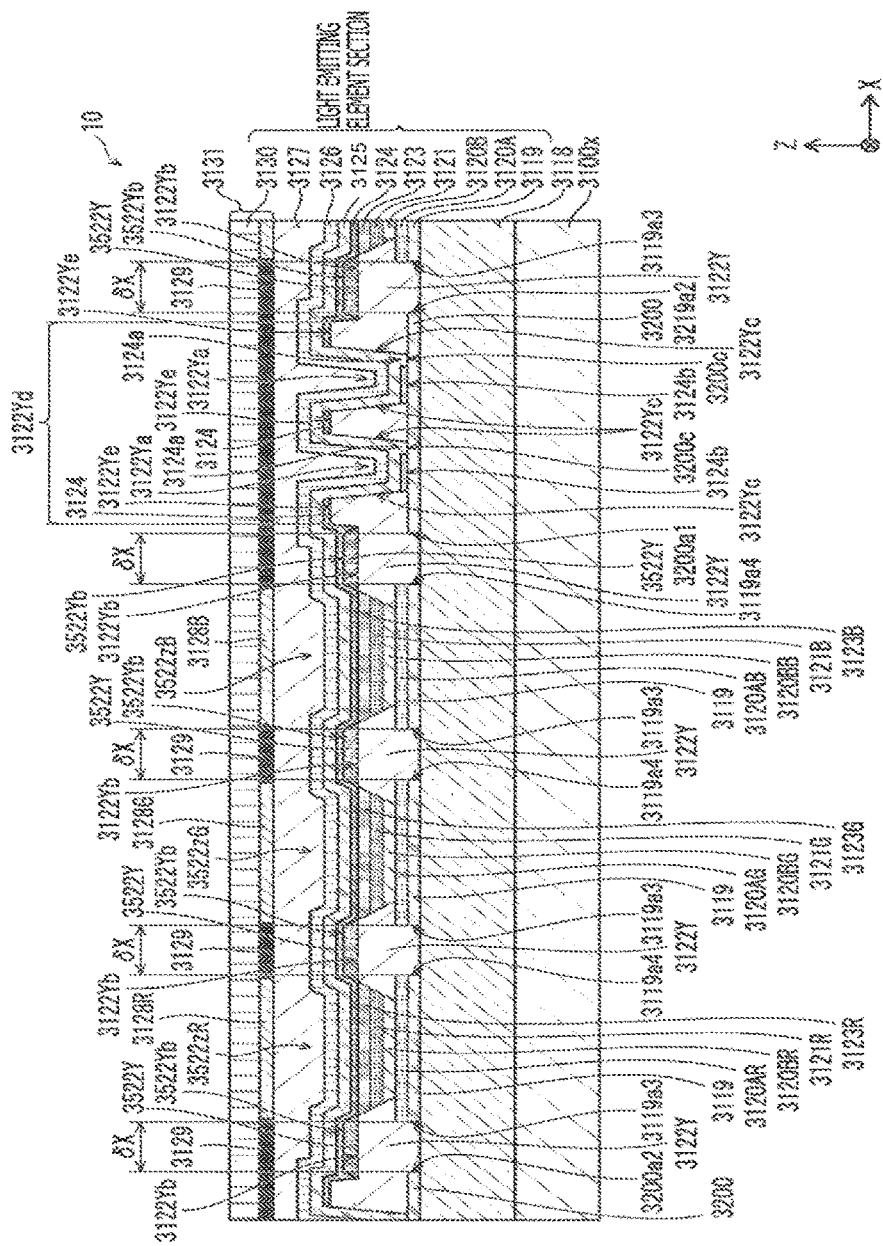
FIG. 5 is a schematic sectional view taken along line A1-A1 of FIG. 3.
Figure 6:
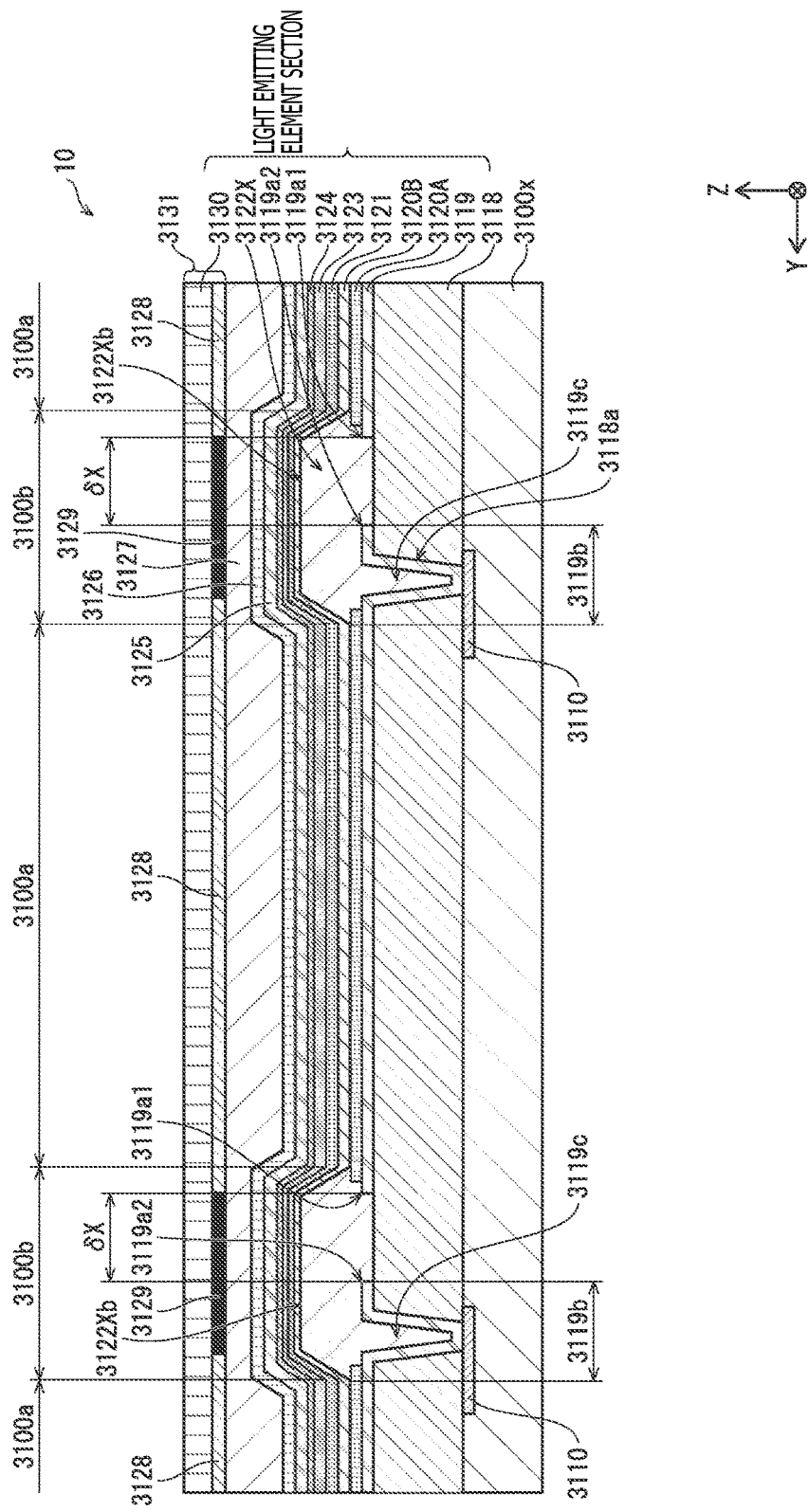
FIG. 6 is a schematic sectional view taken along line A2-A2 of FIG. 3.
Figure 7:
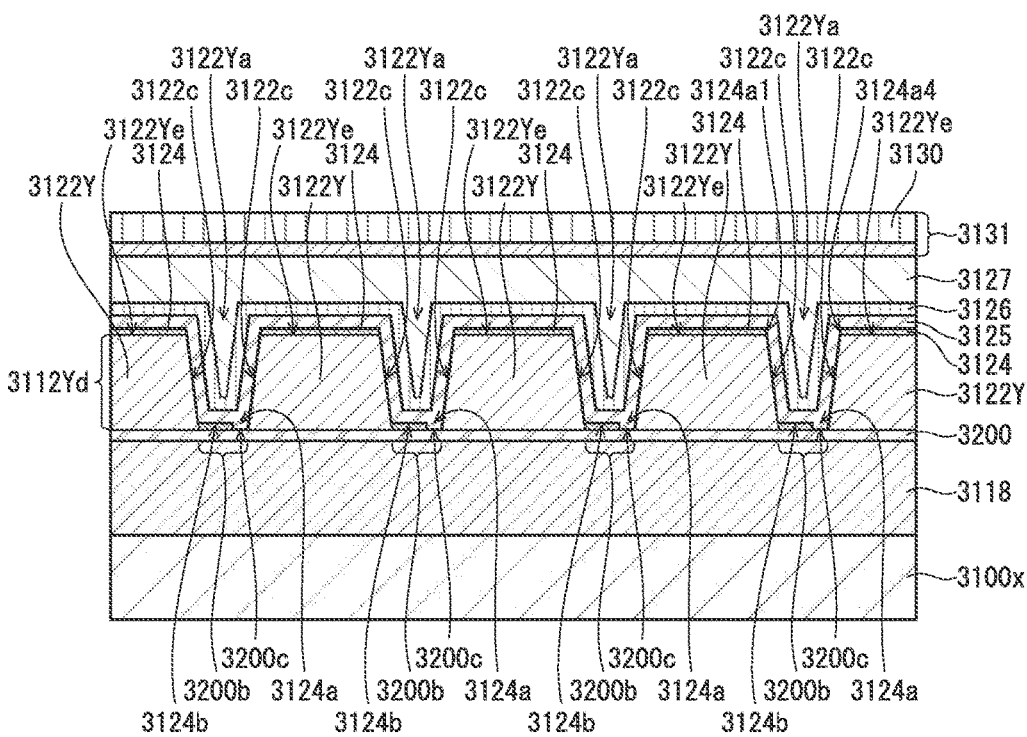
FIG. 7 is a schematic sectional view taken along line A3-A3 of FIG. 3.

The configuration of the organic EL element 3100 in the display panel 10 will be described below, referring to FIGS. 5, 6, and 7. FIG. 5 is a schematic sectional view taken along line A1-A1 of FIG. 3. FIG. 6 is a schematic sectional view taken along line A2-A2 of FIG. 3. FIG. 7 is a schematic sectional view taken along line A3-A3 of FIG. 3.

In the display panel 10 according to the present embodiment, a substrate (TFT substrate) provided with thin film transistors is disposed on the lower side in the Z-axis direction, and the organic EL element sections are provided over the substrate.

1.4.1 Substrate (1) Substrate 3100x

A substrate 3100x is a support member of the display panel 10, and includes a base material (not depicted) and a transistor (TFT) layer (not depicted) formed on the base material.

The base material as the support member of the display panel 10 is flat plate-like in shape. As the material of the base material, there can be used an electrically insulating material, for example, glass materials, resin materials, semiconductor materials, metallic materials coated with an insulating layer, and the like.

The TFT layer includes a plurality of TFTs and a plurality of wirings such as wirings 3110, which are formed on an upper surface of the base material. The TFT electrically connects the pixel electrode 3119 corresponding thereto and an external power supply to each other, according to a driving signal sent from an external circuit for the display panel 10, and has a multi-layer structure that includes electrodes, a semiconductor layer, an insulating layer and the like. The wirings electrically connect the TFTs, the pixel electrodes 3119, the external power supply, the external circuit and the like. The wiring 3110 is connected to the source S1 of the TFT.

(2) Interlayer Insulating Layer 3118

An interlayer insulating layer 3118 is provided on the substrate and on an upper surface of the TFT layer. The interlayer insulating layer 3118 located on an upper surface of the substrate 3100x is for planarizing the upper surface of the substrate 3100x having projections and recesses due to the presence of the TFT layer. In addition, the interlayer insulating layer 3118 fills up the gaps between the wirings and the TFTs, thereby insulating the wirings and the TFTs from each other.

As depicted in FIG. 6, the interlayer insulating layer 3118 has contact holes 3118a opened in its parts on the upper side of the wirings 3110. If an upper limit film thickness of the interlayer insulating layer 3118 is not less than 10 μm, variability in film thickness upon manufacture is enlarged, and it becomes difficult to control the bottom line width. In addition, the upper limit film thickness is preferably not more than 7 μm, from the viewpoint of a lowering in productivity due to an increase in tact. As for a lower limit film thickness, as the film thickness decreases, it may become necessary to make the film thickness and the bottom line width comparable to each other. If the lower limit film thickness is not more than 1 μm, it becomes difficult to obtain a desired bottom line width due to limitations as to resolution. In the case of a general exposure apparatus for flat panel displays, the limit is 2 μm. Therefore, the thickness of the interlayer insulating layer 3118 is preferably, for example, 1 to 10 μm, more preferably 2 to 7 μm.

1.4.2 Organic EL Element Section (1) Pixel Electrode 3119

As depicted in FIGS. 5 and 6, the interlayer insulating layer 3118 located at the upper surface of the substrate 3100x is provided with pixel electrodes 3119 on a sub-pixel 3100se basis. The pixel electrode 3119 is for supplying carriers to a light emitting layer 3123; for example, where the pixel electrode 3119 functions as an anode, it supplies holes to the light emitting layer 3123. In addition, since the display panel 10 is of the top emission type, the pixel electrode 3119 has a light reflecting property. The pixel electrode 3119 is rectangular flat plate-like in shape. The pixel electrodes 3119 are disposed on the interlayer insulating layer 3118, with a spacing OX therebetween in the row direction and with a spacing δY therebetween in the column direction in each of the gap 3522zR, the gap 3522zG, and the gap 3522zB. The interlayer insulating layer 3118 is formed on the upper side of the contact hole 3118a with the connection recess 3119c for the pixel electrode 3119, by recessing a part of the pixel electrode 3119 in the direction of the substrate 3100x. At the bottom of the connection recess 3119c, the pixel electrode 3119 and the wiring 3110 are connected to each other.

(2) Auxiliary Electrode Layer 3200

As depicted in FIGS. 5 and 7, the auxiliary electrode layers 3200 are also provided on the interlayer insulating layer 3118 located at the upper surface of the substrate 3100x. The auxiliary electrode layers 3200 are arranged between the pixel electrodes 3119, with a spacing δX therebetween in the row direction. The auxiliary electrode layer 3200 is covered with the column insulating layer 3122Y in ranges other than the through-holes 3122Ya in the column insulating layer 3122Y. Details of the manner of contact between the auxiliary electrode layer 3200 and an electron transport layer 3124 or a common electrode layer, inside the through-hole 3122Ya, will be described later.

(3) Hole Injection Layer 3120

As depicted in FIGS. 5 and 6, hole injection layers 3120 are stacked on the pixel electrodes 3119. The hole injection layer 3120 has a function of transporting holes, which are injected from the pixel electrode 3119, to a hole transport layer 3121.

The hole injection layer 3120 includes a lower layer 3120A formed of a metallic oxide formed on the pixel electrode 3119, and an upper layer 3120B formed of an organic matter stacked at least on the lower layer 3120A, in this order from the substrate side. The lower layers 3120A provided in a blue sub-pixel, a green sub-pixel, and a red sub-pixel are referred to as a lower layer 3120AB, a lower layer 3120AG, and a lower layer 3120AR, respectively. In addition, the upper layers 3120B provided in the blue sub-pixel, the green sub-pixel, and the red sub-pixel are referred to as an upper layer 3120BB, an upper layer 3120BG, and an upper layer 3120BR, respectively.

In the present embodiment, the upper layers 3120B are provided in a linear shape such as to extend in the column direction, in the gap 3522zR, the gap 3522zG, and the gap 3522zB which will be described later. However, a configuration may be adopted in which the upper layers 3120B are formed only on the lower layers 3120A formed on the pixel electrodes 3119, and are provided intermittently in the column direction in the gaps 3522z.

(4) Insulating Layer 3122

As depicted in FIGS. 5 and 6, the insulating layers 3122 formed of an insulating material are formed so as to cover end edges of the lower layers 3120A of the hole injection layers 3120 and the auxiliary electrode layers 3200. As the insulating layers 3122, there are a plurality of column insulating layers 3122Y that extend in the column direction and are provided juxtaposedly in the row direction, and a plurality of row insulating layers 3122 X that extend in the row direction and are provided juxtaposedly in the column direction. As depicted in FIG. 3, the column insulating layers 3122Y are provided in the state of being along the row direction orthogonal to the row insulating layers 3122X. The column insulating layers 3122Y and the row insulating layers 3122X together form a grid-like pattern (where the row insulating layer 3122X and the column insulating layer 3122Y are not distinguished from each other, they will hereafter be referred to as "the insulating layer 3122").

The shape of the row insulating layer 3122X is a linear shape extending in the row direction, and its section parallel to the column direction is a normal tapered trapezoid tapered upward. The row insulating layers 3122X are provided in the state of being along the row direction orthogonal to the column direction, in such a manner as to intersect each of the column insulating layer 3122Y in a grid-like pattern. The row insulating layers 3122X each have an upper surface 3122Xb at the same height position as an upper surface 3122Yb of the column insulating layer 3122Y. Therefore, openings corresponding to the self-luminescence regions 3100a are defined by the row insulating layers 3122X and the column insulating layers 3122Y.

The row insulating layers 3122X are for controlling flow, in the column direction, of an ink containing an organic compound as a material of the light emitting layers 3123. Therefore, the row insulating layers 3122X should have an affinity for the ink of not less than a predetermined value. By such a configuration, it is possible to restrain variations in the ink coating amount among the sub-pixels. The row insulating materials 3122X prevent the pixel electrodes 3119 from being exposed, so that, in the regions where the row insulating layers 3122X are present, light emission does not occur; thus, such regions do not contribute to luminance.

Specifically, the row insulating layers 3122X are present over outer edges 3119a1 and 3119a2 in the column direction of the pixel electrodes 3119, and are formed in the state of overlapping with the contact regions 3119b of the pixel electrodes 3119. The length in the column direction of the non-self-luminescence region 3100b where the row insulating layer 3122X is formed is larger by a predetermined length than the distance δY between the column-direction outer edges 3119a1 and 3119a2 of the pixel electrodes 3119. As a result of this, by covering the column-direction outer edges 3119a1 and 3119a2 of the pixel electrodes 3119, electric leak between the pixel electrode 3119 and the common electrode layer 3125 is prevented, and outer edges of the light emitting region 3100a of each sub-pixel 3100se in the column direction are defined.

The shape of the column insulating layer 3122Y is a linear shape extending in the column direction, and its section parallel to the row direction is a normal tapered trapezoid tapered upward. The column insulating layers 3122Y are present over outer edges 3119a3 and 3119a4 in the row direction of the pixel electrodes 3119 and over the outer edges 3119a3 and 3119a4 in the row direction of the pixel electrodes 3119 and outer edges 3200a1 and 3200a2 in the row direction of the auxiliary electrode layers 3200, and are formed in the state of overlapping with the pixel electrodes 3119 and the auxiliary electrode layers 3200. The width in the row direction of the region where the column insulating layer 3122Y is formed is greater by a predetermined width than the distance δX between the row-direction outer edges 3119a3 and 3119a4 of the pixel electrodes 3119. As a result of this, by covering the row-direction outer edges 3119a3 and 3119a4 of the pixel electrodes 3119, electric leak between the pixel electrode 3119 and the common electrode layer 3125 is prevented, and outer edges of the light emitting region 3100a of each sub-pixel 3100se in the row direction are defined.

In addition, as depicted in FIG. 5, the column insulating layer 3122Y located between the row-direction outer edge 3119a3 of the pixel electrode 3119 and the outer edge 3200a2 of the auxiliary electrode layer 3200 that are adjacent to each other in the row direction and the column insulating layer 3122Y located between the row-direction outer edge 3119a4 of the pixel electrode 3119 and the outer edge 3200a1 of the auxiliary electrode layer 3200 that are adjacent to each other in the row direction are disposed ranging over the auxiliary electrode layer 3200, and are formed in connection with each other in the row direction. That bank-shaped portion of the column insulating layer 3122Y which is raised to the upper side of the auxiliary electrode layer 3200 is referred to as an electrode upper portion 3122Yd. An upper surface 3122Ye of the electrode upper portion 3122Yd is located above an upper surface 3122Yb of the column insulating layer 3122Y.

Besides, the upper surface 3122Ye of the electrode upper portion 3122Yd located on the upper side of the auxiliary electrode layer 3200, of the column insulating layer 3122Y, is formed with a plurality of through-holes 3122Ya (contact holes) for connection between the auxiliary layer 3200 and the common electrode layer 3125 which will be described later.

(5) Column Bank 3522Y

The column banks 3522Y are present over the outer edges 3119a3 and 3119a4 in the row direction of the pixel electrodes 3119 and over the outer edges 3119a3 and 3119a4 in the row direction of the pixel electrodes 3119 and the outer edges 3200a1 and 3200a2 in the row direction of the auxiliary electrode layers 3200, and are formed on upper surfaces 3122Yb of the column insulating layers 3122Y in the state of overlapping with the column insulating layers 3122Y. The shape of the column bank 3522Y is a linear shape extending in the column direction, and its section parallel to the row direction is a normal tapered trapezoid tapered upward. The column banks 3522Y are for damming up flow, in the row direction, of inks each containing an organic compound as a material of the light emitting layer 3123, to thereby define the row-direction outer edges of the light emitting layers 3123. Therefore, the column banks 3522Y should have a repellency against the inks of not less than a predetermined value. By this function, the column banks 3522Y define outer edges of the self-luminescence region of each pixel in the row direction.

(6) Hole Transport Layer 3121

As depicted in FIGS. 5 and 6, hole transport layers 3121 are stacked on the row insulating layers 3122X and on the hole injection layers 3120 in the gaps 3522zR, 3522zG, and 3522zB. The hole transport layers 3121 are in contact with the upper layers 3120B of the hole injection layers 3120. The hole transport layer 3121 has a function of transporting holes, which are injected from the hole injection layer 3120, to the light emitting layer 3123. The hole transport layers 3121 provided in the gaps 3522zR, 3522zG, and 3522zB are referred to as a hole transport layer 3121R, a hole transport layer 3121G, and a hole transport layer 3121B, respectively.

In the present embodiment, in the gaps 3522z which will be described later, the hole transport layer 3121 is provided in a linear shape such as to extend in the column direction, like the upper layer 3120B. However, the hole transport layer 3121 may be provided intermittently in the column direction in the gaps 3522z.

(7) Light Emitting Layer 3123

As depicted in FIGS. 5 and 6, the light emitting layers 3123 are stacked on the hole transport layers 3121. The light emitting layer 3123 is a layer formed from an organic compound, and has a function of emitting light through recombination of holes and electrons in the inside thereof. In the gap 3522zR, the gap 3522zG, and the gap 3522zB, the light emitting layers 3123 are provided in a linear shape extending in the column direction. In the gaps 3522zR, the gaps 3522zG, and the gaps 3522zB defined by the column banks 3522Y, the light emitting layers 3123 are formed to extend in the column direction. The light emitting layers 3123R, 3123G, and 3123B that emit light in respective colors are formed in the red gaps 3522zR corresponding to the self-luminescence regions 3100aR in the red sub-pixels 3100seR, the green gaps 3522zG corresponding to the self-luminescence regions 3100aG in the green sub-pixels 3100seG, and the blue gaps 3522zB corresponding to the self-luminescence regions 3100aB in the blue sub-pixels 3100seB, respectively.

The light emitting layer 3123 emit light only at its part supplied with carriers from the pixel electrode 3119; therefore, in a range where the row insulating layer 3122X as an insulating material is present between the layers, the electroluminescence phenomenon of an organic compound does not occur. For this reason, the light emitting layer 3123 emits light only at its part where the row insulating layer 3122X is absent, and this part serves as the self-luminescence region 3100a. Outer edges in the column direction of the self-luminescence region 3100a are defined by column-direction outer edges of the row insulating layers 3122X.

Of the light emitting layer 3123, the parts located over side surfaces and the upper surface 3122Xb of the row insulating layer 3122X do not emit light, and these parts serve as the non-self-luminescence regions 3100b. The light emitting layer 3123 is located on the upper side of the hole transport layer 3121 at its self-luminescence region 3100a, and is located on the upper side of the hole transport layer 3121 over the upper surface and side surfaces of the row insulating layer 3122X.

Note that the light emitting layer 3123 extends continuously not only in the self-luminescence region 3100a but also in the adjacent non-self-luminescence regions 3100b. This configuration ensures that at the time of forming the light emitting layers 3123, the ink applied in the self-luminescence region 3100a can flow in the column direction through the ink applied in the non-self-luminescence regions 3100b, so that the film thickness of the ink can be leveled off between the pixels in the column direction. It is to be noted, however, that in the non-self-luminescence regions 3100b, flow of the ink is moderately restrained by the row insulating layer 3122X. Therefore, large variability in film thickness is not liable to be generated in the column direction, and variability in luminance from pixel to pixel is improved.

(8) Electron Transport Layer 3124

As illustrated in FIGS. 5 and 6, an electron transport layer 3124 is stackedly formed so as to cover the column banks 3522Y and the gaps 3522z defined by the column banks 3522Y. The electron transport layer 3124 is formed in the state of being continuous over the whole part of the display panel 10. As depicted in FIGS. 5 and 6, the electron transport layer 3124 is formed on the light emitting layers 3123. The electron transport layer 3124 has a function of transporting electrons, coming from the common electrode layer 3125, to the light emitting layers 3123, and restricting the injection of electrons into the light emitting layers 3123.

In addition, as depicted in FIGS. 5 and 7, the electron transport layer 3124 is formed also on the column insulating layers 3122Y which cover the auxiliary electrode layers 3200. The electron transport layer 3124 is partly formed also on the auxiliary electrode layers 3200 in the through-holes 3122Ya in the column insulating layers 3122Y. Specifically, of the electron transport layer 3124, a part located in the vicinity of an inner wall 3122c of the through-hole 3122Ya is lacking, so that there is a lacking part 3124a where the electron transport layer 3124 is not formed. At the lacking part 3124a, a contact surface 3200c of the auxiliary electrode layer 3200 is exposed. In addition, the electron transport layer 3124 is formed at parts exclusive of the contact surface 3200c in a hole bottom portion 3200b of the auxiliary electrode layer 3200 corresponding to a bottom surface of the through-hole 3122Ya, to constitute a deposited portion 3124b.

Note that the electron transport layer 3124 is not formed at a part located on the inner wall 3122Yc of the through-hole 3122Ya.

(9) Common Electrode Layer 3125

As illustrated in FIGS. 5 and 6, the common electrode layer 3125 is formed on the electron transport layer 3124. The common electrode layer 3125 is formed over the whole surface of the display panel 10, and serves as a common electrode for the light emitting layers 3123. As depicted in FIGS. 5 and 6, the common electrode layer 3125 is formed also in those regions on the electron transport layer 3124 which are on the upper side of the pixel electrodes 3119. The common electrode layer 3125 sandwiches the light emitting layers 3123 together with the pixel electrodes 3119 to form conducting paths, thereby supplying carriers to the light emitting layers 3123; for example, where the common electrode layer 3125 functions as a cathode, it supplies electrons to the light emitting layers 3123.

As depicted in FIGS. 5 and 7, the common electrode layer 3125 is formed also in regions over the auxiliary electrode layers 3200. The common electrode layer 3125 is formed so as to make direct contact with the contact surfaces 3200c exposed at the lacking parts 3124a of the electron transport layer 3124 over the auxiliary electrode layers 3200 in the through-holes 3122Ya in the column insulating layers 3122Y.

(10) Sealing Layer 3126

A sealing layer 3126 is stackedly formed so as to cover the common electrode layer 3125. The sealing layer 3126 is for restraining the light emitting layers 3123 from being deteriorated due to contact with moisture or air. The sealing layer 3126 is provided over the whole surface of the display panel 10 so as to cover the upper surface of the common electrode layer 3125.

(11) Bonding Layer 3127

On the upper side in the Z-axis direction of the sealing layer 3126, a CF substrate 3131 having color filter layers 3128 formed on a main surface on the lower side in the Z-axis direction of an upper substrate 3130 is disposed, and is bonded to the sealing layer 3126 by a bonding layer 3127. The bonding layer 3127 laminates a back panel composed of layers ranging from the substrate 3100x to the sealing layer 3126 and the CF substrate 3131, and has a function of preventing each of the layers from being exposed to moisture or air.

(12) Upper Substrate 3130

The CF substrate 3131 having the color filter layers 3128 formed on the upper substrate 3130 is disposed on and bonded to the bonding layer 3127. Since the display panel 10 is of the top emission type, a light-transmitting material such as, for example, a cover glass or a transparent film is used as the upper substrate 3130. In addition, with the upper substrate 3130 thus provided, it is possible to enhance rigidity of the display panel 10 and prevent penetration of moisture, air or the like.

(13) Color Filter Layer 3128

The color filter layers 3128 are formed in the upper substrate 3130 at positions corresponding to the color self-luminescence regions 3100a of the pixels. The color filter layers 3128 are transparent layers provided for transmitting therethrough visible lights of wavelengths corresponding to R, G, and B, and has a function of permitting the light emitted from each color pixel to pass therethrough, thereby correcting chromaticity of the light. For instance, in the present example, red, green, and blue filter layers 3128R, 3128G, and 3128B are formed on the upper side of the self-luminescence region 3100aR in the red gaps 3522zR, the self-luminescence regions 3100aG in the green gaps 3522zG, and the self-luminescence regions 3100aB in the blue gaps 3522zB, respectively.

(14) Light-Shielding Layer 3129

The upper substrate 3130 is provided with light-shielding layer 3129 at positions corresponding to boundaries between the light emitting regions 3100a of the pixels. The light-shielding layer 3129 is black resin layers provided for inhibiting transmission therethrough of visible lights of wavelengths corresponding to R, G, and B, and is formed from, for example, a resin material containing a black pigment excellent in light-absorbing and light-shielding properties.

1.4.3 Constituent Material of Each Section

An example of constituent materials of the sections depicted in FIGS. 5, 6, and 7 will be given below.

(1) Substrate 3100x (TFT Substrate)

As the base material, there can be adopted, for example, glass substrates, quartz substrate, silicon substrate, metallic substrates made of molybdenum sulfide, copper, zinc, aluminum, stainless steel, magnesium, iron, nickel, gold, silver or the like, semiconductor substrates such as gallium arsenide substrate, plastic substrates, and the like. As the flexible plastic material, there may be used both thermoplastic resins and thermosetting resins. As the material, there can be used electrically insulating materials, for example, resin materials. For the gate electrode, gate insulating layer, channel layer, channel protection layer, source electrode, drain electrode and the like constituting the TFTs, known materials can be used. As the gate electrode, for example, there is adopted a stacked body of copper (Cu) and molybdenum (Mo). For the gate insulating layer, known organic materials and known inorganic materials such as, for example, silicon oxide (SiO2) or silicon nitride (SiNx), can both be used so long as they are electrically insulating materials. For the channel layer, there can be used oxide semiconductors that contain at least one selected from among indium (In), gallium (Ga), and zinc (Zn). For the channel protection layer, there can be used, for example, silicon oxynitride (SiON), silicon nitride (SiNx), or aluminum oxide (AlOx). As the source electrode and the drain electrode, there can be used, for example, a stacked body of copper-manganese (CuMn) and copper (Cu) and molybdenum (Mo).

For the insulating layer at an upper portion of the TFT, there can also be used, for example, silicon oxide (SiO2), silicon nitride (SiN), and silicon oxynitride (SiON). As a connection electrode layer of the TFT, there can be used, for example, a stacked body of molybdenum (Mo) and copper (Cu) and copper-manganese (CuMn). Note that the material to be used for constituting the connection electrode layer is not restricted to this, and can be appropriately selected from among conductive materials.

As the material for the interlayer insulating layer 3118 located at the upper surface of the substrate 3100x, there can be used, for example, polyimide resins, acrylic resins, siloxane resins, novolak type phenolic resins and the like.

(2) Pixel Electrode 3119 and Auxiliary Electrode Layer 3200

The pixel electrodes 3119 are formed from a metallic material. In the case of the display panel 10 according to the present embodiment that is of the top emission type, the thickness of the pixel electrodes 3119 is optimally set and an optical resonator structure is adopted, thereby controlling the chromaticity of light and enhancing luminance; therefore, a surface portion of the pixel electrode 3119 should have a high reflective property. In the display panel 10 according to the present embodiment, the pixel electrodes 3119 may have a structure wherein a plurality of films selected from among metallic layers, alloy layers, and transparent conductive films are stacked. The metallic layer can be formed, for example, from a metallic material containing silver (Ag) or aluminum (Al). For the alloy layer, there can be used, for example, APC (an alloy of silver, palladium, and copper), ARA (an alloy of silver, rubidium, and gold), MoCr (an alloy of molybdenum and chromium), NiCr (an alloy of nickel and chromium), and the like. As the constituent material of the transparent conductive layer, there can be used, for example, indium tin oxide (ITO), indium zinc oxide (IZO) and the like.

(3) Hole Injection Layer 3120

The lower layer 3120A of the hole injection layer 3120 is a layer formed of an oxide of, for example, silver (Ag), molybdenum (Mo), chromium (Cr), vanadium (Va), tungsten (W), nickel (Ni), iridium (Ir) or the like. In the case where the lower layer 3120A is formed of an oxide of a transition metal, the transition metal takes a plurality of oxidation numbers and can thereby take a plurality of levels, so that hole injection is facilitated and the driving voltage can be lowered. In the present embodiment, the lower layer 3120A included an oxide of tungsten (W). In the case of an oxide of tungsten (W), as the ratio (W5+/W6+) of pentavalent tungsten atoms to hexavalent tungsten atoms is higher, the driving voltage for the organic EL element is lower; therefore, it is preferable that the tungsten oxide contains pentavalent tungsten atoms in a large amount of not less than a predetermined value.

As the upper layer 3120B of the hole injection layer 3120, there can be used, for example, a coating film formed from an organic polymer solution of a conductive polymer material such as PEDOT (a mixture of polythiophene and polystyrenesulfonic acid), as aforementioned.

(4) Insulating Layer 3122 and Column Bank 3522Y

The insulating layers 3122 and the column banks 3522Y are formed by use of an organic material such as resin, and have an insulating property. Examples of the material to be used for forming the insulating layers 3122 include acrylic resins, polyimide resins, and novolak type phenolic resins. It is preferable that the organic material has organic solvent resistance. It is more preferable to use acrylic resin, since it is low in refractive index and is suitable for use as reflector.

Alternatively, the insulating layers 3122 and the column banks 3522Y may be formed by use of an inorganic material; in this case, for example, silicon oxide (SiO2) is preferably used, from the viewpoint of refractive index. Alternatively, the insulating layers 3122 and the column banks 3522Y may be formed by use of an inorganic material such as, for example, silicon nitride (SiN) or silicon oxynitride (SiON).

Further, an etching treatment, a baking treatment and the like may be conducted during the manufacturing process, and, therefore, the insulating layers 3122 and the column banks 3522Y are preferably formed from a material high in resistance to the treatments so that they would not be excessively deformed or denatured by the treatments.

In addition, the column banks 3522Y may have their surfaces subjected to a fluorine treatment for imparting water repellency to the surfaces. Besides, a fluorine-containing material may be used for forming the column banks 3522Y. In addition, the insulating layers 3122 may be subjected to irradiation with ultraviolet (UV) rays or a baking treatment at a low temperature, for lowering water repellency of the surfaces thereof.

(5) Hole Transport Layer 3121

For the hole transport layers 3121, there can be used, for example, high-molecular compounds such as polyfluorene and derivatives thereof, polyarylamines, which are amine-based organic polymers, or TFB (poly(9,9-di-n-octylfluoroene-alt-(1,4-phenylene-((4-sec-butylphenyl)imino)-1,4-phenylene))).

(6) Light Emitting Layer 3123

The light emitting layers 3123 have a function of emitting light by generation of an excited state through recombination of holes and electrons injected thereinto, as aforementioned. As the material for forming the light emitting layers 3123, there should be used a light-emitting organic material which can be formed into a film by use of a wet printing method.

Specifically, the light emitting layers 3123 are preferably formed from a fluorescent material, examples of which include oxinoid compounds, perylene compounds, coumarin compounds, azacoumarin compounds, oxazole compounds, oxadiazole compounds, perynone compounds, pyrrolopyrrole compounds, naphthalene compounds, anthracene compounds, fluorenone compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes of 8-hydroxyquinoline compounds, metal complexes of 2-bipyridine compounds, complexes of Schiff base and Group III metal, oxine metal complexes, and rare earth complexes, which are described in patent publication (Japanese Patent Laid-open No. Hei 5-163488).

(7) Electron Transport Layer 3124

For the electron transport layer 3124, an organic material having a high electron transporting property is used. Examples of the organic material to be used for the electron transport layer 3124 include 7-electron low-molecular-weight organic materials such as oxadiazole derivatives (OXD), triazole derivatives (TAZ), and phenanthroline derivatives (BCP, Bphen). In addition, the electron transport layer 3124 may include a layer formed by doping an organic material having a high electron transporting property with a dopant metal selected from among alkali metals and alkaline earth metals. Besides, the electron transport layer 3124 may include a layer formed by use of sodium fluoride.

(8) Common Electrode Layer 3125

For the common electrode layer 3125, a conductive material having a light transmitting property is used. For example, indium tin oxide (ITO) or indium zinc oxide (IZO) or the like is used to form the common electrode layer 3125. An electrode obtained by forming silver (Ag) or aluminum (Al) or the like into a thin film may also be used.

(9) Sealing Layer 3126

The sealing layer 3126 has a function of restraining the organic layers such as the light emitting layers 3123 from being exposed to moisture or air, and is formed by use of a light transmitting material such as, for example, silicon nitride (SiN) or silicon oxynitride (SiON). In addition, a sealing resin layer formed of a resin material such as acrylic resin or silicone resin may be provided on the layer formed by use of such material as silicon nitride (SiN) or silicon oxynitride (SiON).

The sealing layer 3126 should be formed from a light transmitting material, in the case of the display panel 10 according to the present embodiment that is of the top emission type.

(10) Bonding Layer 3127

The material of the bonding layer 3127 is, for example, a resin adhesive or the like. For the bonding layer 3127, there can be adopted a light transmitting resin material such as acrylic resins, silicone resins, and epoxy resins.

(11) Upper Substrate 3130

As the upper substrate 3130, there can be adopted substrates formed of a light transmitting material, such as, for example, glass substrates, quartz substrate, and plastic substrates.

(12) Color Filter Layer 3128

For the color filter layers 3128, there can be adopted, for example, known resin materials (e.g., such commercially available materials as Color Resists produced by JSR corporation).

(13) Light Shielding Layer 3129

The light shielding layers 3129 are formed from a resin material containing a UV-curing resin (e.g., UV-curing acrylic resin) material as a main constituent, with a black pigment added thereto. As the black pigment, there can be adopted light shielding materials such as, for example, carbon black pigments, titanium black pigments, metallic oxide pigments, and organic pigments.

1.5 Method of Manufacturing Display Panel 10

A method of manufacturing the display panel 10 will be described referring to FIGS. 8A, 8B, 8C, 8D, 9A, 9B, 9C, 9D, 9E, 10A, 10B, 10C, 10D and 11.

(1) Preparation of Substrate 3100x

Figure 8A:
FIGS. 8A, 8B, 8C and 8D are schematic sectional views taken at the same position as A1-A1 of FIG. 3, illustrating a state in each step in manufacture of the organic EL display panel 10.

The substrate 3100x formed with pluralities of TFTs and wirings inclusive of the wirings 3110 is prepared. The substrate 3100x can be produced by a known TFT production method (FIG. 8A).

(2) Formation of Interlayer Insulating Layer 3118

Figure 8B:

The aforementioned constituent material (photosensitive resin material) of the interlayer insulating layer 3118 is applied as a photoresist in such a manner as to cover the substrate 3100x, and the surface is planarized, to form the interlayer insulating layer 3118 (FIG. 8B).

After the interlayer insulating layer 3118 is formed, a photomask provided with predetermined openings is placed thereon, and irradiation with UV rays from above is conducted to expose the interlayer insulating layer 3118, thereby transferring the pattern possessed by the photomask (not illustrated). Thereafter, development is performed, to form the interlayer insulating layer 3118 in which contact holes 3118a are patterned. Wirings 3110 are exposed at bottom portions of the contact holes 3118a (not illustrated).

While the interlayer insulating layer 3118 is formed by use of a positive type photoresist in the present embodiment, the interlayer insulating layer 3118 may be formed by use of a negative type photoresist.

(3) Formation of Pixel Electrode 3119 and Auxiliary Electrode Layer 3200

Figure 8C:
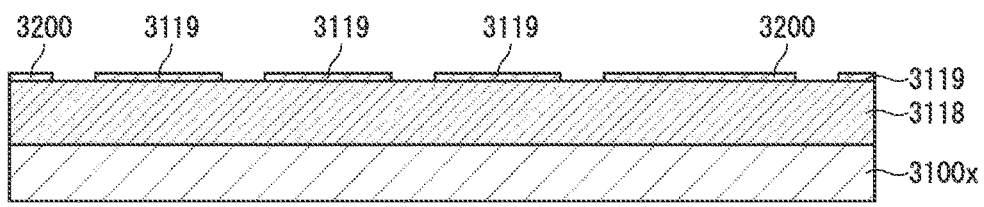

After the interlayer insulating layer 3118, which has the contact holes 3118a opened, are formed, the pixel electrodes 3119 and the auxiliary electrode layers 3200 are formed (FIG. 8C).

Formation of the pixel electrodes 3119 and the auxiliary electrode layers 3200 is conducted by forming a metallic film by use of a sputtering process or the like, followed by patterning by use of a photolithography method and an etching method. In this instance, a metallic film is formed along inner walls of the contact holes 3118a, whereby the connection recesses 3119c of the pixel electrodes 3119 are formed (not illustrated).

The pixel electrode 3119 makes direct contact with the wiring 3110 exposed at a bottom portion of the contact hole 3118a, to be in electrical connection with the electrode of the TFT.

The pixel electrode 3119 is preferably formed by a film forming process which is excellent in step coverage (for example, a sputtering process and a CVD process), in order not to be cut off at a side surface of the contact hole 3118a in the interlayer insulating layer 3118. In addition, even when the film forming process excellent in step coverage is used, if the film thickness of the pixel electrodes 3119 is excessively small, stepping may be generated; therefore, it is preferable to form the pixel electrodes 3119 in a film thickness of not less than 70 nm.

(4) Formation of Lower Layer 3120a of Hole Injection Layer 3120

Figure 8D:
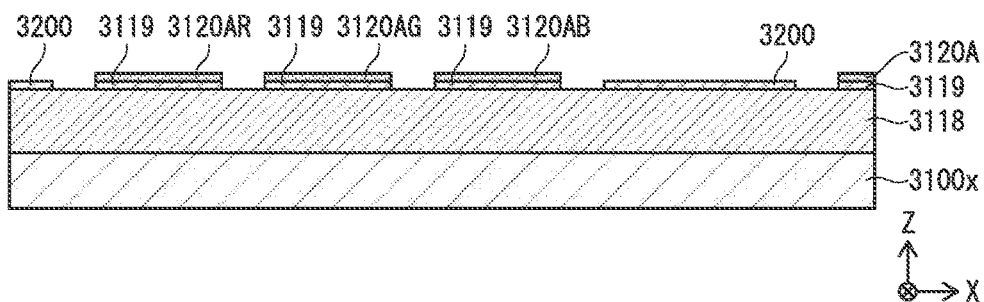

After the pixel electrodes 3119 and the auxiliary electrode layers 3200 are formed, the lower layers 3120A of the hole injection layers 3120 are formed (FIG. 8D).

The lower layers 3120A are formed by forming films composed individually of a metal (e.g., tungsten) by use of sputtering process or a vapor deposition process such as a vacuum deposition process, followed by baking to oxidize the metal, and patterning on a pixel basis by use of a photolithography process and an etching process.

(5) Formation of Insulating Layer 3122

Figure 9A:
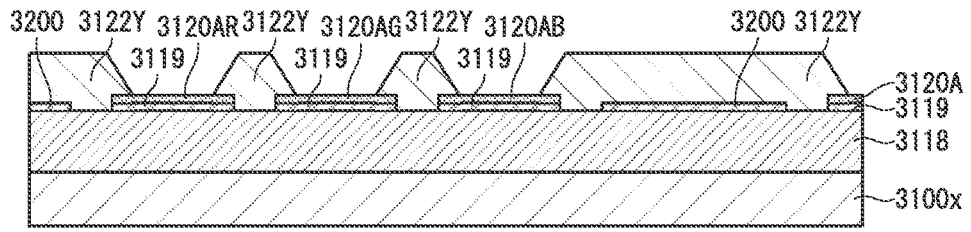
FIGS. 9A, 9B, 9C, 9D and 9E are schematic sectional views taken at the same position as A1-A1 of FIG. 3, illustrating a state in each step in the manufacture of the organic EL display panel 10.

After the lower layer 3120A of the hole injection layer 3120 is formed, the insulating layers 3122 are formed so as to cover edge portions of the lower layer 3120A and of the auxiliary electrode layers 3200 (FIG. 9A). In forming the insulating layers 3122, the row insulating layers 3122X and the column insulating layers 3122Y are formed so as to form the gaps 3522Z. The insulating layers 3122 are so formed that the surfaces of the lower layers 3120A of the hole injection layers 3120 are exposed between the row insulating layer 3122X and the row insulating layer 3122X in the gaps 3522Z.

In forming the insulating layers 3122, first, a film of the constituent material (e.g., photosensitive resin material) of the insulating layers 3122 is stackedly formed on the lower layers 3120A of the hole injection layers 3120 by use of a spin coating process or the like. Then, the resin film is patterned to simultaneously form the row insulating layers 3122X and the column insulating layers 3122Y. The patterning of the row insulating layers 3122X and the column insulating layers 3122Y is carried out by performing exposure utilizing a photomask over the resin film, and performing a development step and a baking step (approximately 230° C., approximately 60 minutes).

Specifically, in the step of forming the insulating layers 3122, first, a photosensitive resin film of an organic photosensitive resin material, for example, an acrylic resin, a polyimide resin, a novolak type phenolic resin or the like is formed, is then dried, the solvent is volatilized to some extent, a photomask provided with predetermined openings is placed thereon, and irradiation with UV rays is conducted from above to expose the photoresist formed of the photosensitive resin or the like, thereby transferring a pattern possessed by the photomask to the photoresist. Next, the photosensitive resin is developed, whereby the insulating layers obtained by patterning of the insulating layer 3122 are formed. Generally, a photoresist called the positive type is used. Of a positive type photoresist, those parts which are exposed are removed by development. Those parts which are not exposed are left without being developed.

Figure 9B:
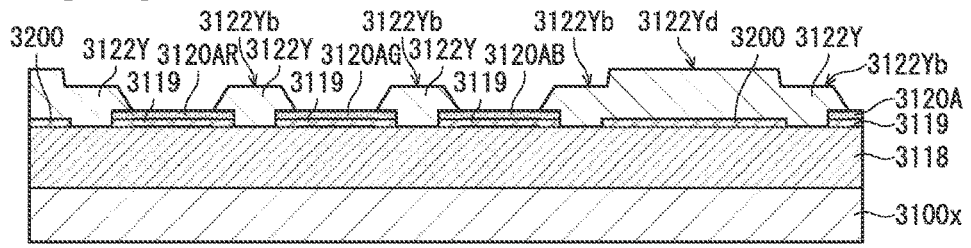

Electrode upper portions 3122Yd are formed over the auxiliary electrode layers 3200, in the column insulating layers 3122Y (FIG. 9B). In forming the electrode upper portions 3122Yd, first, a film of the constituent material (e.g., photosensitive resin material) of the insulating layers 3122 is stackedly formed on the upper surfaces 3122Yb of the column insulating layer 3122Y and the lower layers 3120A of the hole injection layers 3120. Then, the resin film is patterned, to form the bank-shaped electrode upper portions 3122Yd over the auxiliary electrode layers 3200. The patterning of the electrode upper portions 3122Yd is carried out by performing exposure utilizing a photomask over the resin film, and performing a development step and a baking step (approximately 230° C., approximately 60 minutes).

On a production basis, an upper limit film thickness for the banks 3122 is not more than 6,000 nm; with such a setting, variability in film thickness upon production is reduced and control of bottom line width can be performed. In addition, as the film thickness is reduced, it may become necessary for the film thickness to be comparable to the bottom line width, so that a lower limit film thickness is not less than 200 nm; with such a setting, it becomes possible to obtain a desired bottom line width under limitations as to resolution. From the viewpoint of manufacturing process, for example, a film thickness of 200 to 6,000 nm is preferable. In the present embodiment, the film thickness of the banks 3122Yb was approximately 4,000 nm, and the film thickness of the banks 3122X was approximately 500 nm. The conditions for Xb and Y may be the same.

Figure 9C:
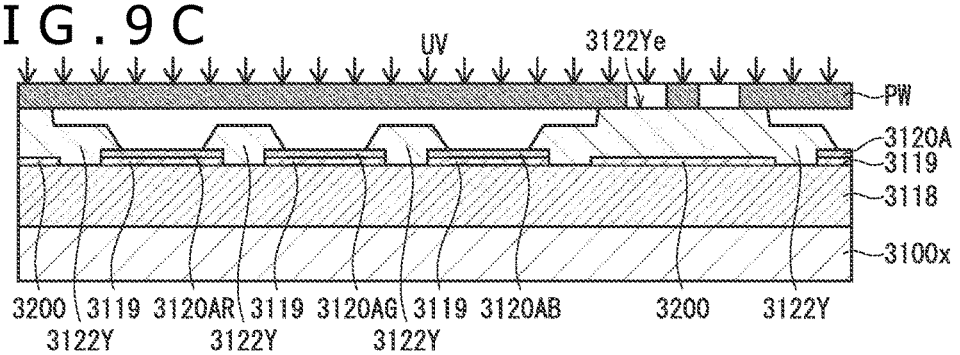

After the electrode upper portions 3122Yd are formed, a photomask formed with predetermined openings is placed on the upper surfaces 3122Ye, and irradiation with UV rays is conducted from above to expose the electrode upper portions 3122Yd, thereby transferring the pattern possessed by the photomask (FIG. 9C). By regulating the exposure dose in forming the through-holes 3122Ya, the inclination angle of inner walls of the through-holes 3122Ya can be controlled.

Figure 9D:
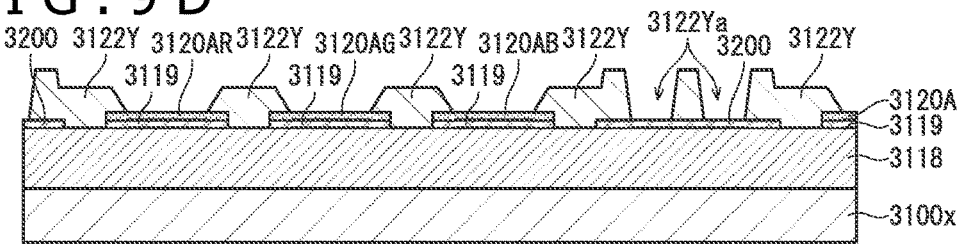

Thereafter, development is performed, whereby the column insulating layers 3122Y with the through-holes 3122Ya patterned in the electrode upper portions 3122Yd are formed (FIG. 9D). At bottom portions of the through-holes 3122Ya, the auxiliary electrode layer 3200 is exposed. The exposed portions of the auxiliary electrode layer 3200 are referred to as hole bottom portions 3200b.

While the through-holes 3122Ya are formed by use of the positive type photoresist in the present embodiment, the through-holes 3122Ya may be formed by use of a negative type photoresist.

Figure 9E:
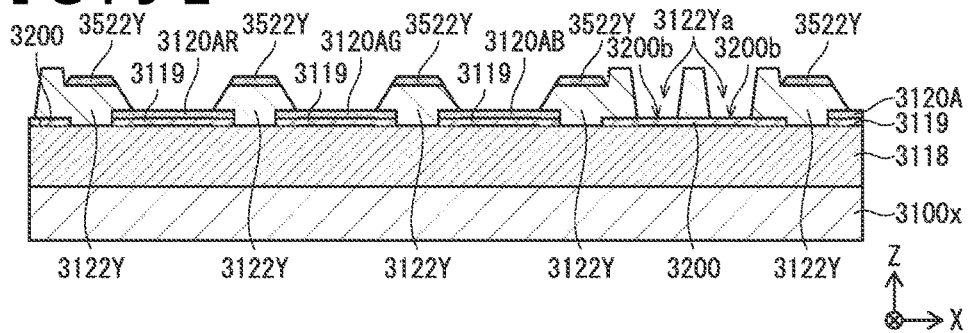

Next, on the upper surfaces 3122Yb of the column insulating layers 3122Y, the bank-shaped column banks 3522Y are formed so as to form the gaps 3522Z (FIG. 9E). In forming the column banks 3522Y, first, a film of the constituent material (e.g., photosensitive resin material) of the column banks 3522Y is formed by use of a spin coating process or the like. Then, the resin film is patterned to open the gaps 3522z, thereby forming the column banks 3522Y. The formation of the gaps 3522z is carried out by performing exposure by disposing a mask over the resin film, followed by development. The column banks 3522Y are provided to extend in the column direction, and provided juxtaposedly through the gaps 3522z therebetween in the row direction.

On a production basis, an upper limit film thickness of the banks 3522Y is desirably not more than 1,500 nm, from the viewpoint of enhancement of productivity through a reduction in cost. In addition, as the film thickness is reduced, it may become necessary for the film thickness to be comparable to the bottom line width, so that a lower limit film thickness is not less than 1 μm; with such a setting, it is possible to obtain a desired bottom line width under limitations as to resolution. Besides, in the case of a process involving application of a solution, uniformity of film thickness under ruggedness of the substrate to be coated is enhanced. For this reason, the steps due to the TFTs should be reduced as much as possible, and, therefore, it is preferable for a lower limit film thickness for the insulating film to be not less than 500 nm. Accordingly, from the viewpoint of manufacturing process, the thickness of the banks 3522Y is preferably 500 to 1,500 nm, for example. In the present embodiment, the thickness was approximately 1,000 nm.

(6) Formation of Organic Functional Layer

Figure 10A:
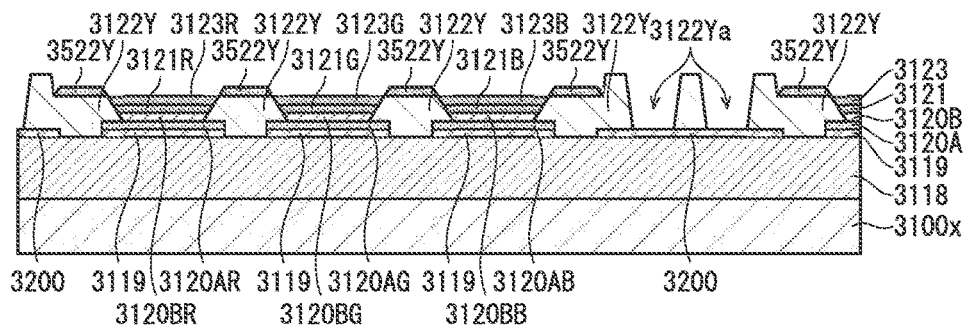
FIGS. 10A, 10B, 10C and 10D are schematic sectional views taken at the same position as A1-A1 of FIG. 3, illustrating a state in each step in the manufacture of the organic EL display panel 10.

The upper layers 3120B of the hole injection layers 3120, the hole transport layers 3121, and the light emitting layers 3123 are sequentially stackedly formed on the lower layers 3120A of the hole injection layers 3120 formed in the gaps 3522z defined by the column banks 3522Y inclusive of the areas over the row insulating layers 3122X (FIG. 10A).

In forming the upper layers 3120B, an ink containing a conductive polymer material such as PEDOT (a mixture of polythiophene and polystyrenesulfonic acid) is applied to the inside of the gaps 3522z defined by the column banks 3522Y by an ink jet process, after which the solvent is removed by volatilization. Alternatively, baking is conducted. Thereafter, patterning may be conducted on a pixel basis by use of a photolithography process and an etching process.

In forming the hole transport layer 3121, an ink containing the constituent material is applied to the inside of the gaps 3522z defined by the column banks 3522Y by use of a wet process such as an ink jet process or a gravure printing process, after which the solvent is removed by volatilization. Alternatively, baking is conducted. The method for applying the ink for forming the hole injection layers 3121 to the inside of the gaps 3522z is the same as the method for the upper layer 3120B described above. Alternatively, the hole transport layers 3121 are formed by depositing a film of a metal (e.g., tungsten) by a sputtering process, followed by baking to oxidize the metal. Thereafter, patterning on a pixel basis may be conducted by use of a photolithography process and an etching process.

Formation of the light emitting layers 3123 is conducted by applying inks containing the constituent materials to the inside of the gaps 3522z defined by the column banks 3522Y by an ink jet process, after which baking is conducted. Specifically, in this step, the inks each containing the material for the organic light emitting layer for one of R, G, and B are applied to fill the gaps 3522z as sub-pixel forming regions by an ink jet process, then the applied inks are dried under a reduced pressure, followed by a baking treatment, to form the light emitting layers 3123R, 3123G, and 3123B. In this instance, in applying the inks for the light emitting layers 3123, first, the solutions for forming the light emitting layers 3123 are applied by a droplet jetting apparatus. After the application of the ink for forming one of the red light emitting layer, the green light emitting layer, and the blue light emitting layer to the substrate 3100x is finished, next an ink of another color is applied to the substrate, then an ink of a third color is applied to the substrate, and these steps are performed repeatedly, whereby the inks of three colors are sequentially applied. In this way, the red light emitting layers, the green light emitting layers, and the blue light emitting layers are formed juxtaposedly and repeatedly, in the horizontal direction on the paper surface of the drawing, on the substrate 3100x.

The method for forming the upper layers 3120B of the hole injection layers 3120, the hole transport layers 3121, and the light emitting layers 3123 is not limited to the above-mentioned, and other known methods than the ink jet method and the gravure printing method may be used to drop or apply the inks, such as a dispenser method, a nozzle coating method, a spin coating method, an intaglio printing method, or a relief printing method.

(7) Formation of Electron Transport Layer 3124

Figure 10B:
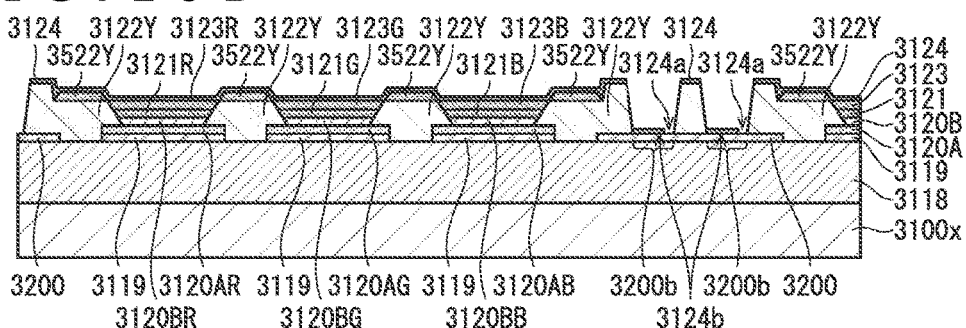

After the light emitting layers 3123 are formed, the electron transport layer 3124 is formed over the whole surface of the display panel 10 by a vacuum deposition process or the like (FIG. 10B). The electron transport layer 3124 is formed also on the electrode upper portions 3122Ye of the column insulating layers 3122Y and on the auxiliary electrode layers 3200 in the through-holes 3122Ya in the column insulating layers 3122Y. In this instance, a part located in the vicinity of the inner wall 3122c of the through-hole 3122Ya is lacking (undergoes stepping), whereby a lacking part 3124a is generated at which the electron transport layer 3124 is not formed. Through the lacking part 3124a, a part of the hole bottom portion 3200b of the auxiliary electrode layer 3200 is exposed. That part of the auxiliary electrode layer 3200 which is exposed through the lacking part 3124a is referred to as the contact surface 3200c.

If the film thickness of the electron transport layer 3124 is excessively small, electrons are directly migrated from the common electrode layer 3125 to the light emitting layer 3123, so that the function of restricting the injection of electrons into the light emitting layer 3123 cannot be realized. Therefore, the film thickness of the electron transport layer 3124 is preferably not less than 10 nm. On the other hand, thickening of the electron transport layer 3124 lowers the transmittance of the electron transport layer 3124, and hinders the generation of the stepping. For preventing the light transmitted through the electron transport layer 3124 from being attenuated excessively and for intentionally generating the stepping over the auxiliary electrode layer 3200 in the through-hole 3122Ya in the auxiliary electrode layer 3200, the film thickness of the electron transport layer 3124 is preferably not more than 40 nm.

The reason why the lacking parts 3124a are generated will be described later.

(8) Formation of Common Electrode Layer 3125

Figure 10C:
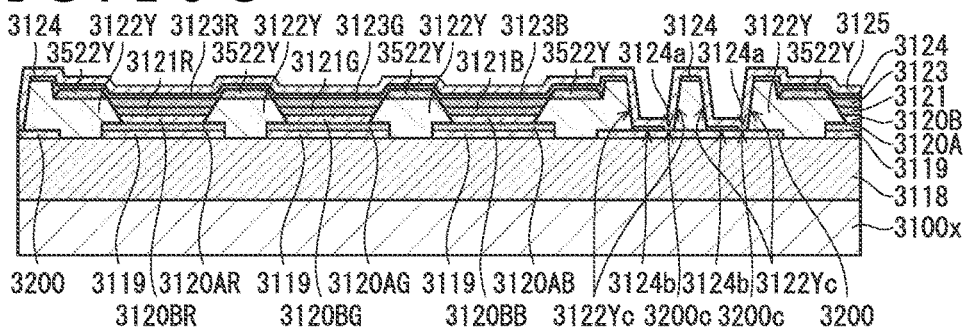

After the electron transport layer 3124 is formed, the common electrode layer 3125 is formed so as to cover the electron transport layer 3124 by a CVD process, a sputtering process or the like (FIG. 10C). The common electrode layer 3125 is formed also on the inner walls 3122Yc of the through-holes 3122Ya in the column insulating layers 3122Y and on the electron transport layer 3124 and on the auxiliary electrode layers 3200. In this instance, the common electrode layer 3125 is formed in such a manner that the common electrode layer 3125 comes around into the lacking parts 3124a of the electron transport layer 3124, to make direct contact with the inner walls of the contact surfaces 3200c of the auxiliary electrode layers 3200 that are exposed at the lacking parts of the electron transport layer 3124.

If the common electrode layer 3125 is excessively thin, it may cause generation of stepping; therefore, the common electrode layer 3125 is preferably formed in a film thickness of not less than 25 nm. On the other hand, thickening of the common electrode layer 3125 lowers the transmittance of the common electrode layer 3125; therefore, the common electrode layer 3125 is preferably formed in a film thickness of not more than 250 nm.

Here, the method of forming the common electrode layer 3125 will be described further.

First, referring to FIG. 11, general configuration of a sputtering system 600 will be described. The sputtering system 600 includes a substrate transfer chamber 610, a film forming chamber 620, and a load lock chamber 630, and sputtering is conducted in the film forming chamber 620 by a magnetron sputtering process. A sputtering gas is introduced into the film forming chamber 620. As the sputtering gas, an inert gas such as Ar (argon) is used. In the present embodiment, Ar is used.

On a carrier 621 in the sputtering system 600, a substrate 622 on which to form a film is disposed. In the substrate transfer chamber 610, the substrate 622 is mounted to the carrier 621 by a substrate pushing-up mechanism 611. The carrier 621 with the substrate 622 mounted thereto is moved from the substrate transfer chamber 610 to the load lock chamber 630 through the film forming chamber 620 rectilinearly at a constant speed on a carrying passage 601. In the present embodiment, the moving speed of the carrier 621 is 30 mm/second. Note that the substrate 622 is not heated, and the sputtering is conducted at normal temperature.

In the film forming chamber 620, a rod-shaped target 623 extending in a direction orthogonal to the carrying passage 601 is disposed. In the present embodiment, the target 623 is ITO. Note that the target 623 may not necessarily be rod-shaped, and may be, for example, in a powdery form.

A power supply 624 impresses a voltage on the target 623. Note that while the power supply 624 in FIG. 11 is an alternate current (AC) power supply, it may be a direct current (DC) power supply or a DC/AC hybrid power supply.

The inside of the sputtering system 600 is evacuated by an evacuation system 631, and the sputtering gas is introduced into the film forming chamber 620 by a gas supply system 632. When a voltage is impressed on the target 623 by the power supply 624, a plasma of the sputtering gas is generated, and the surface of the target 623 is sputtered. Then, the sputtered atoms of the target 623 are deposited on the substrate 622, whereby a film is formed.

Note that the gas pressure of Ar as the sputtering gas is, for example, 0.6 Pa, and its flow rate is 100 sccm.

(9) Formation of Sealing Layer 3126

Figure 10D:
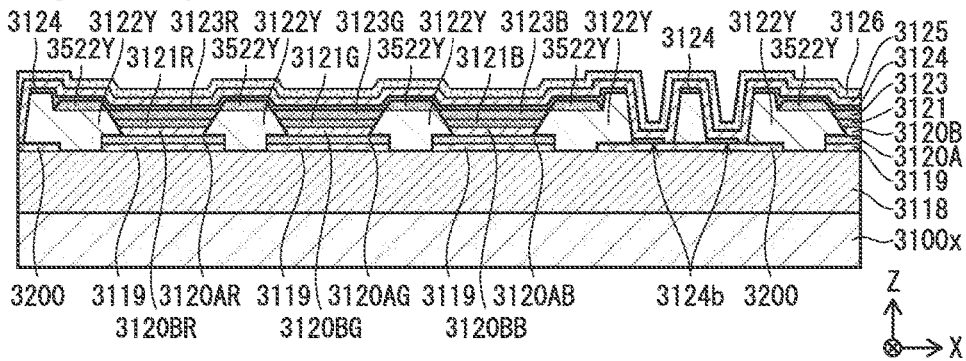

After the common electrode layer 3125 is formed, the sealing layer 3126 is formed so as to cover the common electrode layer 3125 (FIG. 10D). The sealing layer 3126 can be formed by a CVD process, a sputtering process or the like.

(10) Formation of CF Substrate 3131

Next, a step of producing the CF substrate 3131 will be exemplified.

Figure 12A:
FIGS. 12A, 12B, 12C, 12D, 12E, 12F and 12G are schematic sectional views taken at the same position as A1-A1 of FIG. 3, illustrating a state in each step in the manufacture of the organic EL display panel 10.

The transparent upper substrate 3130 is prepared, and a material for the light-shielding layer 3129, which contains a UV-curing resin (e.g., UV-curing acrylic resin) material as a main constituent with a black pigment added thereto, is applied to a surface on one side of the transparent upper substrate 3130 (FIG. 12A).

Figure 12B:
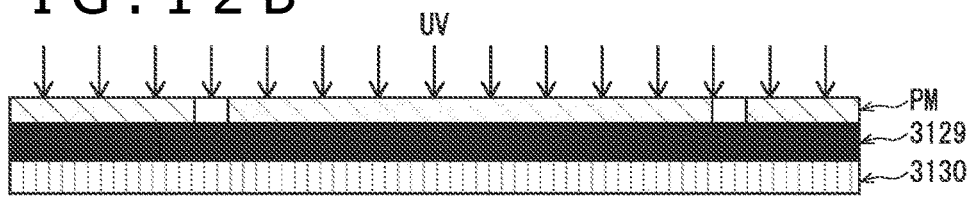

A pattern mask PM provided with predetermined openings is placed on the upper surface of the applied light-shielding layer 3129, and irradiation with UV rays is conducted from above (FIG. 12B).

Figure 12C:
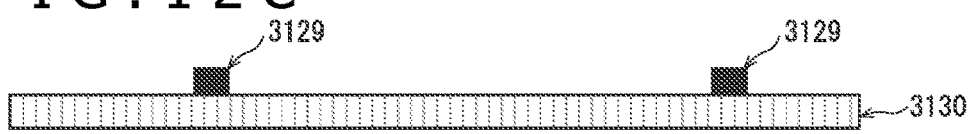

Thereafter, development is conducted by removing the pattern mask PM and uncured portions of the light-shielding layer 3129, and curing is performed, whereon the light-shielding layers 3129 in a rectangular sectional shape are completed (FIG. 12C).

Figure 12D:
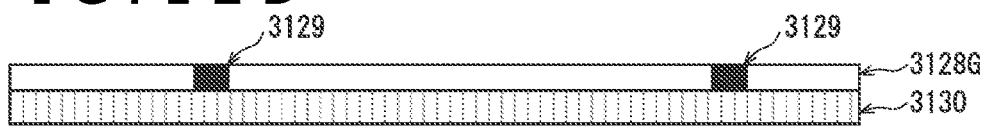
Figure 12E:
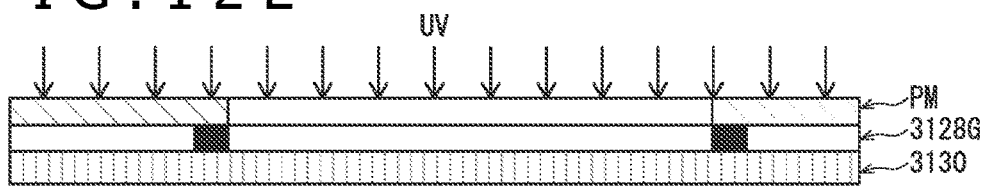

Next, a material 3128G for a color filter layer 3128 (e.g., 3128(G)), which contains a UV-curing resin component as a main constituent, is applied to the surface of the upper substrate 3130 formed with the light-shielding layer 3129 (FIG. 12D), a predetermined pattern mask PM is placed thereon, and irradiation with UV rays is conducted (FIG. 12E).

Figure 12F:
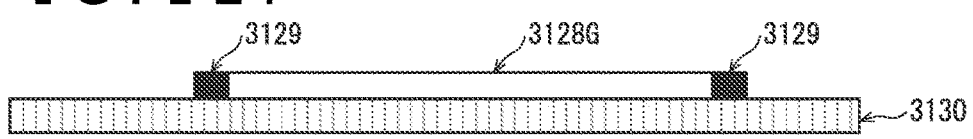

Thereafter, curing is performed, and development is conducted by removing the pattern mask PM and uncured portions of the paste 3128R, whereon color filter layers 3128(G) are formed (FIG. 12F).

Figure 12G:
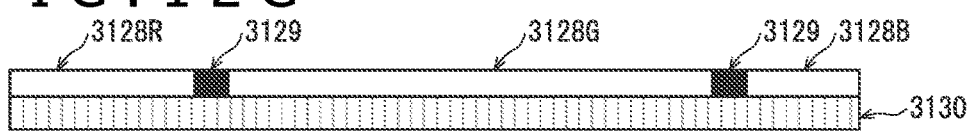

The steps of FIGS. 12D, 12E, and 12F are similarly repeated for each of color filter materials, whereby color filter layers 3128(R) and 3128(B) are formed (FIG. 12G). Note that commercially available color filter products may be utilized, instead of using the pastes 3128G, 3128R, and 3128B.

In this way, the CF substrate 3131 is formed.

(11) Lamination of CF Substrate 3131 and Back Panel

Figure 13A:
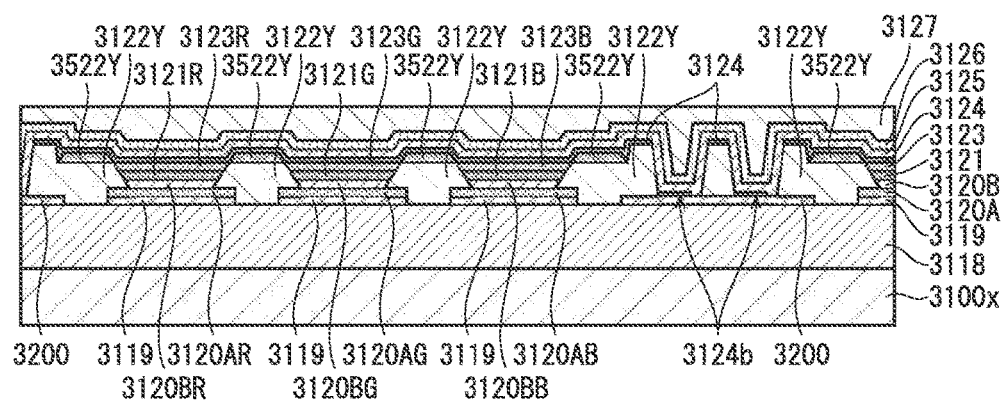
FIGS. 13A and 13B are schematic sectional views taken at the same position as A1-A1 of FIG. 3, illustrating a state in each step in the manufacture of the organic EL display panel 10.

Next, a material for the bonding layer 3127, which contains a UV-curing resin such as acrylic resin, silicone resin, and epoxy resin as a main constituent, is applied to the back panel including the layers ranging from the substrate 3100x to the sealing layer 3126 (FIG. 13A).

Figure 13B:
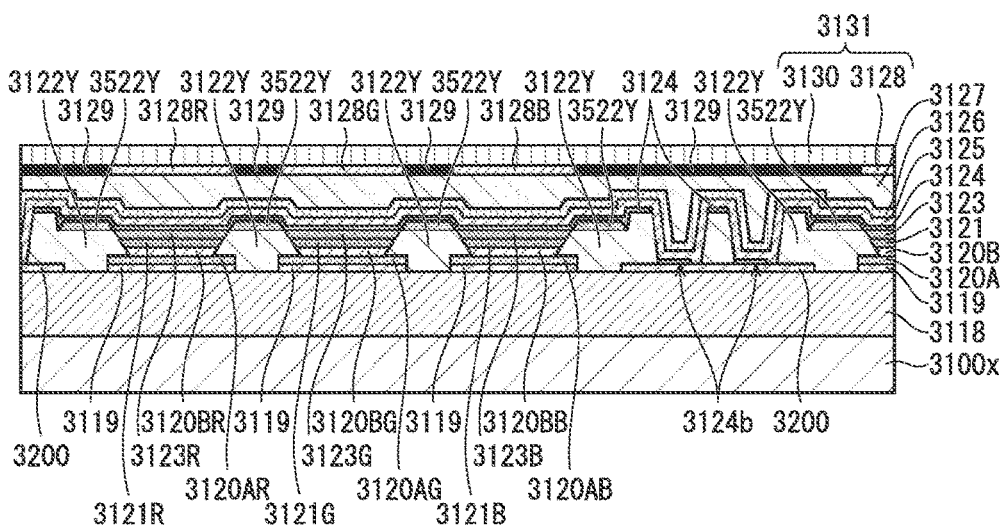

Subsequently, the applied material is irradiated with UV rays, to laminate the back panel and the CF substrate 3131 in the state in which they are relatively positioned (aligned). In this instance, care should be taken to prevent gas from entering between both substrates. Thereafter, both the substrates are baked to complete the sealing step, whereon the display panel 10 is completed (FIG. 13B).

1.6 Configuration in Which Auxiliary Electrode Layer 3200 and Common Electrode Layer 3125 are Brought Into Direct Contact With Each Other (1) Generation of Stepping in Vacuum Deposition As has been described above, in the display panel 10, when the electrode transport layers 3124 are formed by a vacuum deposition process or the like, a part located in the vicinity of the inner wall 3122c of each through-hole 3122Ya made to be lacking (to undergo stepping), whereby the lacking part 3124a where the electron transport layer 3124 is not formed is generated. Due to the presence of the lacking part 3124a, a part of each hole bottom portion 3200b of the auxiliary electrode layer 3200 is exposed. The reason why the lacking parts 3124a are generated when the electron transport layer 3124 is formed will be described below.

Figure 14:
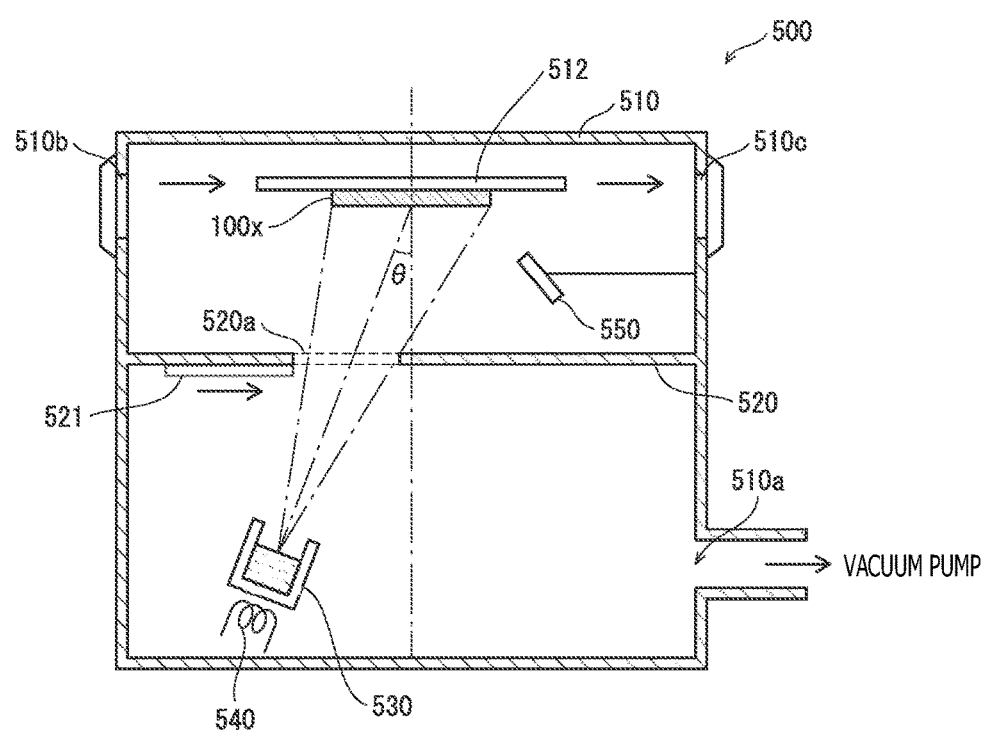
FIG. 14 is a schematic drawing depicting a vapor deposition system 500 used for forming an electrode transport layer 3124.

FIG. 14 is a schematic diagram depicting a vapor deposition system 500 used for forming the electron transport layer 3124. As illustrated in FIG. 14, the vapor deposition system 500 includes a chamber 510. A vacuum pump (not illustrated) is connected to a chamber exhaust port 510a of the chamber 510 so that a vacuum can be maintained inside the chamber 510. The inside space of the chamber 510 is partitioned to upper and lower portions by a partition plate 520, and the substrate 3100x is carried over the partition plate 520. At side walls of the chamber 510, there are provided a carrying-in port 510b through which the substrate 3100x is carried into the chamber 510, and a carrying-out port 510c through which the substrate 3100x is carried out of the chamber 510. The substrate 3100x is intermittently carried into the chamber 510 through the carrying-in port 510b by carrying means 512, then is passed over the partition plate 520, and is carried out through the carrying-out port 510c.

Under the partition plate 520 in the chamber 510, a vapor source 530 for spouting a substance to be vapor deposited is disposed. The vapor source 530 is provided with a heater 540, and the substance to be vapor deposited which is spouted from the vapor source 530 by heating is, for example, a substance for forming a functional layer of the organic EL element, and is an organic substance, an inorganic substance, or a metal. The organic substance is, for example, a material for forming a functional layer of the organic EL element, and examples thereof include oxadiazole derivatives (OXD), triazole derivatives (TAZ), and phenanthroline derivatives (BCP, Bphen). Examples of the inorganic substance include dopant metals selected from among alkali metals and alkaline earth metals. In addition, examples of the material for forming an anode include metallic materials such as Al, Ba, Ni, Li, Mg, Au, and Ag, and metallic oxide materials such as $MgF_2$, $SiO_2$, and $Cr_2O_3$.

The partition plate 520 is provided with a window 520a through which the substance to be deposited released from the vapor source 530 passes, and the window 520a can be opened and closed with a shutter 521. In such a vapor deposition system 500, while the substance to be deposited is spouted from the vapor source 530, with the shutter 521 open, the substrate 3100x is carried, whereby the substance to be deposited which is spouted from the vapor source 530 passes through the window 520a, to be deposited on the lower surface of the substrate 3100x. In this instance, the positional relation between the vapor source 530 and the window 520a is such that a straight line extending from the center of the vapor source 530 to pass through the center of the window 520a is kept inclined at an angle θ against the normal to the substrate 3100x. As a result, the substance to be deposited is deposited on the substrate 3100x at an average incidence angle of θ, throughout the vapor deposition time.

In the inside of the chamber 510, there is disposed a sensor 550 for measuring the quantity of the substance to be deposited which is supplied from the vapor source 530 toward the substrate 3100x per unit time (evaporation rate). The velocity at which to carry the substrate 3100x and the like factors are set with reference to the evaporation rate of the substance to be deposited which is measured by the sensor 550. Note that in the case of pattern vapor deposition of the substance to be deposited on the substrate 3100x, the vapor deposition is conducted by providing on the lower side of the substrate 3100x a mask formed with a pattern.

Figures 15A, 15B:
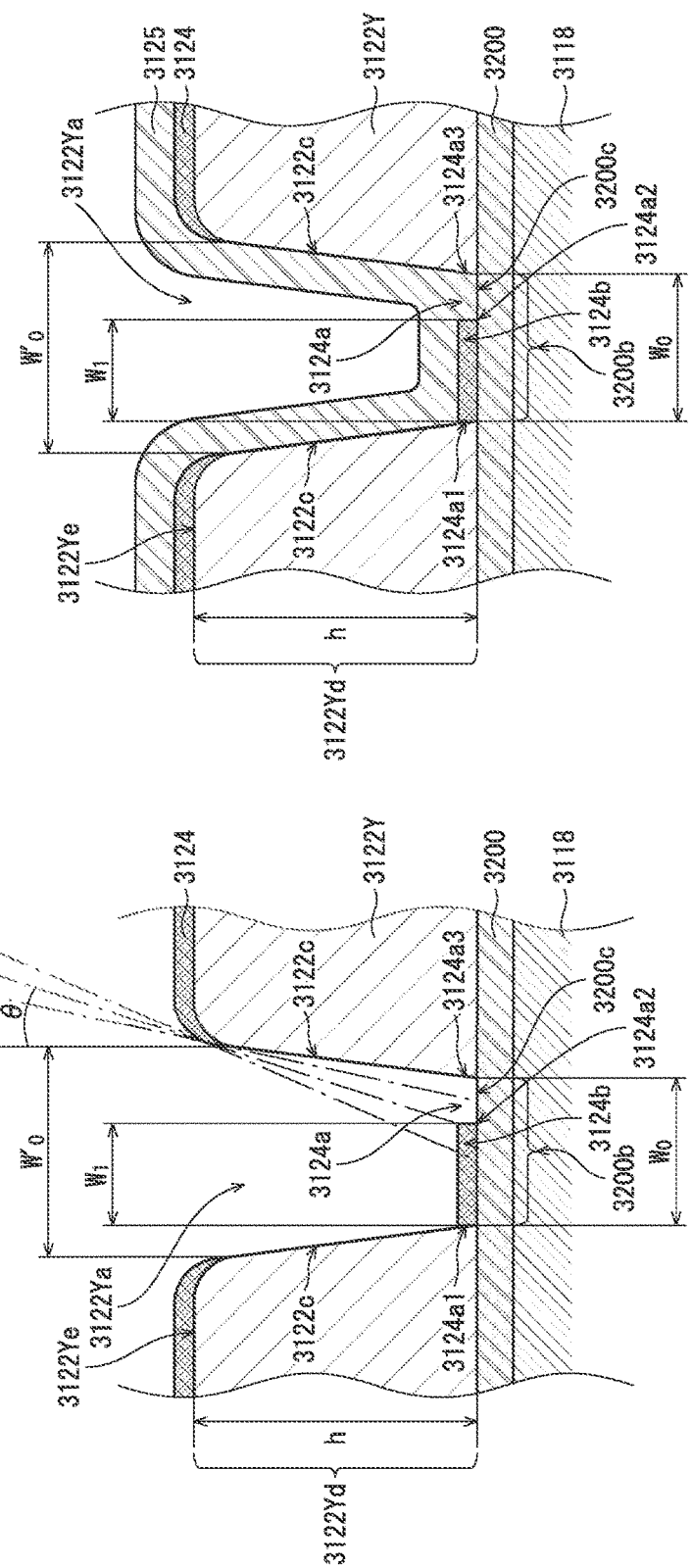
FIG. 15A is an enlarged view of the vicinity of an auxiliary electrode layer 3200 depicted in FIG. 4 after formation of the electron transport layer 3124.
FIG. 15B is an enlarged view of the vicinity of the auxiliary electrode layer 3200 depicted in FIG. 4 after formation of the common electrode layer 3125.

FIG. 15A is an enlarged view of the vicinity of the auxiliary electrode layer 3200 depicted in FIG. 5 after the formation of the electron transport layer 3124. In the step of forming the electron transport layer 3124 by use of the vapor deposition system 500, as depicted in FIG. 15A, vapor deposition is conducted using the vapor source 530 the center of which is disposed at a position inclined by an angle θ from the normal to the substrate 3100x. In a vacuum deposition process in which vapor deposition is conducted in a high-vacuum-degree atmosphere, the substance to be deposited travels straight through the atmosphere. In the vapor deposition system 500, the substance to be deposited is supplied from the vapor source 530 inclined by the angle θ relative to the substrate 3100x, to be deposited on the substrate 3100x.

In the display panel 10, as aforementioned, the upper surface 3122Ye of the electrode upper portion 3122Yd located over the auxiliary electrode layer 3200 in the column insulating layer 3122Y is formed with the through-hole 3122Ya. The opening width w0' of the through-hole 3122Ya is substantially equal to the width w0 of the through-hole 3122Ya at the bottom surface of the insulating layer 3122Y, and w0'>w0. In the present embodiment, the through-hole 3122Ya is so formed that the thickness h is 4,000 nm and the width w0 is 10,000 nm, with h/w0 being 0.4.

For this reason, of the hole bottom portion 3200b of the auxiliary electrode layer 3200 located at the bottom surface of the through-hole 3122Ya, a part located in the vicinity of the inner wall 3122c of the through-hole 3122Ya is included in a region shaded from the vapor source 530. As a result, at this part, so-called vignetting (shading) where the substance to be deposited does not reach is generated, so that the lacking part 3124a due to the stepping, or no deposition of the substance to be deposited, is generated.

Specifically, as depicted in FIG. 15A, the electron transport layer 3124 is lacking at the part located in the vicinity of the inner wall 3122c of the through-hole 3122Ya, so that the lacking part 3124a where the electron transport layer 3124 is not formed is formed between end portions 3124a2 and 3124a3. At the lacking part 3124a, the contact surface 3200c of the auxiliary electrode layer 3200 is exposed.

In addition, the electron transport layer 3124b is formed at a part (presence part) exclusive of the lower side of the lacking part 3124a in the hole bottom portion 3200b over the auxiliary electrode layer 3200 located at the bottom surface of the through-hole 3122Ya. This part is located between end portions 3124a1 and 3124a2.

Thus, the electron transport layer 3124 is formed by a film forming process (e.g., vacuum deposition process) comparatively poor in step coverage so that stepping occurs, and the contact surface 3200 is exposed, in the hole bottom portion 3200b over the auxiliary electrode layer 3200 located at the bottom surface of the through-hole 3122Ya.

(2) Generation of Coming-Around in Sputtering Process or CVD Process

When the common electrode layer 3125 is formed by a CVD process, a sputtering process or the like, the common electrode layer 3125 comes around into the lacking part 3124a of the electron transport layer 3124, to make direct contact with the contact surface 3200c of the auxiliary electrode layer 3200 that is exposed through the lacking part of the electron transport layer 3124. Formation of the common electrode layer 3125 will be described below.

FIG. 15B is an enlarged view of the vicinity of the auxiliary electrode layer 3200 depicted in FIG. 4 after the formation of the common electrode layer 3125. The common electrode layer 3125 is formed by a film forming process (e.g., sputtering process or CVD process) excellent in step coverage, whereby the common electrode layer 3125 is formed to come around into the lacking part 3124a (between the end portions 3124a2 and 3124a3) of the electron transport layer 3124. As a result, as depicted in FIG. 15B, the common electrode layer 3125 is formed in such a manner as to make direct contact with the contact surface 3200c of the auxiliary electrode layer 3200 exposed at the lacking part 3124a (between the end portions 3124a2 and 3124a3) of the electron transport layer 3124 over the auxiliary electrode layer 3200 inside the through-hole 3122Ya in the column insulating layer 3122Y.

In this instance, the ratio of the width w1 of the lacking part 3124a (between the end portions 3124a2 and 3124a3) constituting the contact surface 3200c to the opening width w0 of the through-hole 3122Ya should be not less than the ratio in resistivity between the electron transport layer 3124 and the common electrode layer 3125.

Therefore, the width w1 of the lacking part 3124a should satisfy the following expression.

$$W_1 > \frac{R_0}{R_1} \cdot w\theta$$

Further, let the angle of incidence on the substrate from the center of the vapor source 630 in the step of forming the electron transport layer 3124 be θ, then the opening width w0 should satisfy the following expression.

$$W_0 < \frac{R_1}{R_0} \cdot h \cdot \tan \theta$$

The reason is as follows. In the present embodiment, if the incidence angle θ on the substrate from the center of the vapor source 630 is less than 75 degrees, cutting of the electron transport layer 3124 would not be generated, and it would be difficult to secure electrical contact with the common electrode layer 3125. If the incidence angle θ exceeds 85 degrees, on the other hand, the vapor deposition rate of the electron transport layer 3124 would be lowered, and it would be difficult to secure a film thickness of the electron transport layer 3124 on the upper surface of the insulating layer 3122Y.

In this instance, the thickness h of the insulating layer 3122Y is in the range of 1,000 to 6,000 nm, preferably 2,000 to 5,000 nm. In addition, the opening width w0 at the bottom surface of the through-hole 3122Ya is in the range of 2 to 10 μm, though not limited.

Therefore, the ratio of the thickness h of the insulating layer 3122Y to the opening width w0 of the through-hole 3122Ya in the insulating layer 3122Y is preferably in the range of 0.1 to 0.8, more preferably of 0.13 to 0.3.

Such a shape ensures that the electron transport layer 3124 formed on the auxiliary electrode layer 3200 breaks off (undergoes cutting) at a part of the hole bottom portion 3200b inside the through-hole 3122Ya, whereby the lacking part 3124a is formed. More in detail, of the electron transport layer 3124, the end portions 3124a1 and 3421a2 (or the end portions 3124a3 and 3124a4) are spaced apart from each other so that the contact surface 3200c of the auxiliary electrode layer 3200 is exposed. The common electrode layer 3125 is formed in contact with the contact surface 3200c of the auxiliary electrode layer 3200 in the manner of coming around into the lacking part 3124a between the end portions 3124a1 and 3124a2 (or between the end portions 3124a3 and 3124a4) of the electron transport layer 3124.

As a result, the auxiliary electrode layer 3200 makes direct contact with the common electrode layer 3125 at the contact surface 3200c, so that electric resistance in connection between the auxiliary electrode layer 3200 and the common electrode layer 3125 can be lowered. As a result, the voltage drop at the joint portion between the auxiliary electrode layer 3200 and the common electrode layer 3125 is suppressed, whereby light emission efficiency is enhanced, a lowering in luminance at a central portion of the screen is suppressed, and variability in luminance can be reduced.

1.7 In Regard of Effect of Display Panel 10

The effects produced by the display panel 10 will be described below.

The display panel 10 according to the present embodiment is an organic EL display panel having a plurality of pixel electrodes 3119 arranged in a matrix pattern on the substrate 3100x and having the light emitting layer, containing an organic light emitting material, disposed on each of the pixel electrodes 3119. The display panel 10 includes the current feeding auxiliary electrode layers 3200 provided in the state of being not in contact with the pixel electrodes 3119 adjacent to the electrode forming region that extends in the column direction over at least one of the gaps between the pixel electrodes 3119 adjacent in the row direction on the substrate 3100x, the insulating layers 3122Y that are provided at least on the current feeding auxiliary electrode layers 3200 and extend in the column direction, the functional layers 3124 provided ranging over the light emitting layers 3123 and over the insulating layers 3122Y, and the common electrode layer 3125 provided in the state of extending continuously on the functional layers 3124. The functional layers 3124 have parts 3125a lacking, the parts 3125a located in the vicinity of the inner walls 3122Yc of the through-holes 3122Ya over the current feeding auxiliary electrode layers 3200 inside the through-holes 3122Ya, and the common electrode 3125 is in direct contact with the current feeding auxiliary electrode layers 3200c exposed due to the lacking 3125a of the functional layers 3124.

According to such a configuration, the electron transport layer 3124 formed on the auxiliary electrode layer 3200 breaks off (undergoes cutting) at a part of the hole bottom portion 3200b inside each through-hole 3122Ya to form the lacking part 3124a, and the common electrode layer 3125 is formed in contact with the contact surface 3200c of the auxiliary electrode layer 3200 in the manner of coming around into each lacking part 3124a of the electron transport layer 3124.

Therefore, the auxiliary electrode layer 3200 makes direct contact with the common electrode 3125 at the contact surface 3200c, so that electric resistance in connection between the auxiliary electrode layer 3200 and the common electrode layer 3125 can be lowered. As a result, the voltage drop at the joint portion between the auxiliary electrode layer 3200 and the common electrode layer 3125 is suppressed, whereby light emission efficiency is enhanced, a lowering in luminance at a central portion of the screen is suppressed, and variability in luminance can be reduced.

Thus, it is possible to provide an organic EL display panel which can be manufactured by a simple manufacturing process, and in which it is possible to reduce the electric resistance in electrical connection between a common electrode layer and a current feeding auxiliary electrode layer, to enhance light emission efficiency and to restrain variability in luminance.

Besides, in another mode, in any of the above configurations, the ratio of the thickness h of the insulating layer 3122Y to the opening width w0 of the through-hole 3122Ya may be in the range of 0.1 to 0.8.

According to such a configuration, it is possible, by a simple manufacturing process not involving a special step, to cause the functional layer 3124 to undergo stepping in the hole bottom portion 3200b over the auxiliary electrode layer 3200 located at the bottom surface of each through-hole 3122Ya in the insulating layer 3122Y to form the lacking part 3125a, and thereby to realize a structure in which the contact surface 3200c of the current feeding auxiliary electrode layer 3200 is exposed through the lacking part 3125a.

In addition, in another mode, in any of the above configurations, a configuration may be adopted wherein the functional layer 3124 is present at other parts than one part inside the through-hole 3122Ya, on the upper surface 3122Yb of the insulating layer 3122Y and on the current feeding auxiliary electrode layer 3200, and is lacking at the part located on the inner wall 3122Yc of the through-hole 3122Ya.

The method of manufacturing the organic EL display panel 10 according to the present embodiment includes the steps of preparing the substrate 3100x, arranging a plurality of pixel electrodes 3119 in a matrix pattern over the substrate 3100x, securing the electrode forming region that extends in the column direction over at least one of gaps between the pixel electrodes 3119 in the row direction over the substrate 3100x, and forming by a vapor deposition process the current feeding auxiliary electrode layer 3200 in the state of being not in contact with the pixel electrodes 3119 adjacent to the electrode forming region, forming the insulating layer 3122Y extending in the column direction at least over the current feeding auxiliary electrode layer 3200, forming the light emitting layer 3123 containing an organic light emitting material over each pixel electrode 3119, opening a plurality of through-holes 3122Ya in the insulating layer 3122Y, forming by a vapor deposition process the functional layer 3124 ranging over the light emitting layer 3123 and over the insulating layer 3122Y, and forming by a sputtering process or a CVD process the common electrode layer 3125 extending continuously over the functional layer 3124.

According to such a configuration, the electron transport layer 3124 formed on the auxiliary electrode layer 3200 breaks off (undergoes cutting), to form the lacking part 3124a, at a part of the hole bottom portion 3200b inside each through-hole 3122Ya, and the common electrode layer 3125 is formed in contact with the contact surface 3200c of the auxiliary electrode layer 3200 in the manner of coming around into the lacking part 3124a. As a result, it is possible, by use of a simple manufacturing process, to manufacture an organic EL display panel in which the electric resistance in electrical connection between the common electrode and the current feeding auxiliary electrode layer is lowered, light emission efficiency is enhanced, and variability in luminance is restrained.

Besides, in another mode, in any of the above configurations, let the thickness of the insulating layer 3122Y be h, let the resistivity of the functional layer 3124 be R1, let the resistivity of the common electrode 3125 be R0, let the average angle of incidence on the substrate 3100x from the vapor source 630 in the step of forming the functional layer 3124 be θ, then the opening width w of the through-hole 3122Ya may be defined by the following expression.

$$w_0 < \frac{R_1}{R_0} \cdot h \cdot \tan \theta$$

According to the shape defined by the above expression, the electron transport layer 3124 formed on the auxiliary electrode layer 3200 breaks off (undergoes cutting), to form the lacking part 3124a, at a part of the hole bottom portion 3200b inside each through-hole 3122Ya, and the common electrode layer 3125 is formed in contact with the contact surface 3200c of the auxiliary electrode layer 3200 in the manner of coming around into the lacking part 3124a of the electron transport layer 3124.

As has been described above, the organic EL display panel according to Embodiment 1 can be manufactured by a simple manufacturing process, and in the organic EL display panel, the electric resistance in electrical connection between the common electrode layer and the current feeding auxiliary electrode layer can be lowered, light emission efficiency can be enhanced, and variability in luminance can be restrained.

1.8 Modifications (1) Modification 1

In the display panel 10, the electron transport layer 3124 is lacking, to form the lacking part 3124a where the electron transport layer 3124 is not formed, at a part located in the vicinity of the inner wall 3122c in each through-hole 3122Ya in the column insulating layer 3122Y, over the auxiliary electrode layer 3200 inside the through-hole 3122Ya, and the common electrode layer 3125 is formed in direct contact with the contact surface 3200c exposed at the lacking part 3124a of the electron transport layer 3124.

However, the electron transport layer 3124 is not restricted to the above-described, and may be modified as required.

In an organic EL display panel according to Modification 2, the electron transport layer 3124 may be formed with a thinned part (not illustrated) where a part of the electron transport layer 3124 is not lacking but is thinned to or below 1 nm, at a part located in the vicinity of the inner wall 3122c of each through-hole 3122Ya in the column insulating layer 3122Y, over the auxiliary electrode layer 3200 inside the through-hole 3122Ya.

According to such a configuration, although the part of the electron transport layer 3124 is not lacking, a structure can be realized wherein the common electrode layer 3125 is electrically connected to the auxiliary electrode layer 3200 at a lower electric resistance at the thinned part of the electron transport layer 3124 over the auxiliary electrode layer 3200 inside each through-hole 3122Ya in the column insulating layer 3122Y than at other parts of the electron transport layer 3124. As a result, the electric resistance in electrical connection between the common electrode layer 3125 and the auxiliary electrode layer 3200 can be lowered, light emission efficiency can be enhanced, and variability in luminance can be restrained.

(2) Modification 2

While the display panel 10 according to Embodiment 1 has been described above, the present disclosure is not limited to the above embodiment, except for essential and characteristic constituent elements thereof. For instance, modes obtained by subjecting the embodiments to various modifications conceived by those skilled in the art and modes realized by arbitrary combinations of the constituent elements and functions in each of the embodiments without departing from the gist of the present disclosure are also embraced in the present disclosure. As an example of such modes, a modification of the display panel 10 will be described below. In the display panel 10, as depicted in FIG. 4, the row insulating layers 3122X are provided in the state of being along the row direction orthogonal to the column direction, in such a manner as to intersect the column insulating layers 3122Y in a grid-like pattern, and each have an upper surface 3122Xb at the same height position as the upper surface 3122Yb of the column insulating layer 3122Y. Further, a plurality of column banks 3522Y are juxtaposedly provided on the upper surfaces 3122Yb of the column insulating layers 3122Y in the state of overlapping with the column insulating layers 3122Y, and outer edges of the self-luminescence region of each pixel in the row direction are defined by the column banks 3522Y.

However, the shapes of the row insulating layers 3122X and the column insulating layers 3122Y are not limited to the above-mentioned, and may be modified as required.

Figure 16:
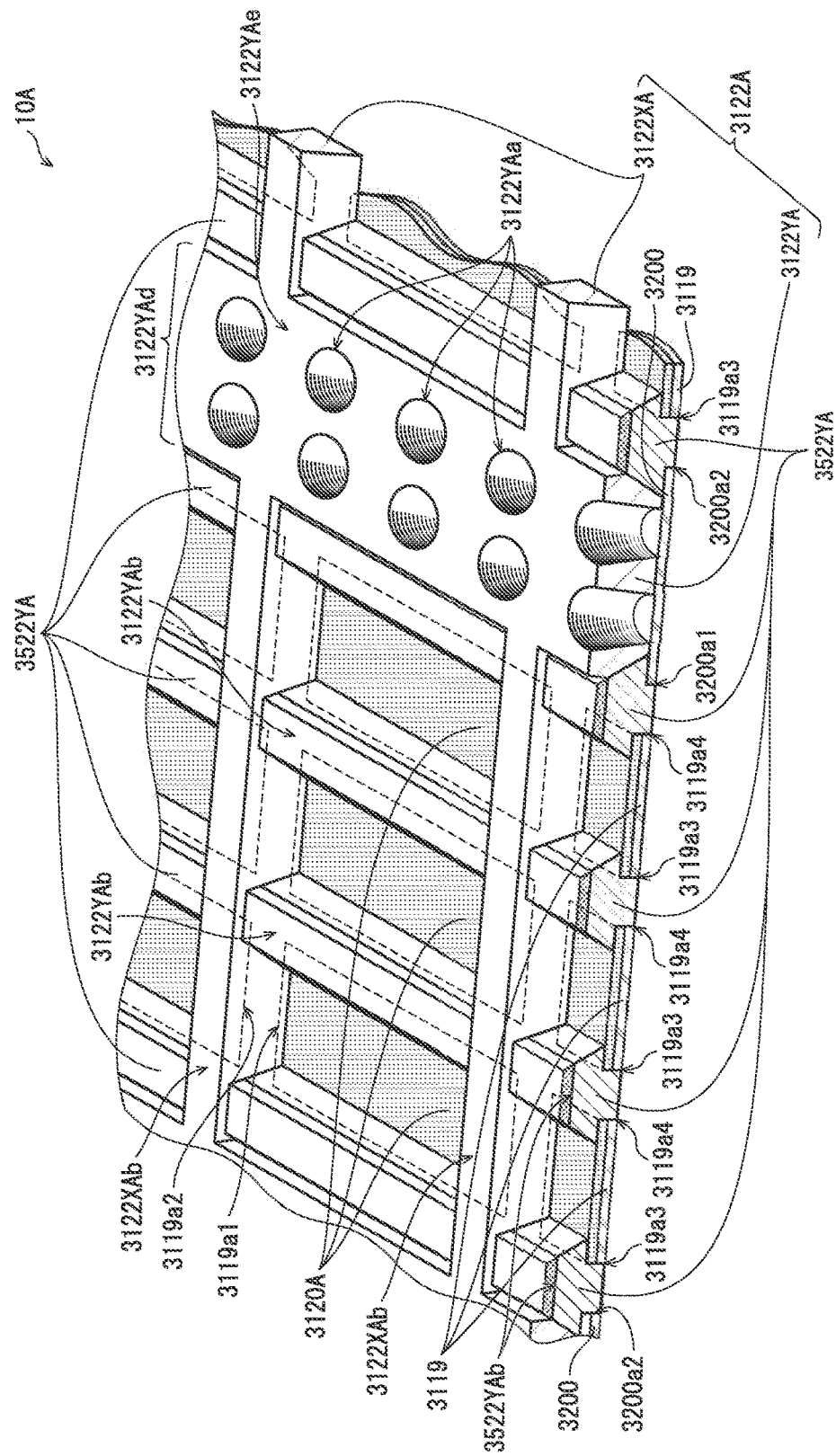
FIG. 16 is a perspective view, from an oblique upper side, of a part of the insulating layer 3122 that corresponds to a pixel 3100*e* of an organic EL display panel 10A according to a modification 1.

FIG. 16 is a perspective view, from an oblique upper side, of a part of insulating layers 3122A corresponding to a unit pixel 3100e of an organic EL display panel 10A according to Modification 2. As illustrated in FIG. 16, in the organic EL display panel 10A, a plurality of column banks 3522YA each extending in the column direction (Y-direction in FIG. 16) are juxtaposedly provided over row-direction outer edges, and between the outer edges, of the two pixel electrodes 3119 adjacent in the row direction, over the row-direction outer edges of the pixel electrodes 3119 adjacent in the row direction and outer edges of the auxiliary electrode layers 3200, and over those regions on the substrate 3100x which are located between them. In addition, a plurality of row insulating layers 3122XA each extending in the row direction (X-direction in FIG. 16) are juxtaposedly provided over column-direction outer edges of the two pixel electrodes adjacent in the column direction and over those regions on the substrate 3100x which are located between the outer edges. Further, the upper surfaces 3122XAb of the row insulating layers 3122XA are at the same height as the upper surface 3122Ye of an electrode upper portion 3122YAd, raised above the auxiliary electrode layer 3200, of the column insulating layers 3122YA, and are present at a higher position than the upper surfaces 3122YAb of the column insulating layers 3122YA.

According to such a configuration, also, the column insulating layers 3122YA have a repellency to inks containing organic compounds as materials for the light emitting layers 3123 of not less than a predetermined value, and, therefore, can define the outer edges of the self-luminescence region of each pixel in the row direction. Besides, the row insulating layers 3122XA has an affinity for the inks of not less than a predetermined value, and, therefore, can control the flow of the inks in the column direction, whereby variations in the ink application amount among sub-pixels can be restrained, and variability in luminance can be reduced.

Furthermore, the row insulating layers 3122XA and the column insulating layers 3122YA can be patterned by performing once each the exposure and development utilizing a photomask, so that a lowering in productivity attendant on high-accuracy alignment of high-precision masks conducted multiple times can be avoided, and manufacturing cost can be reduced.

1.9 Other Modifications

Figure 17A:
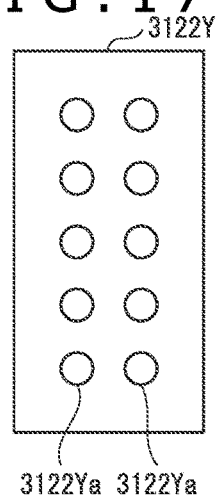
FIGS. 17A, 17B, 17C and 17D are drawings depicting modifications of the shape of a through-hole 3122*a* in an insulating layer 3122Y.
Figure 17B:
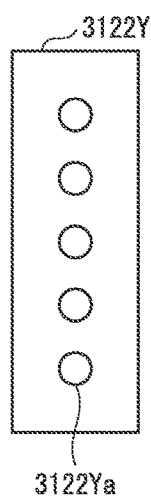
Figure 17C:
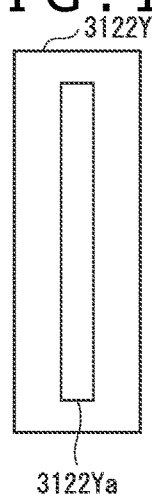
Figure 17D:
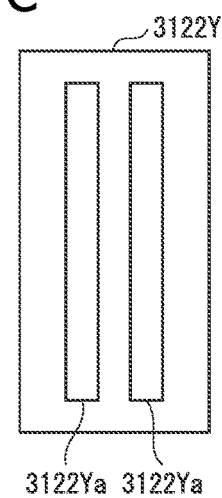

In the display panel 10 according to Embodiment 1, the through-holes 3122Ya provided in the column insulating layer 3122Y are composed of substantially circular holes arranged in two rows in the column direction at a predetermined interval, as illustrated in FIG. 17A. However, the through-holes 3122Ya may be arranged in one row, as depicted in FIG. 17B, and may be in the form of a slit or slits as depicted in FIGS. 17C and 17D.

In the display panel 10, the light emitting layers 3123 each extend continuously in the column direction on the column bank. However, in the above-mentioned configuration, the light emitting layers 3123 may each be intermittent on a pixel basis on the column bank.

In the display panel 10, the colors of lights emitted by the light emitting layers 3123 of the sub-pixels 3100se arranged in the gaps 3522z between the column banks 3522Y adjacent in the row direction have been different from one another, whereas the colors of lights emitted from the light emitting layers 3123 of the sub-pixels 3100se arranged in the gaps between the row insulating layers 3122X adjacent in the column direction have been the same. However, in the above-mentioned configuration, a configuration may be adopted wherein the colors of the lights emitted by the light emitting layers 3123 of the sub-pixels 3100se adjacent in the row direction are the same, whereas the colors of the lights emitted by the light emitting layers 3123 of the sub-pixels 3100se adjacent in the column direction are different from one another. In addition, a configuration may be adopted wherein the colors of the lights emitted by the light emitting layers 3123 of the sub-pixels 3100se adjacent in the row direction, and those in the column direction, are both different from one another.

In the display panel 10 according to the above embodiment, the pixels 3100e have included three kinds of pixels, namely, red pixels, green pixels and blue pixels, but this is not restrictive of the present disclosure. For instance, the light emitting layers may be of one kind, or the light emitting layers may be of four kinds that emit light in red, green, blue, and yellow.

In addition, while the pixels 3100e are arranged in a matrix pattern in the above embodiment, this is not limitative of the present disclosure. For example, the present disclosure has an effect also on a configuration wherein when the interval between the pixel regions is one pitch, the pixel regions are shifted (deviated) by half pitch in the column direction, between the adjacent gaps. In the display panels with a trend toward higher precision, some shifts (deviations) in the column direction are difficult to visually distinguish, and, even if irregularities in film thickness are aligned on a straight line (or zigzag line) having a certain degree of width, they appear in a belt-like form on a visual basis. Therefore, even in such a case, irregularities in luminance are restrained from being aligned in a zigzag pattern, whereby display quality of the display panel can be enhanced.

Besides, in the above embodiment, the hole injection layer 3120, the hole transport layer 3121, the light emitting layer 3123, and the electron transport layer 3124 have been present between the pixel electrode 3119 and the common electrode layer 3125, but this is not restrictive of the present disclosure. For example, a configuration may be adopted in which the hole injection layer 3120, the hole transport layer 3121, and the electron transport layer 3124 are not used, and only the light emitting layer 3123 is present between the pixel electrode 3119 and the common electrode layer 3125. In addition, for example, a configuration including the hole injection layer, the hole transport layer, the electron transport layer, the electron injection layer and the like, or configurations including some or all of these layers simultaneously may also be adopted. Besides, these layers may not necessarily be all formed from organic compounds, but may be formed from inorganic materials or the like.

In addition, in the above embodiment, a wet film forming process such as a printing process, a spin coating process and an ink jet process has been used as the method for forming the light emitting layers 3123, but this is not limitative of the present disclosure. For example, a dry film forming process such as a vacuum deposition process, an electron beam deposition process, a sputtering process, a reactive sputtering process, an ion plating process, and a vapor deposition process can also be used. Further, as the material for each of the constituent parts, known materials can be adopted as required.

In the above embodiment, the pixel electrode 3119 as anode has been disposed at a lower portion of the EL element section, and the pixel electrode 3119 has been connected to the wiring 3110 connected to the source electrode of the TFT. However, a configuration may be adopted wherein the common electrode layer is disposed at a lower portion of the EL element section, and the anode is disposed at an upper portion of the EL element section. In that case, the cathode disposed at a lower portion is connected to the drain of the TFT.

Besides, in the above embodiment, the two transistors Tr1 and Tr2 have been provided for one sub-pixel 3100se, but this is not restrictive of the present disclosure. For instance, one transistor may be provided for one sub-pixel, or three or more transistors may be provided for one sub-pixel.

Furthermore, while a top emission type EL display panel has been taken as an example in the above embodiment, this is not limitative of the present disclosure. For example, the present disclosure is applicable also to a bottom emission type display panel and the like. In that case, appropriate modifications in regard of each component are possible.

Embodiment 2 (No. 2017-054063)

1.1 Circuit Configuration of Display Apparatus 1

The circuit configuration of an organic EL display apparatus according to Embodiment 2 is the same as the circuit configuration of the display apparatus 1 according to Embodiment 1 depicted in FIG. 1, and, therefore, description thereof is omitted.

1.2 Circuit Configuration of Display Panel 10

The circuit configuration of a display panel 10 according to Embodiment 2 is the same as the circuit configuration of the display panel 10 according to Embodiment 1 depicted in FIG. 1, and, therefore, description thereof is omitted.

1.3 General Configuration of Display Panel 10

The display panel 10 according to Embodiment 2 will be described referring to the drawings. Note that the drawings are schematic views, and the scale therein may be different from the actual dimensions.

Figure 18:
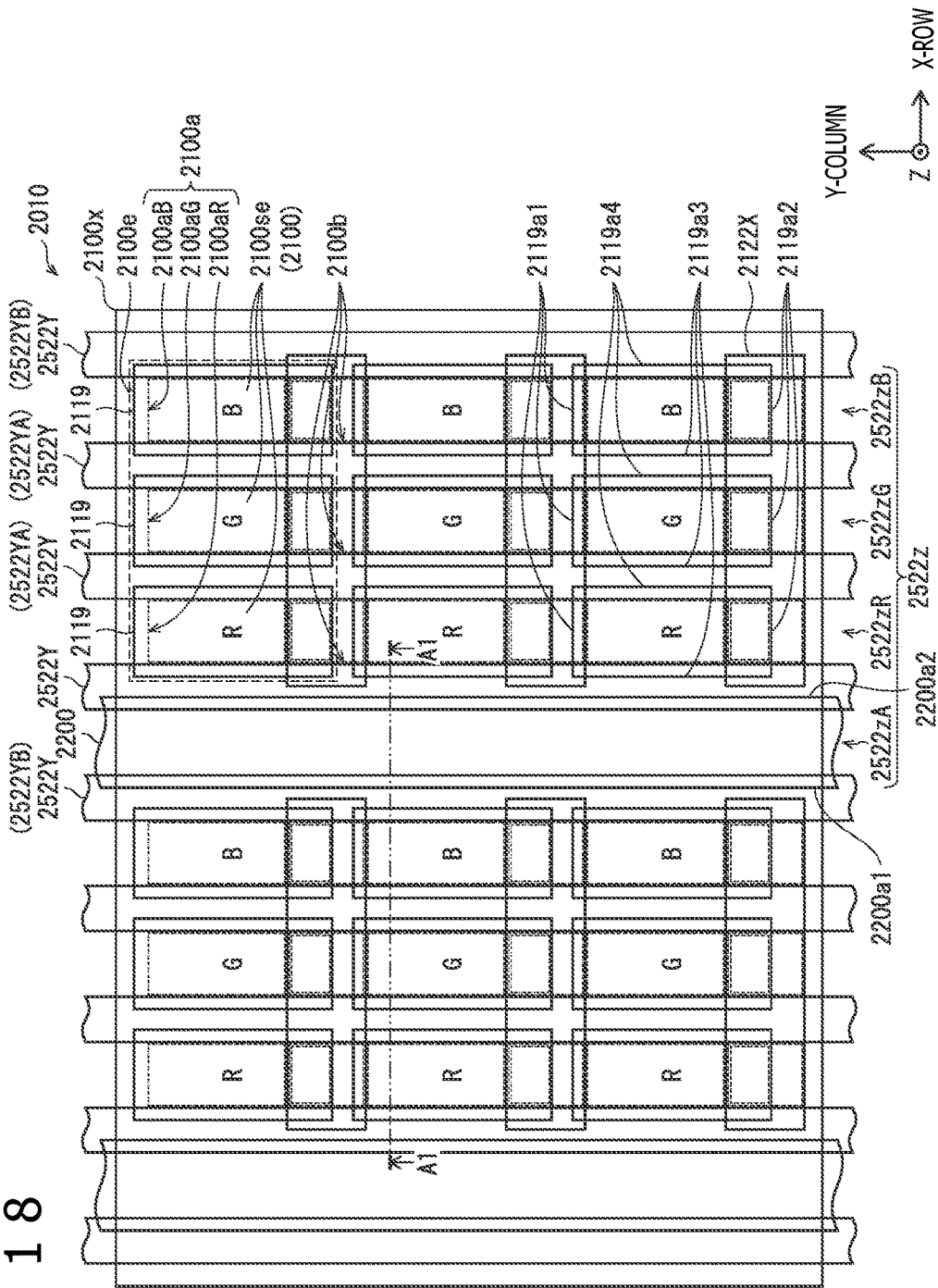
FIG. 18 is a schematic plan view depicting a part of an organic EL display panel 2010.

FIG. 18 is a schematic plan view depicting a part of the display panel according to the present embodiment. Note that hereinafter the display panel 10 will be depicted as a display panel 2010.

The display panel 2010 is an organic EL display panel utilizing an electroluminescence phenomenon of organic compounds, and has a top emission type configuration wherein a plurality of organic EL elements 2100 arranged in a matrix pattern on a substrate 2100x (TFT substrate) formed with thin film transistors (TFT) emit light from an upper surface of the organic EL display panel. Here, an X-direction, a Y-direction, and a Z-direction in FIG. 18 are herein a row direction, a column direction and a thickness direction in the display panel 2010.

In a display region of the display panel 2010, unit pixels 2100e each composed of a plurality of organic EL elements 2100 are arranged in a matrix pattern. In each unit pixel 2100e, there are formed three kinds of self-luminescence regions 2100a as emitting light by an organic compound, namely, 2100aR that emits light in red, 2100aG that emits light in green, and 2100aB that emits light in blue (where 2100aR, 2100aG, and 2100aB are not distinguished from one another, they will hereafter be referred to simply as "2100a"). Specifically, three sub-pixels 2100se (where they are distinguished from one another, they will hereafter be referred to as "red sub-pixel 2100seR," "green sub-pixel 2100seG," and "blue sub-pixel 2100seB") corresponding respectively to the self-luminescence regions 2100aR, 2100aG, and 2100aB aligned in the row direction, in a set, constitute the unit pixel 2100e in color display.

In the display panel 2010, a plurality of pixel electrodes 2119 are arranged in a matrix pattern on the substrate 2100x, in the state of being spaced from one another by predetermined distances in the row and column directions. The pixel electrodes 2119 are rectangular in plan-view shape, and are formed from a light reflecting material. The three pixel electrodes 2119 aligned in order in the row direction correspond to the three self-luminescence regions 2100aR, 2100aG, and 2100aB aligned in order in the row direction.

In the display panel 2010, a plurality of auxiliary electrode layers 2200 are arranged continuously in the column direction, between the unit pixels 2100e on the substrate 2100x. The auxiliary electrode layers 2200 are formed of the same light reflecting material as that of the pixel electrodes 2119. An upper surface of the auxiliary electrode layer 2200 is formed with a plurality of connection recesses (contact holes) for connection between the auxiliary electrode layer 2200 and a common electrode layer 2125 which will be described later.

Banks of an insulating layer type extending in a liner form are provided between the pixel electrodes which are adjacent to each other and between the pixel electrode 2119 and the auxiliary electrode layer 2200 which are adjacent to each other. The pixel electrode 2119 and the pixel electrode 2119 adjacent thereto are insulated from each other, and the pixel electrode 2119 and the auxiliary electrode layer 2200 adjacent thereto are insulated from each other. A plurality of column banks 2522Y each extending in the column direction (Y-direction in FIG. 18) are juxtaposedly provided over row-direction outer edges 2119a3 and 2119a4 of the two pixel electrodes 2119 adjacent in the row direction, over regions on the substrate 2100x located between the outer edges 2119a3, 2119a4, and over regions on the substrate 2100x located between the row-direction outer edges 2119a3, 2119a4 of the pixel electrodes 2119 and outer edges 2200a1, 2200a2 of the auxiliary electrode layers 2200 which are adjacent in the row direction. Therefore, the row-direction outer edges of the self-luminescence regions 2100a are defined by the row-direction outer edges of the column banks 2522Y.

On the other hand, a plurality of row banks 2122X each extending in the row direction (X-direction in FIG. 18) are juxtaposedly provided over column-direction outer edges 2119a1 and 2119a2 of the two pixel electrodes 2119 adjacent in the column direction and over regions on the substrate 2100x located between the outer edges 2119a1 and 2119a2. The regions where the row banks 2122X are formed constitute non-self-luminescence regions 2100b, since organic electroluminescence is not generated in the light emitting layers 2123 over the pixel electrodes 2119. Therefore, outer edges in the column direction of the self-luminescence regions 2100a are defined by outer edges in the column direction of the row banks 2122X.

Where a space between the adjacent column banks 2522Y is defined as a gap 2522z, the gaps 2522z include a red gap 2522zR corresponding to the self-luminescence region 2100aR, a green gap 2522zG corresponding to the self-luminescence region 2100aG, a blue gap 2522zB corresponding to the self-luminescence region 2100aB, and an auxiliary gap 2522zA corresponding to the region where the auxiliary electrode layer 2200 is disposed (where the gap 2522zR, the gap 2522zG, the gap 2522zB and the gap 2522zA are not distinguished from one another, they will hereafter be referred to as the "gaps 2522z"), and the display panel 2010 has a configuration wherein a multiplicity of column banks 2522Y and a multiplicity of gaps 2522z are alternately aligned.

In the display panel 2010, the plurality of self-luminescence regions 2100a and the plurality of non-self-luminescence regions 2100b are alternately aligned in the column direction along the gaps 2522zR, the gaps 2522zG, and the gaps 2522zB. In the non-self-luminescence regions 2100b, there are connection recesses (contact holes) for connection between the pixel electrode 2119 and the source S1 of the TFT, and contact regions (contact windows) on the pixel electrodes 2119 for electrical connection to the pixel electrodes 2119 are provided.

In one sub-pixel 2100se, the column bank 2522Y provided in the column direction and the row bank 2122X provided in the row direction are orthogonal to each other, and the self-luminescence region 2100a is located between the row bank 2122X and the row bank 2122X in the column direction.

Each of the two column banks 2522Y disposed on both sides of the auxiliary electrode layer 2200 has a side wall inclined toward the auxiliary electrode layer 2200 side at an acute angle against the surface of the substrate 2100x. At a base portion of the side wall, an electron transport layer as a functional layer which will be described later undergoes disconnection, and the common electrode layer 2125 and the auxiliary electrode layer 2200 are connected directly to each other.

1.4 Configuration of Each Section of Display Panel 2010

Figure 19:
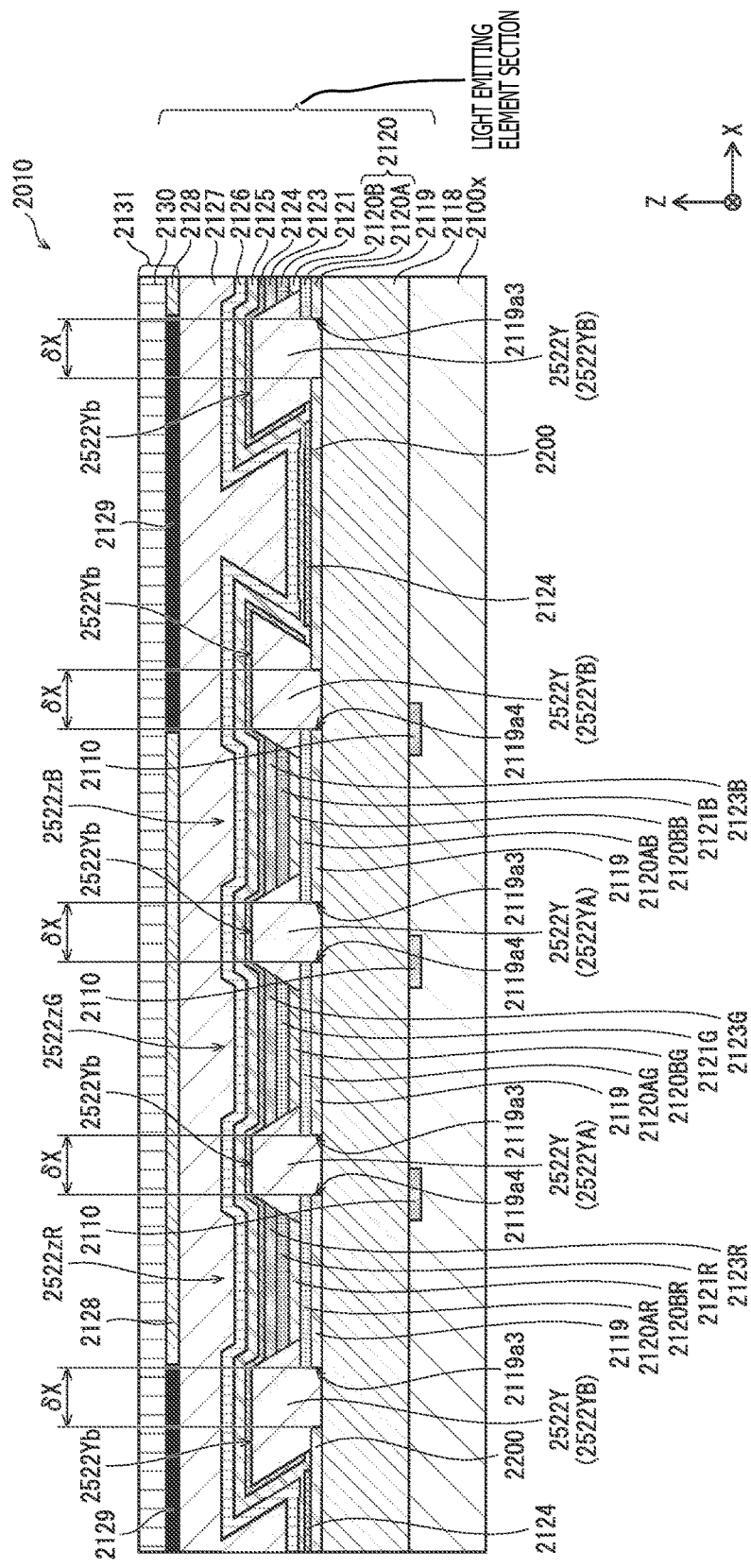
FIG. 19 is a schematic sectional view taken along line A1-A1 of FIG. 18.

The configuration of an organic EL element 2100 in the display panel 2010 will be described referring to FIGS. 19 and 20. FIG. 19 is a schematic sectional view taken along line A1-A1 of FIG. 18. In addition, FIG. 19 is a schematic sectional view depicting a part of FIG. 18 in an enlarged form.

In the display panel 2010 according to the present embodiment, a substrate (TFT substrate) formed with thin transistors is provided on the lower side in the Z-axis direction, and organic EL element sections are configured thereon.

1.4.1 Substrate (1) Substrate 2100x

The substrate 2100x is a support member of the display panel 2010, and includes a base material (not illustrated) and a thin film transistor (TFT) layer (not illustrated) formed on the base material.

The base material is a support member of the display panel 2010, and is flat plate-like in shape. As the material of the base material, there can be used electrically insulating materials such as, for example, glass materials, resin materials, semiconductor materials, and metallic materials coated with an insulating layer.

The TFT layer includes a plurality of TFTs and a plurality of wirings inclusive of wirings 2110 which are formed at the upper surface of the base material. The TFT is for electrically connecting the pixel electrode 2119, which corresponds to itself, and an external power supply according to a driving signal sent from an external circuit for the display panel 2010. The TFT has a multilayer structure including electrodes, a semiconductor layer, an insulating layer and the like. The wirings electrically connect the TFTs, the pixel electrodes 2119, the external power supply, the external circuit and the like. The wiring 2110 is connected to the source S1 of the TFT.

(2) Interlayer Insulating Layer 2118

An interlayer insulating layer 2118 is provided on the base material and on the upper surfaces of the TFTs. The interlayer insulating layer 2118 located on the upper surface of the substrate 2100x is for planarizing the upper surface of the substrate 2100x which has ruggedness (projections and recesses) due to the presence of the TFT layer. In addition, the interlayer insulating layer 2118 fills the spaces between the wirings and the TFTs, to electrically insulate the wiring and the TFTs from one another.

The interlayer insulating layer 2118 has contact holes (not illustrated) opened therein at parts over the wirings 2110, and has contact holes (not illustrated) opened at parts under the auxiliary electrode layers 2200. If an upper limit film thickness of the interlayer insulating layer 2118 is not less than 10 µm, variability in film thickness upon manufacture would be large, and it would be difficult to control the bottom line width. In addition, the upper limit film thickness is desirably not more than 7 µm, from the viewpoint of a lowering in productivity due to an increase in tact. Besides, as film thickness decreases, it may become necessary for film thickness and bottom line width to be comparable to each other, and, if a lower limit film thickness is not more than 1 µm, it would be difficult to obtain a desired bottom line width due to limitation as to resolution. In the case of a general exposure apparatus for flat panel displays, the limit is 2 µm. Therefore, the thickness of the interlayer insulating layer 2118 is preferably, for example, in the range of 1 to 10 µm, more preferably 2 to 7 µm.

1.4.2 Organic EL Element Section (1) Pixel Electrode 2119

As depicted in FIGS. 18 and 19, on the interlayer insulating layer 2118 located on the upper surface of the substrate 2100x, pixel electrodes 2119 are provided on a sub-pixel 2100se basis. The pixel electrode 2119 is for supplying carriers; for example, where the pixel electrode 2119 functions as an anode, it supplies holes to the light emitting layer 2123. In addition, since the display panel 2010 is of the top emission type, the pixel electrode 2119 has a light transmitting property. The pixel electrode 2119 is rectangular flat plate-like in shape. The pixel electrodes 2119 are disposed on the interlayer insulating layer 2118 at intervals $\delta X$ in the row direction, and at intervals $\delta Y$ in the column direction in the gap 2522zR, the gap 2522zG, and the gap 2522zB individually. Over the contact hole provided in the interlayer insulating layer 2118, a connection recess of the pixel electrode 2119 obtained by recessing a part of the pixel electrode 2119 in the direction of the substrate 2100x is formed, and the pixel electrode 2119 and the wiring 2110 are connected together at the bottom of the connection recess.

(2) Auxiliary Electrode Layer 2200

As depicted in FIGS. 18 and 19, a plurality of auxiliary electrode layers 2200 extending in the column direction are provided at predetermined intervals on the interlayer insulating layer 2118 located on the upper surface of the substrate 2100x, each located between the unit pixel 2100e and the unit pixel 2100e. A connection recess obtained by recessing a part of the auxiliary electrode layer 2200 in the direction of the substrate 2100x is formed along the contact hole in the interlayer insulating layer 2118. In the inside of the connection recess, a contact surface is formed as an inner wall. The connection recess is substantially circular in shape as viewed from the upper side, and is formed to have a radius r of preferably in the range of 2 to 10 µm. The connection recess is formed to have a depth h of preferably in the range of 1 to 7 µm. The contact surface is preferably formed to have an inclination angle in the range of 75 to 120 degrees against the upper surface of the substrate 2100x.

(3) Hole Injection Layer 2120

As depicted in FIG. 19, a hole injection layer 2120 is stacked on the pixel electrode 2119. The hole injection layer 2120 has a function of transporting holes, injected from the pixel electrode 2119, to a hole transport layer 2121 which will be described later.

The hole injection layer 2120 includes a lower layer 2120A formed of a metallic oxide and formed on the pixel electrode 2119, and an upper layer 2120B formed of an organic material and stacked at least on the lower layer 2120A, in this order from the substrate 2100x side. The lower layers 2120A provided in the blue sub-pixel, the green sub-pixel, and the red sub-pixel are referred to as a lower layer 2120AB, a lower layer 2120AG, and a lower layer 2120AR. In addition, the upper layers 2120B provided in the blue sub-pixel, the green sub-pixel, and the red sub-pixel are referred to as an upper layer 2120BB, an upper layer 2120BG, and a lower layer 2120BR, respectively.

In the present embodiment, the upper layers 2120B are provided in a linear shape such as to extend in the column direction, in the gap 2522zR, the gap 2522zG, and the gap 2522zB which will be described later. However, a configuration may be adopted wherein the upper layers 2120B are formed only on the lower layers 2120A formed on the pixel electrodes 2119, and are provided intermittently in the column direction in the gaps 2522z.

(4) Bank 2122

As depicted in FIG. 19, banks formed of an insulating material are formed so as to cover end edges of the pixel electrodes 2119, the lower layers 2120A of the hole injection layers 2120 and the auxiliary electrode layers 2200. As depicted in FIG. 18, the banks include a plurality of column banks 2522Y extending in the column direction and juxtaposed in the row direction, and a plurality of row banks 2122X extending in the row direction and juxtaposed in the column direction. The column banks 2522Y are orthogonal to the row banks 2122X, and are provided in the state of being along the column direction. The column banks 2522Y and the row banks 2122X form a grid-like pattern (where the row banks 2122X and the column banks 2522Y are not distinguished from each other, they will hereafter be referred to as "banks 2122").

(Row Bank 2122X)

The shape of the row bank 2122X is a liner shape extending in the row direction, and its section parallel to the column direction is a normal tapered trapezoid tapered upward. The row banks 2122X are provided in the state of being along the row direction orthogonal to the column direction in such a manner as to penetrate each column bank 2522Y, and each have an upper surface at a lower position than an upper surface 2522Yb of the column bank 2522Y. Therefore, the row banks 2122X and the column banks 2522Y together define openings corresponding to self-luminescence regions 2100a.

The row banks 2122X are for controlling the flow of inks, each containing an organic compound as a material of the light emitting layer 2123, in the column direction. Therefore, the row banks 2122X should have an affinity for the inks of not less than a predetermined value. With such a configuration, variations in ink coating amount among the sub-pixels is restrained. Due to the row banks 2122X, the pixel electrodes 2119 are not exposed, and light is not emitted in the regions where the row banks 2122X are present, so that these regions do not contribute to luminance.

Specifically, the row banks 2122X are present over the two outer edges 2119a1 and 2119a2 of the pixel electrode 2119, and are formed in the state of overlapping with the contact region of the pixel electrode 2119. The length in the column direction of the non-self-luminescence region 2100b where the row bank 2122X is formed is greater by a predetermined length than the distance δY between the two column-direction outer edges 2119a1 and 2119a2 of the pixel electrodes 2119. By thus covering the column-direction outer edges 2119a1 and 2119a2 of the pixel electrodes 2119, electric leak between the pixel electrode 2119 and the common electrode layer 2125 is prevented, and the outer edges of the self-luminescence region 2100a of each sub-pixel 2100se are defined.

(Column Bank 2522Y)

As depicted in FIGS. 18 and 19, the column banks 2522Y include two kinds of banks, namely, first column banks 2522YA and second column banks 2522YB.

The shape of the first column bank 2522YA is a linear shape extending in the column direction, and, as depicted in FIG. 19, its section parallel to the row direction is a normal tapered trapezoid tapered upward. On the other hand, the shape of the second column bank 2522YB is a linear shape extending in the column direction, and, as depicted in FIG. 19, its section parallel to the row direction is a parallelogram.

Between a first pixel electrode 2119 and a second pixel electrode 2119 adjacent thereto, the first column bank 2522YA is present over an outer edge 2119a3 in the row direction of the first pixel electrode 2119 and over an outer edge 2119a4 in the row direction of the second pixel electrode 2119, and is formed in the state of overlapping with a part of each of the first pixel electrode 2119 and the second pixel electrode 2119. The width in the row direction of the region where the first column bank 2522YA is formed is greater by a predetermined width than the distance δX between the column-direction outer edge 2119a3 of the first pixel electrode 2119 and the column-direction outer edge 2119a4 of the second pixel electrode 2119.

On the other hand, between the pixel electrode 2119 and the auxiliary electrode layer 2200 adjacent thereto, the second column bank 2522YB is present over the outer edge 2119a3 (or the outer edge 2119a4) in the row direction of the pixel electrode 2119 and the outer edge 2200a2 (or the outer edge 2200a1) in the row direction of the auxiliary electrode layer 2200, and is formed in the state of overlapping with a part of each of the pixel electrode 2119 and the auxiliary electrode layer 2200. The width in the row direction of the region where the second column bank YB is formed is greater by a predetermined width than the distance δX between the outer edge 2119a3 and the outer edge 2200a2 (or the distance δX between the outer edge 2119a4 and the outer edge 2200a1).

Figure 20:
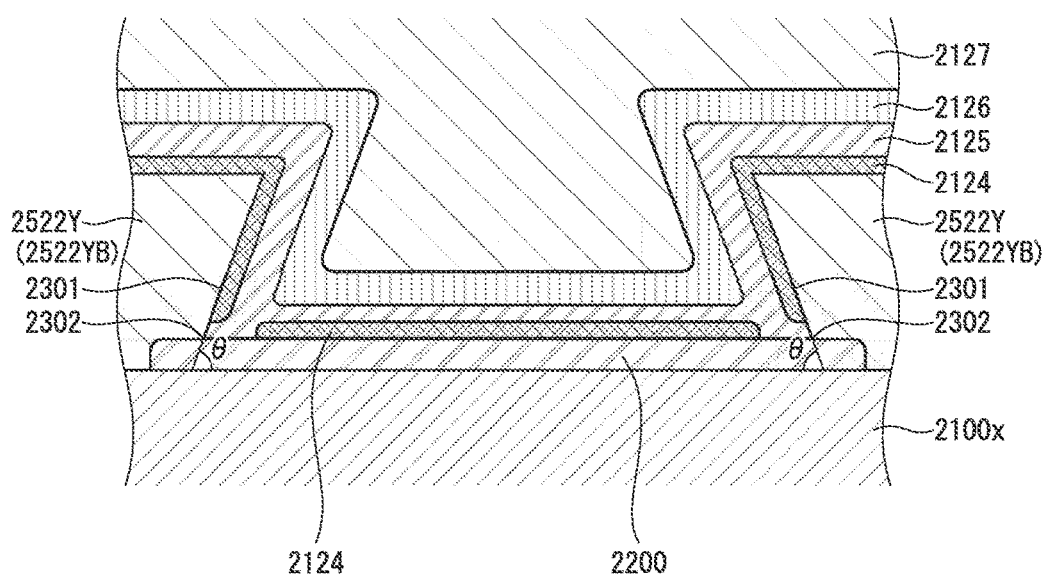
FIG. 20 is an enlarged view of the vicinity of an auxiliary electrode layer 2200 depicted in FIG. 19.

As illustrated in FIGS. 19 and 20, the second column bank 2522YB has a side wall 2301 inclined toward the auxiliary electrode 2200 side at an acute angle θ against the surface of the substrate 2100x. At a base portion 2302 of the side wall and in the vicinity thereof, an electron transport layer 2124 undergoes disconnection, and the common electrode layer 2125 and the auxiliary electrode layer 2200 are directly connected to each other.

The column banks 2522Y dam up the flow of inks, each containing an organic compound as material for the light emitting layer 2123, in the row direction to thereby define the row-direction outer edges of the light emitting layers 2123 formed.

Thus, by covering the outer edges 2119a3 and 2119a4 in the row direction of the pixel electrodes 2119 and by covering the outer edges 2200a1 and 2200a2 in the row direction of the auxiliary electrode layers 2200, electric leak between the electrode or electrode layer and the common electrode layer 2125 is prevented, and outer edges of the self-luminescence region 2100a of each sub-pixel 2100se in the row direction are defined. The column banks 2522Y define the outer edges of the self-luminescence region of each pixel in the column direction, as aforementioned. Therefore, the column banks 2522Y should have a repellency to inks of not less than a predetermined value.

(5) Hole Transport Layer 2121

As illustrated in FIGS. 18 and 19, hole transport layers 2121 are stacked on the column banks 2122X and on the hole injection layers 2120 in the gaps 2522zR, 2522zG, and 2522zB. The hole transport layer 2121 is in contact with the upper layer 2120B of the hole injection layer 2120. The hole transport layer 2121 has a function of transporting holes, injected from the hole injection layer 2120, to the light emitting layer 2123. The hole transport layers 2121 provided in the gaps 2522zR, 2522zG, and 2522zB are referred to as a hole transport layer 2121 R, a hole transport layer 2121G, and a hole transport layer 2121 B.

In the present embodiment, the hole transport layers 2121 are provided in a linear shape extending in the column direction in the gaps 2522z which will be described later, like the upper layers 2120B. However, the hole transport layers 2121 may be provided intermittently in the column direction in the gaps 2522z.

(6) Light Emitting Layer 2123

As depicted in FIG. 19, the light emitting layers 2123 are stacked on the hole transport layers 2121. The light emitting layers 2123 are each a layer formed of an organic compound, and each have a function of emitting light through recombination between holes and electrons in the inside thereof. The light emitting layers 2123 are provided in a linear shape extending in the column direction, in the gaps 2522zR, the gaps 2522zG, and the gaps 2522zB. The light emitting layers 2123 are formed to extend in the column direction, in the gaps 2522zR, the gaps 2522zG, and the gaps 2522zB defined by the column banks 2522Y. Light emitting layers 2123R, 2123G, and 2123B that emit light in respective colors are formed in a red gap 2522zR corresponding to the self-luminescence region 2100aR in the red sub-pixel 2100seR, a green gap 2522zG corresponding to the self-luminescence region 2100aG in the green sub-pixel 2100seG, and a blue gap 2522zB corresponding to the self-luminescence region 2100aB in the blue sub-pixel 2100seB.

Since the light emitting layer 2123 emit light only at a part supplied with carriers from the pixel electrode 2119, the electroluminescence phenomenon of an organic compound is not generated in the range where the row bank 2122X as an insulator is present between the layers. Therefore, the light emitting layer 2123 emit light only at a part where the row bank 2122X is absent, and this part constitutes the self-luminescence region 2100a. Outer edges in the column direction of the self-luminescence region 2100a are defined by column-direction outer edges of the row banks 2122X.

Of the light emitting layer 2123, a part 2119b located over side surfaces and an upper surface 2122Xb of the row bank 2122X does not emit light, and this part constitutes a non-self-luminescence region 2100b. The light emitting layer 2123 is, in its self-luminescence region 2100a, located on the upper surface of the hole transport layer 2121, and is, in its non-self-luminescence region 2100b, located on the upper surface of the hole transport layer 2121 over the upper and side surfaces of the row bank 2122X.

Note that the light emitting layer 2123 extends continuously, not only in the self-luminescence region 2100a but also in the non-self-luminescence region 2100b adjacent thereto. This configuration ensures that at the time of forming the light emitting layer 2123, the ink applied to the self-luminescence region 2100a can flow in the column direction through the ink applied to the non-self-luminescence region 2100b, so that the film thickness can be leveled off among the pixels in the column direction. It is to be noted, however, that in the non-self-luminescence region 2100b, the flow of ink is moderately restrained by the row bank 2122X. Therefore, variability in film thickness is not liable to be generated in the column direction, and variability in luminance on a pixel basis is improved.

(7) Electron Transport Layer 2124

As illustrated in FIG. 19, an electron transport layer 2124 is stackedly formed in such a manner as to cover the column banks 2522Y and the gaps 2522z defined by the column banks 2522Y. The electron transport layer 2124 is formed in the state of being continuous over the whole part of the display panel 2010.

As depicted in FIG. 19, the electron transport layer 2124 is formed on the light emitting layers 2123. The electron transport layer 2124 has a function of transporting electrons from the common electrode layer 2125 to the light emitting layers 2123, and restricting the injection of electrons into the light emitting layers 2123.

As depicted in FIGS. 19 and 20, the electron transport layer 2124 is formed also on the wall surfaces 2301 of the column banks 2522Y and on the auxiliary electrode layers 2200.

It is to be noted, however, that the electron transport layer 2124 undergoes disconnection at base portions 2302 of the wall surfaces 2301 of the column banks 2522Y. In other words, the electron transport layer 2124 formed on the wall surface 2301 and the electron transport layer 2124 formed on the auxiliary electrode layer 2200 are not connected with each other.

At the base portions 2302, the auxiliary electrode layer 2200 and the common electrode layer 2125 are directly connected with each other.

(8) Common Electrode Layer 2125

As illustrated in FIG. 19, the common electrode layer 2125 is formed on the electron transport layer 2124. The common electrode layer 2125 is formed over the whole surface of the display panel 2010, and serves as a common electrode for the light emitting layers 2123.

As depicted in FIG. 19, the common electrode layer 2125 is formed also in the regions on the electron transport layer 2124 which are located over the pixel electrodes 2119. The common electrode layer 2125, forming a pair with the pixel electrode 2119, sandwiches the light emitting layer 2123 to form a current passing passage, thereby supplying carriers to the light emitting layer 2123; for example, where it functions as a cathode, it supplies electrons to the light emitting layer 2123.

As depicted in FIGS. 19 and 20, the common electrode layer 2125 is formed also in regions over the auxiliary electrode layers 2200 and the electron transport layer 2124. The common electrode layer 2125 is in direct contact with the auxiliary electrode layers 2200 at the base portions 2302 of the wall surfaces 2301 of the column banks 2522Y.

(9) Sealing Layer 2126

As illustrated in FIG. 19, a sealing layer 2126 is stackedly formed in such a manner as to cover the common electrode layer 2125. The sealing layer 2126 is for restraining the light emitting layers 2123 from being deteriorated by contact with moisture or air. The sealing layer 2126 is provided over the whole surface of the display panel 2010 so as to cover the upper surface of the common electrode layer 2125.

(10) Bonding Layer 2127

A CF substrate 2131 having color filter layers 2128 formed on a major surface on the lower side in the Z-axis direction of an upper substrate 2130 is disposed on the upper side in the Z-axis direction of the sealing layer 2126, and is bonded to the sealing layer 2126 by a bonding layer 2127. The bonding layer 2127 has a function of laminating the back panel, including the layers ranging from the substrate 2100x to the sealing layer 2126, and the CF substrate 2131 on each other, and preventing the layers from being exposed to moisture or air.

(11) Upper Substrate 2130

The CF substrate 2131 having the upper substrate 2130 formed with the color filter layers 2128 is disposed on and bonded to the bonding layer 2127. For the upper substrate 2130, a light transmitting material such as, for example, a cover glass or a transparent resin film is used, since the display panel 2010 is of the top emission type. In addition, enhancement of rigidity of the display panel 2010 and prevention of penetration of moisture, air or the like can be attained by the upper substrate 2130.

(12) Color Filter Layer 2128

The upper substrate 2130 is formed with the color filter layers 2128 at positions corresponding to the color self-luminescence regions $2100a$ of the pixels. The color filter layers 2128 are transparent layers provided for permitting transmission therethrough of visible lights of wavelength corresponding to R, G, and B, and each have a function of permitting therethrough of the light emitted from each color pixel to correct the chromaticity of the light. For instance, in the present example, red, green, and blue filter layers 2128R, 2128G, and 2128B are formed, respectively, over the self-luminescence region $2100a$R in the red gap $2522z$R, the self-luminescence region $2100a$G in the green gap $2522z$G, and the self-luminescence region $2100a$B in the blue gap $2522z$B.

(13) Light Shielding Layer 2129

The upper substrate 2130 is formed with light shielding layers 2129 at positions corresponding to boundaries between the self-luminescence regions $2100a$ of the pixels. The light shielding layers 2129 are black resin layers provided for preventing visible lights of wavelengths corresponding to R, G, and B from being transmitted therethrough, and are formed from, for example, a resin material containing a black pigment that is excellent in light-absorbing and light-shielding properties.

1.4.3 Constituent Material of Each Section

An example of constituent materials of the sections depicted in FIGS. 19 and 20 will be described below.

(1) Substrate $2100x$ (TFT Substrate)

As the base material, there can be adopted, for example, glass substrates, quartz substrate, silicon substrate, metallic substrates of molybdenum sulfide, copper, zinc, aluminum, stainless steel, magnesium, iron, nickel, gold, silver, etc., semiconductor substrates such as gallium arsenide substrate, plastic substrates, and the like. In addition, as a flexible plastic material, both thermoplastic resins and thermosetting resins may be used. As the material, there can be used electrically insulating materials, for example, resin materials. For a gate electrode, a gate insulating layer, a channel layer, a channel protecting layer, a source electrode, a drain electrode and the like, known materials can be used. As the gate electrode, for example, a stacked body of copper (Cu) and molybdenum (Mo) is adopted. For the gate insulating layer, known organic materials and known inorganic materials, such as silicon oxide ($SiO_2$) and silicon nitride ($SiN_x$), can both be used, so long as they are electrically insulating materials. For the channel layer, oxide semiconductors containing at least one selected from among indium (In), gallium (Ga), and zinc (Zn) can be adopted. For the channel protecting layer, for example, silicon oxide (SiON), silicon nitride (SiN) or aluminum oxide (AlOx) can be used. As the source electrode and the drain electrode, for example, a stacked body of copper-manganese (CuMn) and copper (Cu) and molybdenum (Mo) can be adopted.

For an insulating layer at an upper portion of the TFT, there can also be used, for example, silicon oxide ($SiO_2$), silicon nitride (SiN), and silicon oxynitride (SiON). As a connection electrode layer of the TFT, there can be adopted, for example, a stacked body of molybdenum (Mo) and copper (Cu) and copper-manganese (CuMn). Note that the material to be used to constitute the connection electrode layer is not limited to this, and can be selected from conductive materials, as required.

As the material of the interlayer insulating layer located on the upper surface of the substrate $2100x$, there can be used organic compounds, for example, polyimide resins, acrylic resins, siloxane resins, and novolak type phenolic resins.

(2) Pixel Electrode 2119 and Auxiliary Electrode Layer 2200

The pixel electrodes 2119 are formed from a metallic material. In the case of the display panel 2010 according to the present embodiment that is of the top emission type, an optical resonator structure is adopted by optimally setting the thicknesses, whereby the chromaticity of the light emitted is adjusted and the luminance is enhanced. For this reason, a surface part of the pixel electrode 2119 should have a high reflecting property. In the display panel 2010 according to the present embodiment, the pixel electrodes 2119 may have a structure wherein a plurality of films selected from among metallic layers, alloy layers and transparent conductive films are stacked. The metallic layers can each be formed from a metallic material containing silver (Ag) or aluminum (Al). For the alloy layers, there can be used, for example, APC (an alloy of silver, palladium, and copper), ARA (an alloy of silver, rubidium, and gold), MoCr (an alloy of molybdenum and chromium), NiCr (an alloy of nickel and chromium) and the like. As the constituent material of the transparent conductive layer, there can be used, for example, indium tin oxide (ITO), indium zinc oxide (IZO) and the like.

The auxiliary electrode layers 2200 are formed of the same material as the material of the pixel electrodes 2119.

(3) Hole Injection Layer 2120

The lower layer 2120A of the hole injection layer 2120 is a layer formed of an oxide of, for example, silver (Ag), molybdenum (Mo), chromium (Cr), vanadium (Va), tungsten (W), nickel (Ni), iridium (Ir) or the like. In the case where the lower layer 2120A is formed of an oxide of a transition metal, the transition metal takes a plurality of oxidation numbers and can thereby take a plurality of levels, so that hole injection is facilitated and the driving voltage can be lowered. In the present embodiment, the lower layer 2120A included an oxide of tungsten (W). In the case of an oxide of tungsten (W), as the ratio (W5−/W6+) of pentavalent tungsten atoms to hexavalent tungsten atoms is higher, the driving voltage for the organic EL element is lower; therefore, it is preferable that the tungsten oxide contains pentavalent tungsten atoms in a large amount of not less than a predetermined value.

As the upper layer 2120B of the hole injection layer 2120, there can be used, for example, a coating film formed from an organic polymer solution of a conductive polymer material such as PEDOT (a mixture of polythiophene and polystyrenesulfonic acid), as aforementioned.

(4) Bank 2122

The banks 2122 are formed by use of an organic material such as a resin, and has an insulating property. Examples of the material to be used for forming the banks 2122 include acrylic resins, polyimide resins, and novolak type phenolic resins. The banks 2122 preferably have organic solvent resistance. More preferably, it is desirable to use an acrylic resin, since it is low has a low refractive index and is suitable for use as reflector.

Alternatively, the banks 2122 may be formed by use of an inorganic material, and in this case, for example, silicon oxide (SiO2) is preferably used, from the viewpoint of refractive index. Alternatively, the banks 2122 are formed by use of such an inorganic material as silicon nitride (SiN) or silicon oxynitride (SiON).

Further, an etching treatment, a braking treatment and the like may be conducted during the manufacturing process, and, therefore, the banks 2122 are preferably formed from a material high in resistance to the treatments so that they would not be excessively deformed or denatured by the treatments.

In addition, the banks 2122 may have their surfaces subjected to a fluorine treatment for imparting water repellency to the surfaces. Besides, a fluorine-containing material may be used for forming the banks 2122. In addition, the banks 2122 may be subjected to irradiation with UV rays or a baking treatment at a low temperature, for lowering water repellency of the surfaces of the banks 2122.

Note that a positive type photosensitive material, for example, is used for the first column banks 2522YA so that their section parallel to the row direction will be a normal tapered trapezoid tapered upward.

On the other hand, a negative type photosensitive material, for example, is used for the second column banks 2522YB so that their section parallel to the row direction will be a reverse tapered trapezoid tapered downward, during the manufacturing process.

Here, a positive type photosensitive material and a negative type photosensitive material are both resins which undergo a chemical reaction only at parts exposed to light. The positive type photosensitive material is dissolved in a developing liquid only at the parts exposed to light. On the other hand, the negative type photosensitive material becomes insoluble in the developing liquid at the parts exposed to light.

When a negative type photosensitive material is used, central portions of the parts to be banks are exposed to a sufficient amount of light, and become insoluble in the developing liquid. However, a peripheral portion is exposed to an insufficient amount of light, and, at a depth portion of the peripheral portion, the intensity of light is attenuated. Therefore, the depth portion of the peripheral portion is dissolved in the developing liquid. As a result, the banks in a reverse tapered trapezoidal shape are formed during the manufacturing process, as aforementioned.

When a positive type photosensitive material is used, on the other hand, banks in a reverse tapered trapezoidal shape are formed, conversely to the above case.

(5) Hole Transport Layer 2121

For the hole transport layers 2121, there can be used, for example, high-molecular compounds such as polyfluorene and derivatives thereof, polyarylamines, which are amine-based organic polymers, or TFB (poly(9,9-di-n-octylfluoroene-alt-(1,4-phenylene-((4-sec-butylphenyl)imino)-1,4-phenylene))).

(6) Light Emitting Layer 2123

The light emitting layers 2123 have a function of emitting light by generation of an excited state through recombination of holes and electrons injected thereinto, as aforementioned. As the material for forming the light emitting layers 2123, there should be used a light-emitting organic material which can be formed into a film by use of a wet printing method.

Specifically, the light emitting layers 2123 are preferably formed from a fluorescent material, examples of which include oxinoid compounds, perylene compounds, coumarin compounds, azacoumarin compounds, oxazole compounds, oxadiazole compounds, perynone compounds, pyrrolopyrrole compounds, naphthalene compounds, anthracene compounds, fluorenone compounds, fluoranthene compounds, tetracene compounds, pyrene compounds, coronene compounds, quinolone compounds and azaquinolone compounds, pyrazoline derivatives and pyrazolone derivatives, rhodamine compounds, chrysene compounds, phenanthrene compounds, cyclopentadiene compounds, stilbene compounds, diphenylquinone compounds, styryl compounds, butadiene compounds, dicyanomethylenepyran compounds, dicyanomethylenethiopyran compounds, fluorescein compounds, pyrylium compounds, thiapyrylium compounds, selenapyrylium compounds, telluropyrylium compounds, aromatic aldadiene compounds, oligophenylene compounds, thioxanthene compounds, anthracene compounds, cyanine compounds, acridine compounds, metal complexes of 8-hydroxyquinoline compounds, metal complexes of 2-bipyridine compounds, complexes of Schiff base and Group III metal, oxine metal complexes, and rare earth complexes, which are described in patent publication (Japanese Patent Laid-open No. Hei 5-163488).

(7) Electron Transport Layer 2124

For the electron transport layer 2124, an organic material having a high electron transporting property is used. Examples of the organic material to be used for the electron transport layer 2124 include 7-electron low-molecular-weight organic materials such as oxadiazole derivatives (OXD), triazole derivatives (TAZ), and phenanthroline derivatives (BCP, Bphen). In addition, the electron transport layer 2124 may include a layer formed by doping an organic material having a high electron transporting property with a dopant metal selected from among alkali metals and alkaline earth metals. Besides, the electron transport layer 2124 may include a layer formed by use of sodium fluoride.

(8) Common Electrode Layer 2125

For the common electrode layer 2125, a conductive material having a light transmitting property is used. For example, indium tin oxide (ITO) or indium zinc oxide (IZO) or the like is used to form the common electrode layer 2125. In addition, an electrode obtained by forming silver (Ag) or aluminum (Al) or the like into a thin film may also be used.

(9) Sealing Layer 2126

The sealing layer 2126 has a function of restraining the organic layers such as the light emitting layers 2123 from being exposed to moisture or air, and is formed by use of a light transmitting material such as, for example, silicon nitride (SiN) or silicon oxynitride (SiON). In addition, a sealing resin layer formed of a resin material such as acrylic resin or silicone resin may be provided on the layer formed by use of such material as silicon nitride (SiN) or silicon oxynitride (SiON).

The sealing layer 2126 should be formed from a light transmitting material, in the case of the display panel 2010 according to the present embodiment that is of the top emission type.

(10) Bonding Layer 2127

The material of the bonding layer 2127 is, for example, a resin adhesive or the like. For the bonding layer 2127, there can be adopted a light transmitting resin material such as acrylic resins, silicone resins, and epoxy resins.

(11) Upper Substrate 2130

As the upper substrate 2130, there can be adopted substrates formed of a light transmitting material, such as, for example, glass substrates, quartz substrate, and plastic substrates.

(12) Color Filter Layer 2128

For the color filter layers 2128, there can be adopted, for example, known resin materials (e.g., such commercially available materials as Color Resists produced by JSR corporation).

(13) Light Shielding Layer 2129

The light shielding layers 2129 are formed from a resin material containing a UV-curing resin (e.g., UV-curing acrylic resin) material as a main constituent, with a black pigment added thereto. As the black pigment, there can be adopted light shielding materials such as, for example, carbon black pigments, titanium black pigments, metallic oxide pigments, and organic pigments.

1.5 Method of Manufacturing Display Panel 2010

A method of manufacturing the display panel 2010 will be described referring to FIGS. 21A, 21B, 21C, 21D, 22A, 22B, 22C, 23A, 23B, 23C, 23D, 24A, 24B, 24C, 24D, 24E, 24F, 24G, 25A and 25B.

(1) Preparation of Substrate 2100*x*

Figure 21A:
FIGS. 21A, 21B, 21C and 21D are schematic sectional views taken at the same position as A1-A1 of FIG. 3, illustrating a state in each step in the manufacture of the organic EL display panel 10.

The substrate 2100*x* formed with pluralities of TFTs and wirings inclusive of the wirings 2110 is prepared. The substrate 2100*x* can be produced by a known TFT production method (FIG. 21A).

(2) Formation of Interlayer Insulating Layer 2118

Figure 21B:

The aforementioned constituent material (photosensitive resin material) of the interlayer insulating layer 2118 is applied as a photoresist in such a manner as to cover the substrate 2100*x*, and the surface is planarized, to form the interlayer insulating layer 2118 (FIG. 21B).

(3) Formation of Pixel Electrode 2119 and Auxiliary Electrode Layer 2200

Figure 21C:
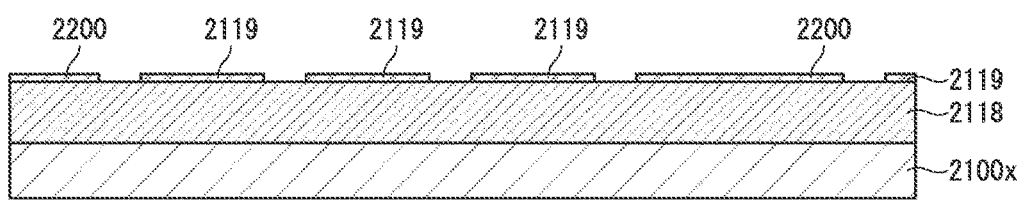
Figure 21D:
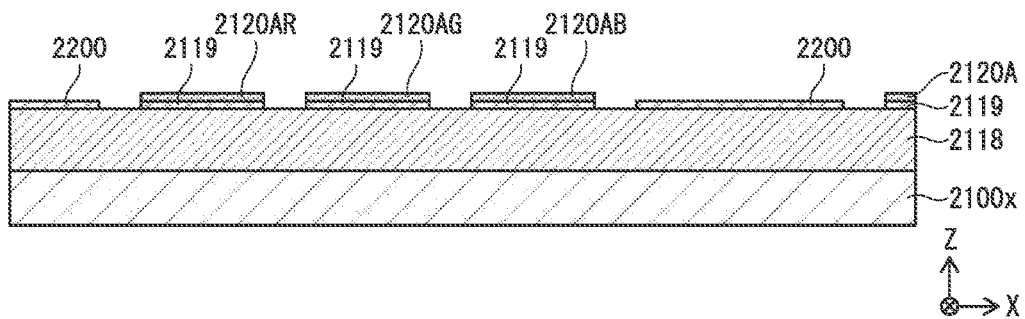

After the interlayer insulating layer 2118 is formed, the pixel electrodes 2119 and the auxiliary electrode layers 2200 are formed (FIG. 21C).

The formation of the pixel electrodes 2119 and the auxiliary electrode layers 2200 is conducted by forming a metallic film by use of a sputtering process or the like, followed by patterning by use of a photolithography process and an etching process.

(4) Formation of Lower Layer 2120A of Hole Injection Layer 2120

After the pixel electrodes 2119 and the auxiliary electrode layers 2200 are formed, the lower layers 2120A of the hole injection layers 2120 are formed on the pixel electrodes 2119 (FIG. 21 D).

The lower layers 2120A are formed by forming a film of a metal (e.g., tungsten) by use of a sputtering process or a vapor deposition process such as a vacuum deposition process, followed by baking to oxidize the metal, and patterning on a pixel basis by use of a photolithography process and an etching process.

(5) Formation of Bank 2122

(a) Formation of Column Bank 2122X

After the lower layers 2120A of the hole injection layers 2120 are formed, row banks 2122X are formed so as to cover edge portions of the lower layers 2120A, the pixel electrodes 2119, and the auxiliary electrode layers 2200.

The row banks 2122X are so provided that the surfaces of the lower layer 2120A of the hole injection layer 2120, the pixel electrode 2119, and the auxiliary electrode layer 2200 are exposed, between the row bank 2122X and the row bank 2122X in the gap 2522Z.

The formation of the row banks 2122X is conducted by first stackingly forming a film of the constituent material (e.g., a positive type photosensitive resin material) of the row banks 2122X on the lower layers 2120A of the hole injection layers 2120 by use of a spin coating process or the like. Then, the resin film is patterned, to form the row banks 2122X. The patterning of the row banks 2122X is conducted by performing exposure utilizing a photomask over the resin film, and performing development.

Specifically, in the step of forming the row banks 2122X, first, a photosensitive resin film of an organic photosensitive resin material such as an acrylic resin, a polyimide resin or a novolak type phenolic resin is formed, it is dried, the solvent is volatilized to some extent, then a photomask formed with predetermined openings is placed thereon, and irradiation with UV rays is conducted from above the photomask to expose the photoresist formed of the photosensitive resin or the like, thereby transferring the pattern possessed by the photomask to the photoresist. Next, the photosensitive resin is developed, to form insulating layers in which the row banks 2122X are patterned. In general, a photoresist called a positive type is used. A positive type photoresist has its exposed parts removed by development. The parts not exposed to light are left without being developed.

(b) Formation of Second Column Bank 2522YB

Figure 22A:
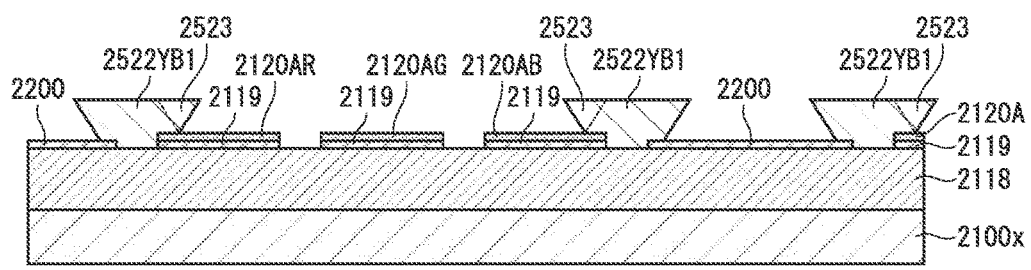
FIGS. 22A, 22B and 22C are schematic sectional views taken at the same position as A1-A1 of FIG. 3, illustrating a state in each step in the manufacture of the organic EL display panel 10.

After the row banks 2122X are formed, column banks 2522YB1 in a reverse tapered trapezoidal shape are formed so as to cover edge portions of the lower layers 2120A, the pixel electrodes 2119, and the auxiliary electrode layers 2200 (FIG. 22A).

The column banks 2522YB1 are each provided between the pixel electrode 2119 and the auxiliary electrode layer 2200 adjacent thereto.

Here, a negative type photosensitive material, for example, is used so that the section parallel to the row direction, of the column bank 2522YB1, will be a reverse tapered trapezoidal shape tapered downward.

The step of forming the column banks 2522YB1 in the reverse tapered trapezoidal shape is the same as the step of forming the row banks 2122X, and, therefore, description thereof is omitted.

Next, an upper end portion 2523 (FIG. 22A) on the pixel electrode 2119 side, of each of the column banks 2522YB1, is removed by etching. The sectional shape of the upper end portion 2523 is a triangle smaller on the lower side than on the upper side.

Figure 22B:
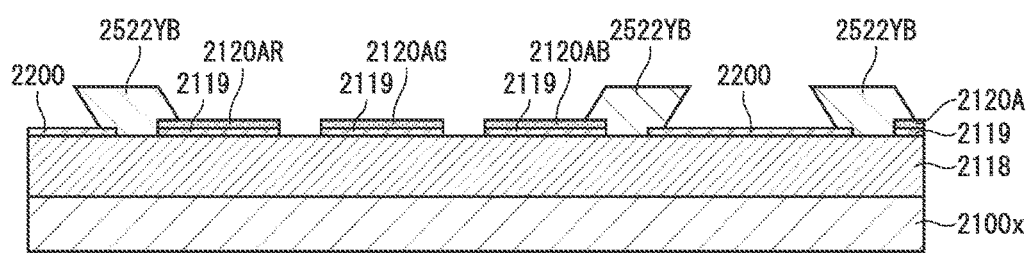

In this way, the second column banks 2522YB whose sectional shape is a parallelogram are formed (FIG. 22B).

(c) Formation of First Column Bank 2522YA

Figure 22C:
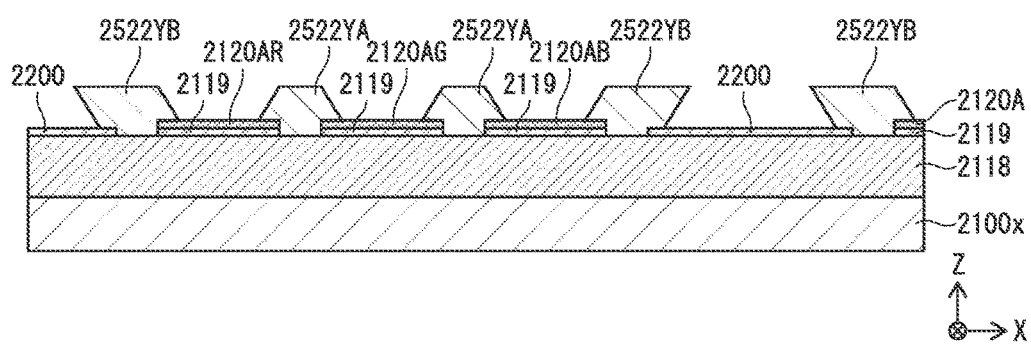

After the second column banks 2522YB are formed, first column banks 2522YA in a normal tapered trapezoidal shape are formed so as to cover edge portions of the lower layers 2120A, the pixel electrodes 2119, and the auxiliary electrode layers 2200 (FIG. 22C).

As the material of the first column banks 2522YA, a positive type photosensitive material, for example, is used so that the section parallel to the row direction, of each of the first column banks 2522YA, will be a normal tapered trapezoid tapered upward.

The step of forming the first column banks 2522YA in the normal tapered trapezoidal shape is the same as the step of forming the row banks 2122X, and, therefore, description thereof is omitted.

(6) Formation of Organic Functional Layer

Figure 23A:
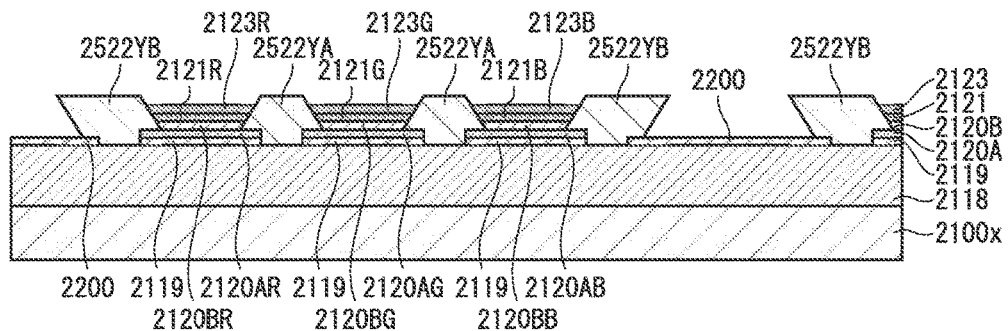
FIGS. 23A, 23B, 23C and 23D are schematic sectional views taken at the same position as A1-A1 of FIG. 3, illustrating a state in each step in the manufacture of the organic EL display panel 10.

The upper layers 2120B of the hole injection layers 2120, the hole transport layers 2121 and the light emitting layers 2123 are sequentially stackedly formed on the lower layers 2120A of the hole injection layers 2120 formed in the gaps 2522*z* defined by the column banks 2522Y inclusive of the areas over the row banks 2122X (FIG. 23A).

In forming the upper layers 21208, an ink containing a conductive polymer material such as PEDOT (a mixture of polythiophene and polystyrenesulfonic acid) is applied to the inside of the gaps 2522z defined by the column banks 2522Y by an ink jet process, after which the solvent is removed by volatilization. Alternatively, baking is conducted. Thereafter, patterning may be conducted on a pixel basis by use of a photolithography process and an etching process.

In forming the hold transport layer 2121, an ink containing the constituent material is applied to the inside of the gaps 2522z defined by the column banks 2522Y by use of a wet process such as an ink jet process or a gravure printing process, after which the solvent is removed by volatilization. Alternatively, baking is conducted. The method for applying the ink for forming the hole transport layers 2121 to the inside of the gaps 2522z is the same as the method for the upper layers 2120B described above. Alternatively, the hole transport layers 2121 are formed by depositing a film of a metal (e.g., tungsten) by a sputtering process, followed by baking to oxidize the metal. Thereafter, patterning on a pixel basis may be conducted by use of a photolithography process and an etching process.

Formation of the light emitting layers 2123 is conducted by applying inks containing the constituent materials to the inside of the gaps 2522z defined by the column banks 2522Y by an ink jet process, after which baking is conducted. Specifically, in this step, inks 2123R1, 2123G1, and 2123B1 each containing the material for forming the organic light emitting layer for one of R, G, and B are applied to fill the gaps 2522z as sub-pixel forming regions by an ink jet process, then the applied inks are dried under a reduced pressure, followed by a baking treatment, to form the light emitting layers 2123R, 2123G, and 2123B. In this instance, in applying the inks for the light emitting layers 2123, first, the solutions for forming the light emitting layers 2123 are applied by a droplet jetting apparatus. After the application of the ink for forming one of the red light emitting layer, the green light emitting layer and the blue light emitting layer to the substrate 2100x is finished, next an ink of another color is applied to the substrate, then an ink of a third color is applied to the substrate, and these steps are performed repeatedly, whereby the inks of three colors are sequentially applied. In this way, the red light emitting layers, the green light emitting layers and the blue light emitting layers are formed juxtaposedly and repeatedly, in the horizontal direction on the paper surface of the drawing, on the substrate 2100x. The details of the method for applying the inks of the light emitting layers 2123 to the inside of the gaps 2522z are the same as the details of the method for the upper layers 2120B described above.

The method for forming the upper layers 2120B of the hole injection layers 2120, the hole transport layers 2121, and the light emitting layers 2123 is not limited to the above-mentioned, and other methods than the ink jet method and the gravure printing method may be used to drop or apply the inks, such as a dispenser method, a nozzle coating method, a spin coating method, an intaglio printing method, or a relief printing method.

(7) Formation of Electron Transport Layer 2124

Figure 23B:
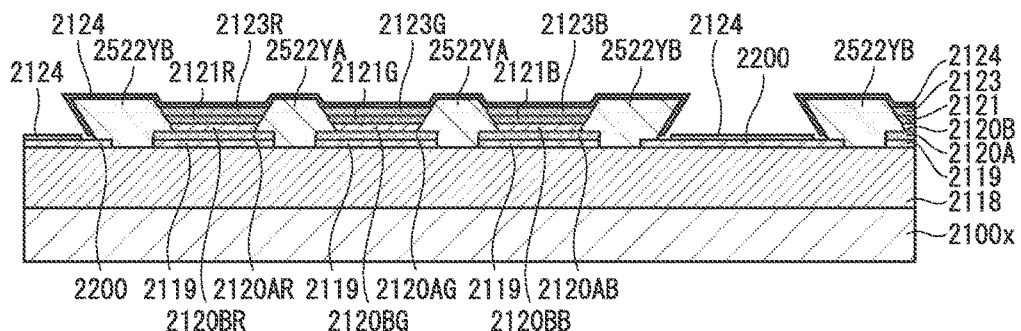

After the light emitting layers 2123 are formed, the electron transport layer 2124 is formed over the whole surface of the display panel 2010 by a vacuum deposition process or the like (FIG. 23B). The electron transport layer 2124 is formed also on the auxiliary electrode layers 2200. In this instance, as depicted in FIGS. 20 and 23B, at a base portion 2302 of a wall surface 2301 of each of the column banks 2522Y, lacking (stepping, disconnection) is intentionally generated in the electron transport layer 2124, so that the auxiliary electrode layer 2200 is exposed at the lacking part.

(8) Formation of Common Electrode Layer 2125

Figure 23C:
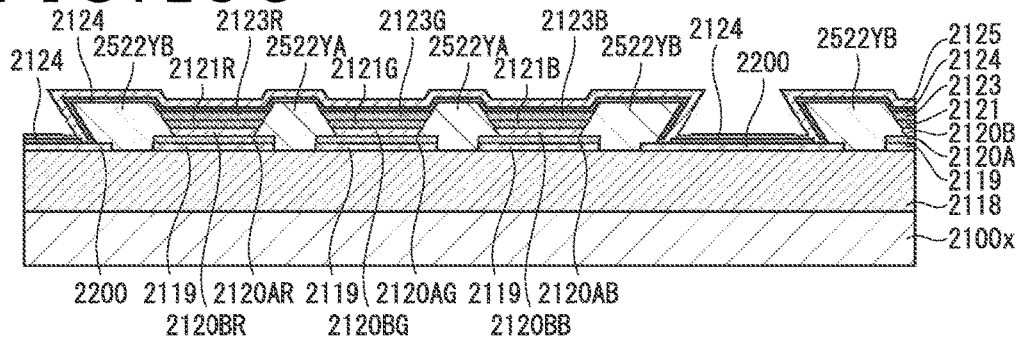

After the electron transport layer 2124 is formed, the common electrode layer 2125 is formed so as to cover the electron transport layer 2124 by a CVD process, a sputtering process or the like (FIG. 23C). The common electrode layer 2125 is formed also in the regions on the electron transport layer 2124 which are located over the auxiliary electrode layers 2200. In this instance, the common electrode layer 2125 is formed in such a manner that the common electrode layer 2125 comes around into the lacking parts of the electron transport layer 2124, to make direct contact with the auxiliary electrode layers 2200 exposed at the lacking parts.

Here, the method of forming the common electrode layer 2125 will be described further.

First, referring to FIG. 26, general configuration of a sputtering system 600 will be described. The sputtering system 600 includes a substrate transfer chamber 610, a film forming chamber 620, and a load lock chamber 630, and sputtering is conducted in the film forming chamber 620 by a magnetron sputtering process. A sputtering gas is introduced into the film forming chamber 620. As the sputtering gas, an inert gas such as Ar (argon) is used. In the present embodiment, Ar is used.

On a carrier 621 in the sputtering system 600, a substrate 622 on which to form a film is disposed. In the substrate transfer chamber 610, the substrate 622 is mounted to the carrier 621 by a substrate pushing-up mechanism 611. The carrier 621 with the substrate 622 mounted thereto is moved from the substrate transfer chamber 610 to the load lock chamber 630 through the film forming chamber 620 rectilinearly at a constant speed on a carrying passage 601. In the present embodiment, the moving speed of the carrier 621 is 30 mm/second. Note that the substrate 622 is not heated, and the sputtering is conducted at normal temperature.

In the film forming chamber 620, a rod-shaped target 623 extending in a direction orthogonal to the carrying passage 601 is disposed. In the present embodiment, the target 623 is ITO. Note that the target 623 may not necessarily be rod-shaped, and may be, for example, in a powdery form.

A power supply 624 impresses a voltage on the target 623. Note that while the power supply 624 in FIG. 26 is an AC power supply, it may be a DC supply or a DC/AC hybrid power supply.

The inside of the sputtering system 600 is evacuated by an evacuation system 631, and the sputtering gas is introduced into the film forming chamber 620 by a gas supply system 632. When a voltage is impressed on the target 623y the power supply 624, a plasma of the sputtering gas is generated, and the surface of the target 623 is sputtered. Then, the sputtered atoms of the target 623 are deposited on the substrate 622, whereby a film is formed.

Note that the gas pressure of Ar as the sputtering gas is, for example, 0.6 Pa, and its flow rate is 100 sccm.

(9) Formation of Sealing Layer 2126

Figure 23D:
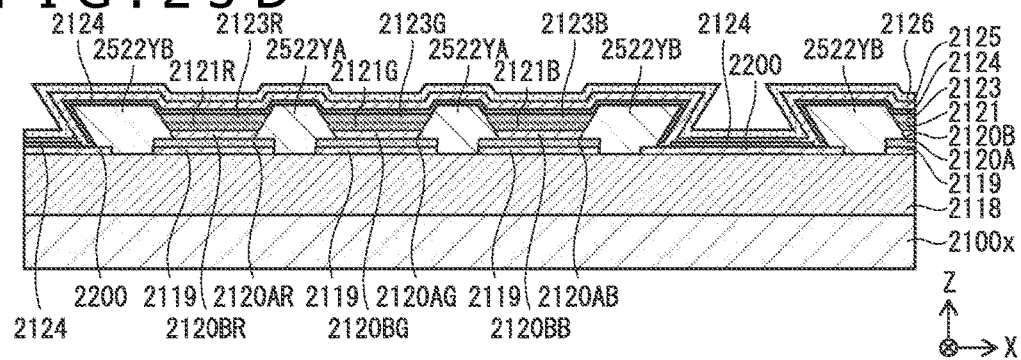

After the common electrode layer 2125 is formed, the sealing layer 2126 is formed so as to cover the common electrode layer 2125 (FIG. 23D). The sealing layer 2126 can be formed by a CVD process, a sputtering process or the like.

(10) Formation of Color Filter Substrate 2131

Next, a step of producing the color filter substrate 2131 will be exemplified.

Figure 24A:
FIGS. 24A, 24B, 24C, 24D, 24E, 24F and 24G are schematic sectional views taken at the same position as A1-A1 of FIG. 3, illustrating a state in each step in the manufacture of the organic EL display panel 10.

The transparent upper substrate 2130 is prepared, and a material for the light-shielding layer 2129, which contains a UV-curing resin (e.g., UV-curing acrylic resin) material as a main constituent with a black pigment added thereto, is applied to a surface on one side of the transparent upper substrate 2130 (FIG. 24A).

Figure 24B:
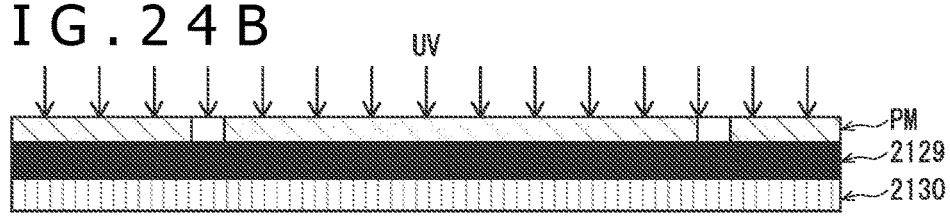

A pattern mask PM provided with predetermined openings is placed on the upper surface of the applied light-shielding layer 2129, and irradiation with UV rays is conducted from above (FIG. 24B).

Figure 24C:

Thereafter, development is conducted by removing the pattern mask PM and uncured portions of the light-shielding layer 2129, and curing is performed, whereon the light-shielding layers 2129 in a rectangular sectional shape are completed (FIG. 24C).

Figure 24D:
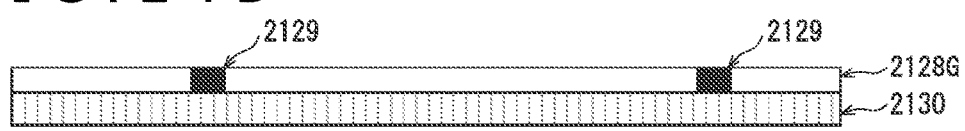
Figure 24E:
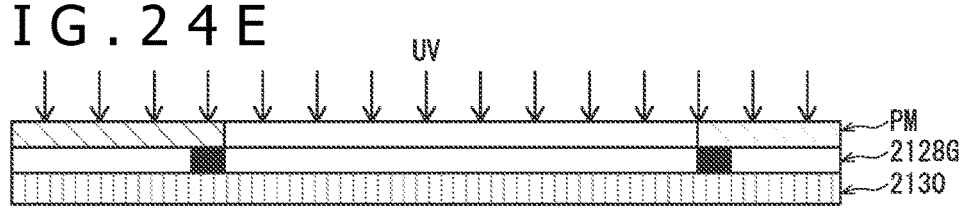

Next, a material 2128G for a color filter layer 2128 (e.g., 2128(G)), which contains a UV-curing resin component as a main constituent, is applied to the surface of the upper substrate 2130 formed with the light-shielding layer 2129 (FIG. 24D), a predetermined pattern mask PM is placed thereon, and irradiation with UV rays is conducted (FIG. 24E).

Figure 24F:
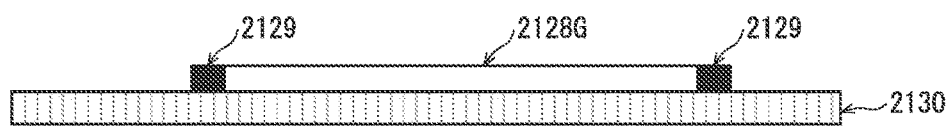

Thereafter, curing is performed, and development is conducted by removing the pattern mask PM and uncured portions of the paste 2128R, wherein color filter layers 2128(G) are formed (FIG. 24F).

Figure 24G:
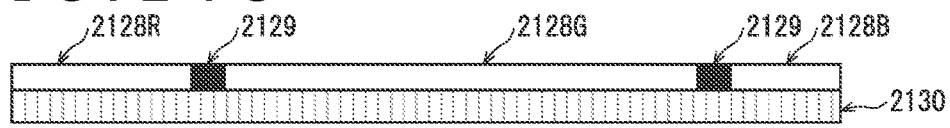

The steps of FIGS. 24D, 24E, and 24F are similarly repeated for each of color filter materials, whereby color filter layers 2128(R) and 2128(B) are formed (FIG. 24G). Note that the commercially available color filter products may be utilized, instead of using the pastes 2128G, 2128R, and 2128B.

In this way, the color filter substrate 2131 is formed.

(11) Lamination of Color Filter Substrate 2131 and Back Panel

Figure 25A:
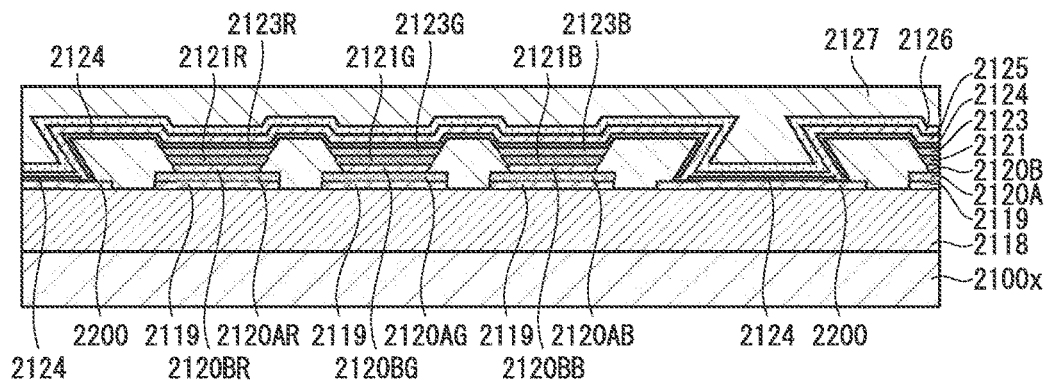
FIGS. 25A and 25B are schematic sectional views taken at the same position as A1-A1 of FIG. 3, illustrating a state in each step in the manufacture of the organic EL display panel 10.

Next, a material for the bonding layer 2127, which contains a UV-curing resin such as acrylic resin, silicone resin, and epoxy resin as a main constituent, is applied to the back panel including the layers ranging from the substrate 2100x to the sealing layer 2126 (FIG. 25A).

Figure 25B:
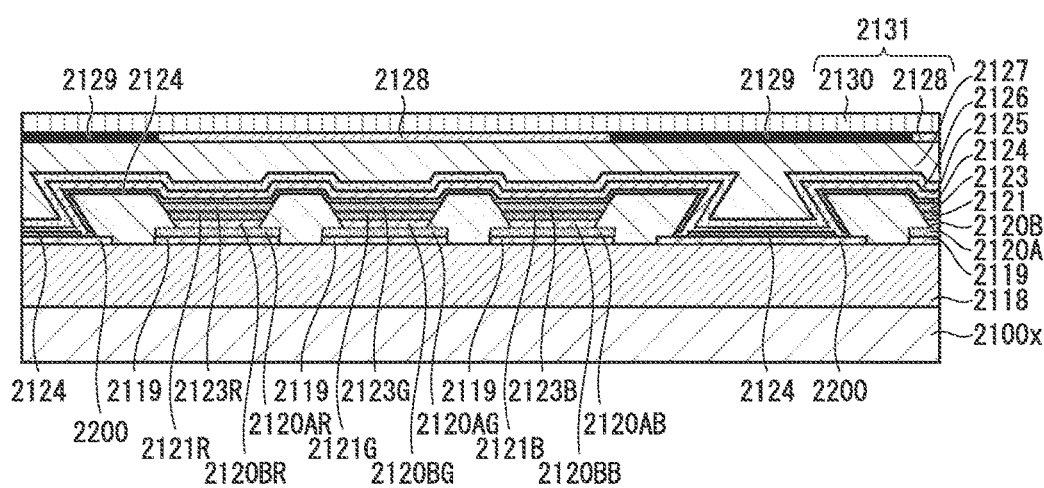

Subsequently, the applied material is irradiated with UV rays, to laminate the back panel and the color filter substrate 2131 in the state in which they are relatively positioned (aligned). In this instance, care should be taken to prevent gas from entering between both substrates. Thereafter, both the substrates are baked to complete the sealing step, whereon the display panel 2010 is completed (FIG. 25B).

1.6 Configuration in Which Auxiliary Electrode Layer 2200 and Common Electrode Layer 2125 are in Direct Contact with Each Other FIG. 20 depicts, in an enlarged form, the configuration of the vicinity of the auxiliary electrode layer 2200 in FIG. 19.

The angle θ which the side wall 2301 inclined toward the auxiliary electrode layer 2200 side, of the second column bank 2522Y, forms with the surface of the substrate 2100x is desirably 45 to 80 degrees. If the angle θ exceeds 80 degrees, cutting of the electron transport layer 2124 would not occur, so that it would be difficult to secure electrical connection with the common electrode layer 2125. If the angle θ is less than 45 degrees, on the other hand, cutting of the common electrode layer 2125 would occur at the side wall 2301, so that it is difficult for the auxiliary electrode layer 2200 to make contact with the common electrode layer 2125.

This angle θ can be controlled by the exposure amount at the time of forming the second column banks 2522YB.

Such a shape ensures that the electron transport layer 2124 formed on the auxiliary electrode layer 2200 is formed in the state of breaking off (undergoing cutting) at the base portion 2302 of the side wall 2301. Therefore, the common electrode layer 2125 is formed in contact with the auxiliary electrode layer 2200 in the manner of coming around into the stepped part of the electron transport layer 2124.

Note that this is not restrictive. The electron transport layer 2124 formed on the auxiliary electrode layer 2200 may be thinned at the base portion 2302 of the side wall 2301. As a result, the common electrode layer 2125 is electrically connected to the auxiliary electrode layer 2200 at a lower resistance at the thinned part of the electron transport layer 2124 than at other parts of the electron transport layer 2124.

The electron transport layer 2124 is desirably formed by a film forming process comparatively poor in step coverage (for example, a vacuum deposition process), such that stepping thereof occurs at the base portion 2302 of the side wall 2301 and the auxiliary electrode layer 2200 is exposed there.

In addition, if the film thickness of the electron transport layer 2124 is excessively small, electrons would migrate directly from the common electrode layer 2125 into the light emitting layer 2123, so that the function of restricting the injection of electrons into the light emitting layer 2123 cannot be displayed. Therefore, the electron transport layer 2124 is desirably formed in a film thickness of not less than 10 nm. On the other hand, thickening of the electron transport layer 2124 lowers the transmittance of the electron transport layer 2124, and inhibits generation of the stepping. In order to prevent the light transmitted through the electron transport layer 2124 from being attenuated excessively and in order to intentionally generate the stepping at the base portion 2302 of the side wall 2301, the electron transport layer 2124 is preferably formed in a film thickness of not more than 40 nm.

The common electrode layer 2125 is desirably formed by a film forming process excellent in step coverage (for example, a sputtering process or a CVD process), such that the common electrode layer 2125 is formed in the manner of coming around into the stepped part of the electron transport layer 2124 (the base portion 2302 of the side wall 2301). If the common electrode layer 2125 is excessively thin, it would cause stepping; therefore, the common electrode layer 2125 is desirably formed in a film thickness of not less than 25 nm. On the other hand, thickening of the common electrode layer 2125 lowers the transmittance of the common electrode layer 2125; therefore, the common electrode layer 2125 is desirably formed in a film thickness of not more than 300 nm.

1.7 In Regard of Effect of Display Panel 2010

The effects produced by the display panel 2010 will be described below.

The display panel 2010 includes the pixel electrodes 2119 provided in pixel regions on the substrate 2100x, the auxiliary electrode layers 2200 provided in auxiliary regions on the substrate 2100x, the light emitting layers 2123 provided on the pixel electrodes 2119, the electron transport layer 2124 provided over the light emitting layers 2123 and the auxiliary electrode layers 2200, the common electrode layer 2125 provided on the electron transport layer 2124, and the plurality of column banks 2522Y extending in the column direction and each provided on the gap between the pixel electrode 2119 and the auxiliary electrode layer 2200 that are adjacent in the row direction.

The column bank provided on the gap between the pixel electrode 2119 and the auxiliary electrode layer 2200 that are adjacent in the row direction has the side wall inclined toward the auxiliary electrode layer 2200 side at an acute angle against the surface of the substrate 2100x.

Of the electron transport layer 2124, the parts located at the base portions of the side walls are lacking or thinned. The common electrode layer 2125 is in direct contact with the auxiliary electrode layer 2200 exposed to the lacking of the electron transport layer 2124, or the common electrode layer 2125 is electrically connected to the auxiliary electrode layer 2200 at a lower resistance at the thinned parts of the electron transport layer 2124 than at other parts of the electron transport layer 2124.

According to such a configuration, the auxiliary electrode layer 2200 makes direct contact with the common electrode layer 2125, without being intermediated by the electron transport layer 2124, at the base portions of the side walls. Therefore, voltage drop due to the common electrode layer 2125 is restrained, light emission efficiency is enhanced, a lowering in luminance at a central portion of the screen is restrained, and variability in luminance can be reduced.

Thus, as has been described above, in the organic EL display panel of Embodiment 2, a lowering in the electric resistance in electrical connection between the common electrode and the auxiliary electrode can be realized, light emission efficiency can be enhanced, and variability in luminance can be restrained.

1.8 Modifications

While the display panel 2010 according to Embodiment 2 has been described above, the present disclosure is not limited to the above embodiment, except for essential and characteristic constituent elements thereof. For instance, modes obtained by subjecting the embodiments to various modifications conceived by those skilled in the art and modes realized by arbitrary combinations of the constituent elements and functions in each of the embodiments without departing from the gist of the present disclosure are also embraced in the present disclosure. As examples of such modes, modifications of the display panel 2010 will be described below.

In the display panel 2010, the light emitting layers 2123 extend in the column direction on the row insulating layers. However, in the above embodiment, the light emitting layers 2123 may be intermittent on a pixel basis on the row insulating layers.

In the display panel 2010, the colors of lights emitted by the light emitting layers 2123 of the sub-pixels 2100se arranged in the gaps 2522z each located between the column banks 2522Y adjacent in the row direction are different from one another, whereas the colors of lights emitted by the light emitting layers 2123 of the sub-pixels 2100se arranged in the gaps each located between the row insulating layers 2122X adjacent in the column direction are the same. However, in the above embodiment, the colors of the lights emitted by the light emitting layers 2123 of the sub-pixels 2100se adjacent in the row direction may be the same, and the colors of the lights emitted by the light emitting layers 2123 of the sub-pixels 2100se adjacent in the column direction may be different from one another. Besides, the colors of the lights emitted by the light emitting layers 2123 of the sub-pixels 2100se adjacent in the row direction, and those adjacent in the column direction, may both be different from one another.

In the display panel 2010 according to the above embodiment, the unit pixels 2100e have includes three kinds of unit pixels, namely, red pixels, green pixels and blue pixels, but this is not restrictive of the present disclosure. For instance, the light emitting layers may be of one kind, or the light emitting layers include four kinds of light emitting layers that emit light in red, green, blue, and yellow.

In addition, while the pixels 2100e are arranged in a matrix pattern in the above embodiment, this is not limitative of the present disclosure. For example, the present disclosure has an effect also on a configuration wherein when the interval between the pixel regions is one pitch, the pixel regions are shifted (deviated) by half pitch in the column direction, between the adjacent gaps. In the display panel with a trend toward higher precision, some shifts (deviations) in the column direction are difficult to visually distinguish, and, even if irregularities in film thickness are aligned on a straight line (or zigzag line) having a certain degree of width, they appear in a belt-like form on a visual basis. Therefore, even in such a case, irregularities in luminance are restrained from being aligned in a zigzag pattern, whereby display quality of the display panel can be enhanced.

Besides, in the above embodiment, the hole injection layer 2120, the hole transport layer 2121, the light emitting layer 2123, and the electron transport layer 2124 have been present between the pixel electrode 2119 and the common electrode layer 2125, but this is not restrictive of the present disclosure. For example, a configuration may be adopted wherein the hole injection layer 2120, the hole transport layer 2121, and the electron transport layer 2124 are not used, and only the light emitting layer 2123 is present between the pixel electrode 2119 and the common electrode layer 2125. In addition, for example, a configuration including the hole injection layer, the hole transport layer, the electron transport layer, the electron injection layer and the like, or configurations including some or all of these layers simultaneously may also be adopted. Besides, these layers may not necessarily be all formed from organic compounds, but may be formed from inorganic materials or the like.

In addition, in the above embodiment, a wet film forming process such as a printing process, a spin coating process and an ink jet process has been used as the method for forming the light emitting layers 2123, but this is not limitative of the present disclosure. For example, a dry film forming process such as a vacuum deposition process, an electron beam deposition process, a sputtering process, a reactive sputtering process, an ion plating process, and a vapor deposition process can also be used. Further, as the material for each of the constituent parts, known materials can be adopted as required.

In the above embodiment, the pixel electrode 2119 as anode has been disposed at a lower portion of the EL element section, and the pixel electrode 2119 has been connected to the wiring 2110 connected to the source electrode of the TFT. However, a configuration may be adopted wherein the common electrode layer is disposed at a lower portion of the EL element section, and the anode is disposed at an upper portion of the EL element section. In that case, the cathode disposed at a lower portion is connected to the drain of the TFT.

Besides, in the above embodiment, the two transistors Tr1 and Tr2 have been provided for one sub-pixel 2100se, but this is not restrictive of the present disclosure. For instance, one transistor may be provided for one sub-pixel, or three or more transistors may be provided for one sub-pixel.

Furthermore, while a top emission type EL display panel has been taken as an example in the above embodiment, this is not limitative of the present disclosure. For example, the present disclosure is applicable also to a bottom emission type display panel and the like. In that case, appropriate modifications in regard of each component are possible.

Supplement

The above-described embodiments are merely to show preferable specific examples of the present disclosure, and the numerical values, shapes, materials, constituent elements, layout positions and connection forms of the constituent elements, steps, the order of the steps and the like are mere examples, and are not to be construed as limitative of the present disclosure. In addition, of the constituent elements of the embodiments, those steps not described in independent claims defining the most generic concept of the present disclosure are described as arbitrary constituent elements constituting more preferable modes.

Besides, the order in which to carry out the steps described above is merely an example for explaining specifically the present disclosure, and other orders than the above-described may be adopted. In addition, part of the above-mentioned steps may be carried out simultaneously (concurrently) with other steps.

Besides, for easy understanding of the disclosure, the scale of the constituent elements in the drawings referred to in the above embodiments may be different from actual dimensions. In addition, the present disclosure is not restricted by the descriptions of the above embodiments, and modifications can be made, as required, without departing from the gist of the present disclosure.

Besides, at least parts of the functions of the above embodiments and modifications may be combined with one another.

Further, various modifications obtained by subjecting the above embodiments to changes or modifications conceived by those skilled in the art are also embraced in the present disclosure.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. An organic electro luminescence display panel, comprising:
   a substrate;
   a plurality of pixel electrodes over the substrate, wherein the plurality of pixel electrodes is arranged in a matrix pattern with a plurality of gaps between the plurality of pixel electrodes;
   a plurality of light emitting layers, wherein a light emitting layer of the plurality of light emitting layers is over each of the plurality of pixel electrodes, and wherein the light emitting layer comprises an organic light emitting material;
   a current feeding auxiliary electrode layer in a state of being not in contact with the plurality of pixel electrodes, wherein the current feeding auxiliary electrode layer is adjacent to an electrode forming region, and wherein the electrode forming region extends in a column direction over at least one of the plurality of gaps between the plurality of pixel electrodes, and wherein the plurality of pixel electrodes is adjacent to each other in a row direction over the substrate;
   a functional layer over the plurality of light emitting layers and over the current feeding auxiliary electrode layer; and
   a common electrode layer extending continuously over the functional layer,
   wherein a part of the functional layer is one of lacking or thinned, and
   the common electrode layer is one of:
      in direct contact with the current feeding auxiliary electrode layer exposed due to the lack of the part of the functional layer, or
      electrically connected to the current feeding auxiliary electrode layer at a lower resistance at the part of the functional layer that is thinned than at parts of the functional layer other than the part of the functional layer that is thinned.

2. The organic electro luminescence display panel according to claim 1, further comprising:
   an insulating layer at least over the current feeding auxiliary electrode layer, wherein the insulating layer extends in the column direction, wherein
   the insulating layer is provided with a plurality of through-holes,
   one part of the functional layer is lacking or thinned, and
   the one part is inside a through-hole of the plurality of through-holes and located in a vicinity of an inner wall of the through-hole over the current feeding auxiliary electrode layer.

3. The organic electro luminescence display panel according to claim 2, wherein a ratio of a thickness of the insulating layer to an opening width of the through-hole is from 0.1 to 0.8.

4. The organic electro luminescence display panel according to claim 2, wherein the functional layer is present on an upper surface of the insulating layer and at other parts of the inside of the through-hole over the current feeding auxiliary electrode layer than the one part, wherein the functional layer is lacking or thinned at the part located on the inner wall of the through-hole.

5. The organic electro luminescence display panel according to claim 1, further comprising:
   a plurality of column banks over the plurality of gaps each located between the plurality of pixel electrodes adjacent in the row direction and over gaps each located between a pixel electrode and the current feeding auxiliary electrode layer adjacent in the row direction and that extend in the column direction, wherein column banks of the plurality of column banks which are provided over the gaps each located between the pixel electrode and the current feeding auxiliary electrode layer adjacent in the row direction have a side wall inclined toward a side of the current feeding auxiliary electrode layer at an acute angle against a surface of the substrate,
   the part of the functional layer is lacking or thinned,
   the part is located at a base portion of the side wall.

6. The organic electro luminescence display panel according to claim 5, wherein the column banks provided over the gaps each located between the pixel electrode and the current feeding auxiliary electrode layer adjacent in the row direction are formed from a negative type photosensitive material.

7. The organic electro luminescence display panel according to claim 5, wherein an inclination angle of the side wall against the surface of the substrate is 45 to 80 degrees.

8. The organic electro luminescence display panel according to claim 1, wherein the light emitting layer comprises an inkjet film, wherein the inkjet film of the light emitting layer exists in a pixel region of the organic electro luminescence display panel, and wherein the light emitting layer does not exist in a region of the current feeding auxiliary electrode layer.

9. The organic electro luminescence display panel according to claim 1, wherein the plurality of pixel electrodes comprises a light reflecting material.

10. The organic electro luminescence display panel according to claim 1, wherein the current feeding auxiliary electrode layer comprises a light reflecting material.

* * * * *